United States Patent
Minari et al.

(10) Patent No.: US 10,964,737 B2
(45) Date of Patent: Mar. 30, 2021

(54) PHOTOELECTRIC CONVERSION DEVICE AND IMAGING DEVICE

(71) Applicant: SONY SEMICONDUCTOR SOLUTIONS CORPORATION, Kanagawa (JP)

(72) Inventors: Hideki Minari, Kanagawa (JP); Shunsuke Maruyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/604,350

(22) PCT Filed: May 15, 2018

(86) PCT No.: PCT/JP2018/018752
§ 371 (c)(1),
(2) Date: Oct. 10, 2019

(87) PCT Pub. No.: WO2018/212175
PCT Pub. Date: Nov. 22, 2018

(65) Prior Publication Data
US 2020/0219908 A1    Jul. 9, 2020

(30) Foreign Application Priority Data

May 15, 2017  (JP) .............................. JP2017-096237

(51) Int. Cl.
*H01L 27/146*  (2006.01)
*H01L 31/101*  (2006.01)
(Continued)

(52) U.S. Cl.
CPC ...... *H01L 27/1461* (2013.01); *H01L 27/1463* (2013.01); *H01L 27/1464* (2013.01);
(Continued)

(58) Field of Classification Search
CPC .......... H01L 27/1461; H01L 27/14623; H01L 27/1463; H01L 27/1464; H01L 27/14643;
(Continued)

(56) References Cited

U.S. PATENT DOCUMENTS

| 6,518,638 B1* | 2/2003 | Kuhara .............. | G02B 6/12004 |
| | | | 257/431 |
| 2002/0135035 A1* | 9/2002 | Yamaguchi .......... | H01L 31/184 |
| | | | 257/440 |

(Continued)

FOREIGN PATENT DOCUMENTS

| JP | H05-102517 | 4/1993 |
| JP | H08-250696 | 9/1996 |

(Continued)

OTHER PUBLICATIONS

International Search Report prepared by the Japan Patent Office dated Jul. 18, 2018, for International Application No. PCT/JP2018/018752.

*Primary Examiner* — Matthew E Warren
(74) *Attorney, Agent, or Firm* — Sheridan Ross P.C.

(57) ABSTRACT

A photoelectric conversion device includes: a light absorption layer that has a light entrance surface and a compound semiconductor material; a first electrode provided for each of the pixels, in opposed relation to an opposite surface to the light entrance surface; a first semiconductor layer of a first conductive type, with a bandgap energy larger than bandgap energy of the light absorption layer and that is provided between the light absorption layer and the first electrode; a second semiconductor layer of a second conductive type, with a bandgap energy larger than the bandgap energy of the light absorption layer and that is provided between the first semiconductor layer and the light absorption layer; and a first diffusion region of the second conductive type, in which the first diffusion region is provided (Continued)

between adjacent ones of the pixels and across the second semiconductor layer and the light absorption layer.

20 Claims, 45 Drawing Sheets

(51) Int. Cl.
    *H01L 31/09*     (2006.01)
    *H01L 31/107*     (2006.01)

(52) U.S. Cl.
    CPC .. *H01L 27/14621* (2013.01); *H01L 27/14623* (2013.01); *H01L 27/14627* (2013.01); *H01L 27/14643* (2013.01); *H01L 27/14645* (2013.01); *H01L 27/14649* (2013.01); *H01L 27/14685* (2013.01); *H01L 27/14689* (2013.01); *H01L 31/09* (2013.01); *H01L 31/101* (2013.01); *H01L 31/107* (2013.01)

(58) Field of Classification Search
    CPC ......... H01L 27/14645; H01L 27/14649; H01L 31/09; H01L 31/101
    USPC ................ 257/435, 436, 443, 446, 447, 461
    See application file for complete search history.

(56) References Cited

U.S. PATENT DOCUMENTS

| | | | |
|---|---|---|---|
| 2009/0045395 A1* | 2/2009 | Kim | .................. H01L 27/14694 257/18 |
| 2010/0301309 A1* | 12/2010 | Tennant | .............. H01L 27/1446 257/21 |
| 2012/0298957 A1* | 11/2012 | Iguchi | ................. H01L 27/1464 257/21 |
| 2016/0218139 A1 | 7/2016 | Ettenberg | |
| 2018/0374881 A1* | 12/2018 | Rothman | .......... H01L 27/14689 |

FOREIGN PATENT DOCUMENTS

| | | |
|---|---|---|
| JP | 2014-003069 | 1/2009 |
| JP | 2016-535428 | 11/2016 |
| JP | 2017-028078 | 2/2017 |

\* cited by examiner

PHOTOELECTRIC CONVERSION DEVICE AND IMAGING DEVICE

CROSS REFERENCE TO RELATED APPLICATIONS

This application is a national stage application under 35 U.S.C. 371 and claims the benefit of PCT Application No. PCT/JP2018/018752 having an international filing date of 15 May 2018, which designated the United States, which PCT application claimed the benefit of Japanese Patent Application No. 2017-096237 filed 15 May 2017, the entire disclosures of each of which are incorporated herein by reference.

TECHNICAL FIELD

The present disclosure relates to a photoelectric conversion device and an imaging device that are used in, for example, an infrared sensor, without limitation.

BACKGROUND ART

An image sensor (an infrared sensor) having sensitivity in an infrared region has been commercialized in recent years. For example, as described in PTL 1, in an imaging device (a photoelectric conversion device) used for the infrared sensor, used is a light absorption layer that includes a group III-V semiconductor such as, but not limited to, InGaAs (indium gallium arsenide), This light absorption layer absorbs infrared light to generate electrical charges, i.e., performs photoelectric conversion.

In such an imaging device, signal charges are read out for each of pixels.

CITATION LIST

Patent Literature

PTL 1: Japanese Unexamined Patent Application Publication No. 2009-283603

SUMMARY OF THE INVENTION

However, the signal charges tend to easily migrate between adjacent pixels, causing possibility of occurrence of a crosstalk. Moreover, dark currents tend to increase because of, for example, crystal detects. Accordingly, what is desired is to restrain migration of the signal charges between the adjacent pixels, while reducing the dark currents.

It is therefore desirable to provide a photoelectric conversion device and an imaging device that make it possible to restrain migration of signal charges between adjacent pixels, while reducing dark currents.

A photoelectric conversion device according to an embodiment of the present disclosure includes: a light absorption layer that has a light entrance surface and includes a compound semiconductor material; a first electrode provided for each of pixels, in opposed relation to an opposite surface to the light entrance surface of the light absorption layer; a first semiconductor layer of a first conductive type, in which the first semiconductor layer has bandgap energy larger than bandgap energy of the light absorption layer and is provided between the light absorption layer and the first electrode; a second semiconductor layer of a second conductive type, in which the second semiconductor layer has bandgap energy larger than the bandgap energy of the light absorption layer and is provided between the first semiconductor layer and the light absorption layer; and a first diffusion region of the second conductive type, in which the first diffusion region is provided between adjacent ones of the pixels, and is provided across the second semiconductor layer and the light absorption layer.

An imaging device according to an embodiment of the present disclosure includes: a light absorption layer that has a light entrance surface and includes a compound semiconductor material; a first electrode provided for each of pixels, in opposed relation to an opposite surface to the light entrance surface of the light absorption layer; a first semiconductor layer of a first conductive type, in which the first semiconductor layer has bandgap energy larger than bandgap energy of the light absorption layer and is provided between the light absorption layer and the first electrode; a second semiconductor layer of a second conductive type, in which the second semiconductor layer has bandgap energy larger than the bandgap energy of the light absorption layer and is provided between the first semiconductor layer and the light absorption layer; and a first diffusion region of the second conductive type, in which the first diffusion region is provided between adjacent ones of the pixels, and is provided across the second semiconductor layer and the light absorption layer.

In the photoelectric conversion device and the imaging device according to the embodiments of the present disclosure, the first diffusion region is provided between the adjacent ones of the pixels. This allows the adjacent ones of the pixels to be electrically separated by the first diffusion region. Moreover, a junction of the first conductive type and the second conductive type (a p-n junction) is provided by the first semiconductor layer and the second semiconductor layer. This allows a depletion layer to be formed near between the semiconductor layers having the bandgap energy larger than the bandgap energy of the light absorption layer (between the first semiconductor and the second semiconductor layer).

According to the photoelectric conversion device and the imaging device in the embodiments of the present disclosure, the adjacent ones of the pixels are electrically separated by the first diffusion region. This makes it possible to restrain migration of signal charges between the adjacent ones of the pixels. Moreover, the depletion layer is formed near between the semiconductor layers having the bandgap energy larger than the bandgap energy of the light absorption layer. This makes it possible to reduce dark currents. Hence, it is possible to restrain the migration of the signal charges between the adjacent ones of the pixels, while reducing the dark currents.

It is to be understood that the contents described above are examples of the embodiments of the present disclosure. Effects of the embodiments of the present disclosure are not limited to the effects described above. There may be other different effects, or other effects may be further included.

MODES FOR CARRYING OUT THE INVENTION

Figure 1:
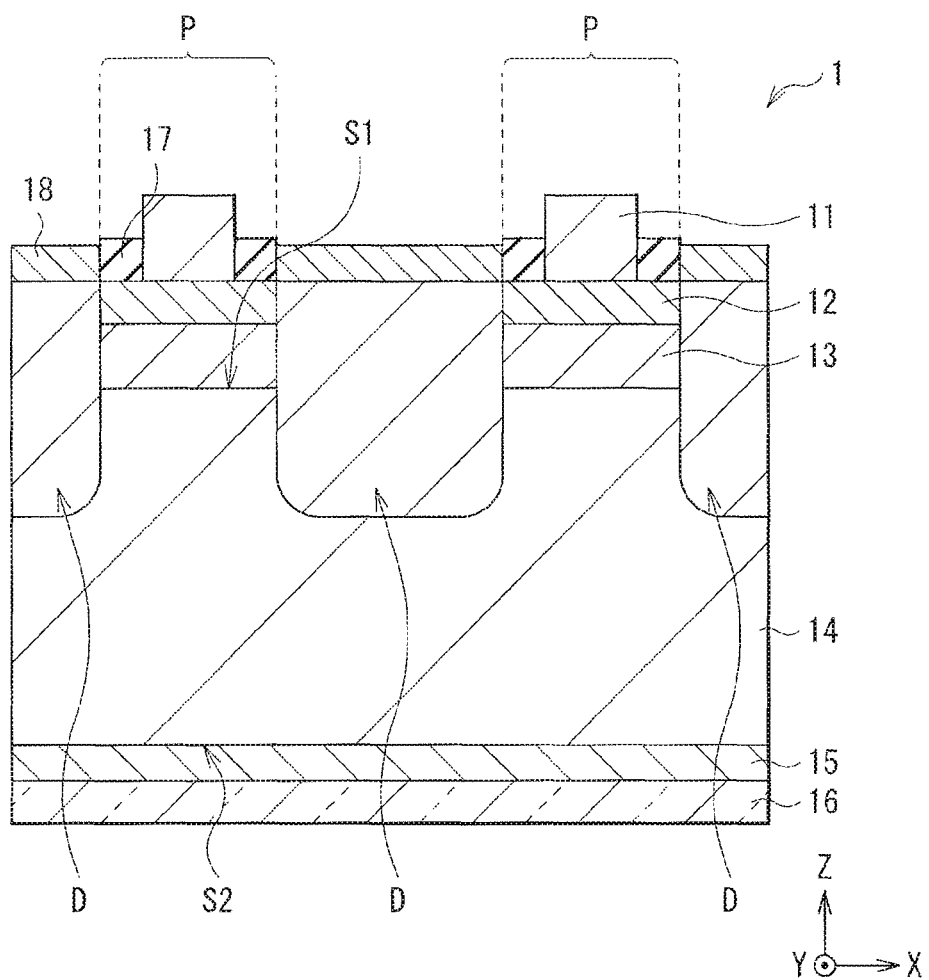
FIG. 1 is a schematic cross-sectional view illustrating a configuration in outline of an imaging device according to a first embodiment of the present disclosure.

In the following, some embodiments of the present disclosure are described in detail with reference to the drawings. It is to be noted that description is given in the following order.
1. First Embodiment (an example of an imaging device that includes a first semiconductor layer and a second semiconductor layer, with adjacent ones of pixels being separated by a diffusion region)
2, Modification Example 1 (an example with an electrical charge collection layer)
3. Modification Example 2 (an example with a barrier alleviation layer)
4. Modification Example 3 (an example in which signal charges are amplified by an avalanche phenomenon)
5. Modification Example 4 (an example in which a coating film includes electrical charges of a first conductive type)
6. Modification Example 5 (an example with a third electrode coupled to the diffusion region)
7. Modification Example 6 (an example in which the signal charges are holes)
8. Second Embodiment (an example of an imaging device having a groove that separates the first semiconductor layer and the second semiconductor layer for each of the pixels)
9. Modification Example 7 (an example in which the groove extends to inside a light absorption layer)
10. Modification Example 8 (an example in which a portion of a sidewall of the groove is covered with an insulating film)
11. Modification Example 9 (an example with a light-shielding member in the groove)
12. Third Embodiment (an example of an imaging device that includes a light-shielding second electrode)
13. Modification Example 10 (an example with a diffusion region on side on Which a light entrance surface is disposed)
14. Modification Example 11 (an example with a light-shielding member in a groove provided on the side on which the light entrance surface is disposed)
15. Modification Example 12 (an example with a fourth electrode coupled to the diffusion region on the side on which the light entrance surface is disposed)
16. Modification Example 13 (an example in which the groove separates the light absorption layer)
17. Modification Example 14 (an example with a third electrode inside the groove, the third electrode being coupled to the diffusion region)
18. Modification Example 15 (an example in which the light absorption layer has a concentration gradient)
19. Modification Example 16 (an example with a combination with shallow trench isolation (STI))
20. Modification Example 17 (an example with a contact layer having even greater bandgap energy, between a first electrode and the first semiconductor layer)
21. Modification Example 18 (an example with a contact layer having small bandgap energy, at a lower level than the first electrode)
22. Modification Example 19 (an example with a protection film on side on which light enters)
23. Modification Example 20 (an example with a light-shielding film, a filter, and on-chip lenses on the side on which light enters)
24. First Application Example (an example of an imaging device)
25. Second Application Example (an example of an electronic apparatus)
26. First Applied Example (an applied example of an endoscopic surgery system
27. Second Applied Example (an applied example of a mobile body)

First Embodiment

[Configuration]

Figure 2:
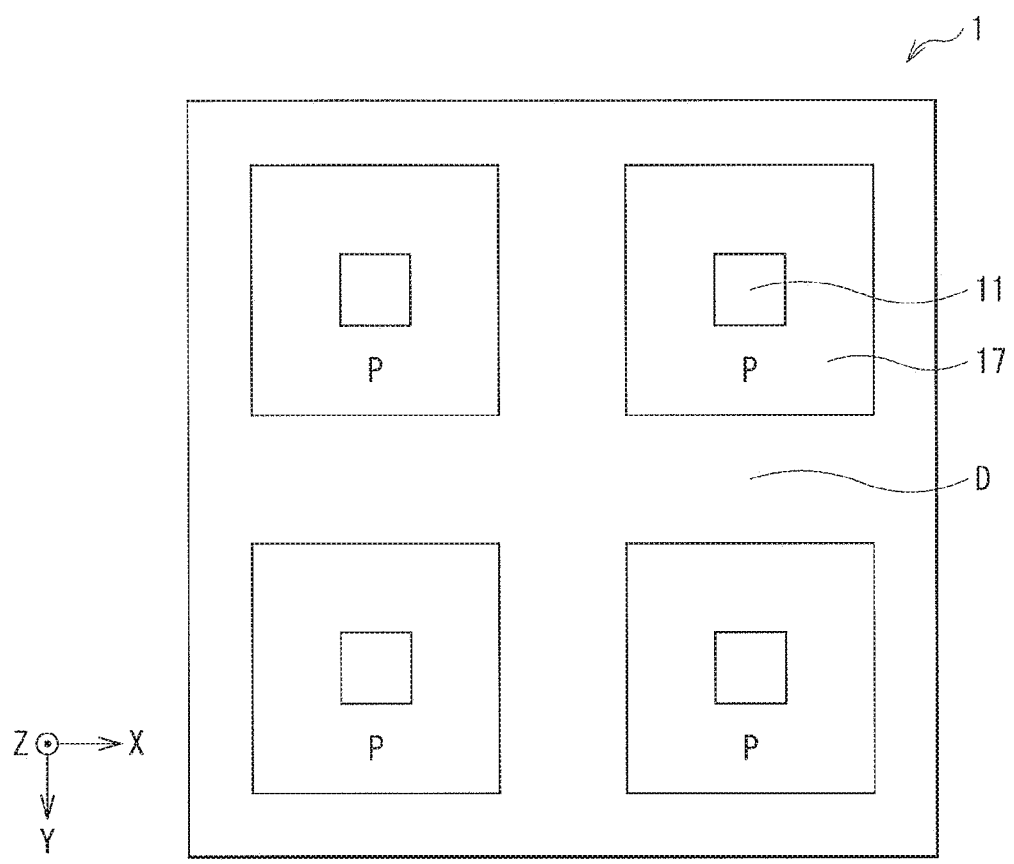
FIG. 2 is a schematic view illustrating a plan configuration of the imaging device illustrated in FIG. 1.

FIGS. 1 and 2 illustrate a schematic configuration of an imaging device (an imaging device 1) according to a first embodiment of the present disclosure. FIG. 1 illustrates a cross-sectional configuration of the imaging device 1, while FIG. 2 illustrates a plan configuration of the imaging device 1. The imaging device 1 is applied to, for example, an infrared sensor in which a compound semiconductor material such as a group III-V semiconductor is used. The imaging device 1 has a function of photoelectric conversion of light of wavelengths of, for example, a visible region to a short infrared region. The visible region ranges, for example, from 380 nm inclusive to 780 nm exclusive. The short infrared region ranges, for example, from 780 nm inclusive to 2400 nm exclusive. The imaging device 1 includes, for example, a plurality of light-receiving unit regions P (pixels P) that are two-dimensionally disposed in a matrix. Here, description is made by giving the imaging device 1 as a specific example of a photoelectric conversion device according to an embodiment of the present technology.

In the pixels P of the imaging device 1, a first electrode 11, a first semiconductor layer 12, a second semiconductor layer 13, a light absorption layer 14, a contact layer 15, and a second electrode 16 are provided in this order. The light absorption layer 14 has a first surface S1 and a second surface S2 that are opposite to each other. The second surface S2 serves as a light entrance surface. The first surface S1 is an opposite surface to the light entrance surface. The second semiconductor layer 13 is provided on the first surface S1. The contact layer 15 is provided on the second surface S2. In this imaging device 1, light that has entered on side on which the second electrode 16 is disposed enters the second surface S2 of the light absorption layer 14 through the contact layer 15. An insulating film 17 is provided around the first electrode 11. The imaging device 1 includes a diffusion region D (a first diffusion region) between adjacent ones of the pixels P. The diffusion region D is provided across the first semiconductor layer 12, the second semiconductor layer 13, and the light absorption layer 14. In the diffusion region D, the first semiconductor layer 12 is covered with a coating film 18.

The first electrode 11 is a read-out electrode to which a voltage directed to reading out of signal charges (holes or electrons) generated in the light absorption layer 14 is supplied. In the following description, the signal charges are assumed to be the electrons, for purposes of convenience. The first electrode 11 is provided for each of the pixels P, in opposed relation to the first surface S1 of the light absorption layer 14. The first electrode 11 is electrically coupled to a pixel circuit and a silicon semiconductor substrate, through, for example, a bump or a via. The pixel circuit is directed to reading out of signals. On the silicon semiconductor substrate, for example, various wirings are provided. The first electrode 11 is provided, for example, in contact with the first semiconductor layer 12. A planar shape of the first electrode 11 is, for example, a rectangular shape. A plurality of the first electrodes 11 are disposed in spaced relation to one another. The first electrode 11 is fitted into an opening of an insulating film 17. Between the adjacent first electrodes 11, provided are the insulating film 17 and the coating film 18.

The first electrode 11 includes, for example, any simple substance of titanium (Ti), tungsten (W), titanium nitride (TiN), platinum (Pt), gold (Au), copper (Cu), germanium (Ge), palladium (Pd), zinc (Zn), nickel (Ni), indium (In), or aluminum (Al), or an alloy including at least one kind thereof. The first electrode 11 may include a single film of such a constituent material, or alternatively, the first electrode 11 may include a stacked film as a combination of two or more kinds thereof.

The first semiconductor layer 12 and the second semiconductor layer 13 are provided, for example, as a common layer to all the pixels P. As described later, the first semiconductor layer 12 and the second semiconductor layer 13 constitute a p-n junction, and include compound semiconductor materials that have bandgap energy larger than bandgap energy of a compound semiconductor material that constitutes the light absorption layer 14. In a case where the light absorption layer 14 includes, for example, InGaAs (indium gallium arsenide, with bandgap energy of 0.75 eV), for the first semiconductor layer 12 and the second semiconductor layer 13, used may be, for example, InP (indium phosphide, with bandgap energy of 1.35 eV). For the first semiconductor layer 12 and the second semiconductor layer 13, used may be, for example, a group III-V semiconductor including, at least, any one of In (indium), Ga (gallium), Al (aluminum), As (arsenic), P (phosphorus), Sb (antimony), or N (nitrogen). Specifically, in addition to InP, examples may include InGaAsP (indium gallium arsenide phosphide), InAsSb (indium arsenide antimonide), InGaP (indium gallium phosphide), GaAsSb (gallium arsenide antimonide), and In AlAs (indium aluminum arsenide). A sum of a thickness of the first semiconductor layer 12 and a thickness of the second semiconductor layer 13 is, for example, 100 nm to 3000 nm both inclusive.

In a case where a total thickness of the first semiconductor layer 12 and the second semiconductor layer 13 is smaller than 100 nm, there is possibility that, for example, the p-n junction formed between the first semiconductor layer 12 and the second semiconductor layer 13 comes in contact with, for example, the first electrode 11 or the light absorption layer 14. Moreover, in the case where the total thickness of the first semiconductor layer 12 and the second semiconductor layer 13 is smaller than 100 nm, there is possibility that etching damage in forming a groove G1 described later, or damage in forming the coating film 18 described later reaches the light absorption layer 14. These cause an increase in dark currents. In a case where the total thickness of the first semiconductor layer 12 and the second semiconductor layer 13 is greater than 3000 nm, it is difficult to extend and form the diffusion region D to the light absorption layer 14, resulting in difficulty in electrically separating the adjacent ones of the pixels P.

The first semiconductor layer 12 disposed between the first electrode 11 and the second semiconductor layer 13 has carriers of, for example, an n type (a first conductive type). The second semiconductor layer 13 is disposed between the first semiconductor layer 12 and the light absorption layer 14 (the first surface S1), and has carriers of an opposite conductive type to that of the first semiconductor layer 12, e.g., a p type (a second conductive type). This causes formation of the p-n junction between the first semiconductor layer 12 and the second semiconductor layer 13 (at an interface between the first semiconductor layer 12 and the second semiconductor layer 13). As described later in detail, the formation of the p-n junction at the interface between the first semiconductor layer 12 and the second semiconductor layer 13 that have larger bandgap than that of the light absorption layer 14 makes it possible to reduce dark currents. In one alternative, an i-type semiconductor layer (an intrinsic semiconductor layer) may be provided between the first semiconductor layer 12 and the second semiconductor layer 13, to form a p-i-n junction.

The light absorption layer 14 between the second semiconductor layer 13 and the contact layer 15 is provided, for example, as a common layer to all the pixels P. The light absorption layer 14 absorbs light of predetermined wavelengths, and thereby generates the signal charges. The light absorption layer 14 includes, for example, a p-type compound semiconductor material. The compound semiconductor material that constitutes the light absorption layer 14 includes, for example, a group III-V semiconductor including, at least, any one of In (indium), Ga (gallium), Al (aluminum), As (arsenic), P (phosphorus), Sb (antimony), or N (nitrogen). Specifically, examples may include InGaAs (indium gallium arsenide), InGaAsP (indium gallium arsenide phosphide), InAsSb (indium arsenide antimonide), InGaP (indium gallium phosphide), GaAsSb (gallium arsenide antimonide), and InAlAs (indium aluminum arsenide). A doping density of the light absorption layer 14 is, for example, $1 \times 10^{14}$ cm$^{-3}$ to $1 \times 10^{17}$ cm$^{-3}$ both inclusive. In a case where the doping density of the light absorption layer 14 is greater than $1 \times 10^{17}$ cm$^{-3}$, there is an increase in loss probability because of recombination of the signal charges generated by the photoelectric conversion. This contributes to lowered quantum efficiency.

A thickness of the light absorption layer 14 is, for example, 100 nm to 10000 nm both inclusive. In a case where the thickness of the light absorption layer 14 is smaller than 100 nm, more light passes through the light absorption layer 14, causing possibility of a considerable decrease in the quantum efficiency. In a case where the thickness of the light absorption layer 14 is made greater than 5000 nm, it is difficult to form the diffusion region D having a depth of 5000 nm or more. This makes it difficult to sufficiently suppress occurrence of crosstalk between the adjacent ones of the pixels P. In the light absorption layer 14, for example, the photoelectric conversion of the light of the wavelength of the visible region to the short infrared region is performed.

The diffusion region D is, for example, a region in which a p-type impurity is diffused. The diffusion region D is provided in a lattice shape in plan view (FIG. 2). The diffusion region D electrically separates the adjacent ones of the pixels P, and is so provided as to extend isotropically from a front surface of the first semiconductor layer 12 exposed from the insulating films 17. In an in-plane direction of the first semiconductor layer 12 (an X-Y plane in FIGS. 1 and 2), the diffusion region D extends across between the adjacent insulating films 17. In a thickness direction of the first semiconductor layer 12 (a Z direction in FIGS. 1 and 2), the diffusion region D extends from the first semiconductor layer 12, through the second semiconductor layer 13, to a portion or an entirety of the light absorption layer 14. Thus, the diffusion region D is provided across the second semiconductor layer 13 and the light absorption layer 14, causing an interface between the second semiconductor layer 13 and the light absorption layer 14 in each of the pixels P to be surrounded by the diffusion region D. As described later in detail, this causes formation of a temporary pool section (a temporary pool section 14P described later with reference to FIG. 7).

In the diffusion region D, for example, zinc (Zn) as the p-type impurity is diffused. Examples of the p-type impurity may include magnesium (Mg), cadmium (Cd), beryllium (Be), silicon (Si), germanium (Ge), carbon (C), tin (Sn), lead (Pb), sulfur (S) and tellurium (Te). A doping density of the diffusion region D is, for example, $1 \times 10^{17}$ cm$^{-3}$ to $5 \times 10^{19}$ cm both inclusive. Making the doping density of the diffusion region D equal to or greater than $1 \times 10^{17}$ cm$^{-3}$ contributes to suppression of the occurrence of the dark currents at the interface. The upper limit of the doping density, i.e., $5 \times 10^{19}$ cm$^{-3}$, is an upper limit obtained by a diffusion process. A doping density greater than $5 \times 10^{19}$ cm$^{-3}$ is close to a solubility limit, at which the dopants aggregate inside crystal to form a defect, causing a lowered dark current characteristic.

The contact layer 15 is provided, for example, as a common layer to all the pixels P. The contact layer 15 is provided between the light absorption layer 14 (the second surface S2) and the second electrode 16, and is in contact with them. The contact layer 15 is a region in which electrical charges discharged from the second electrode 16 migrate. The contact layer 15 includes, for example, a compound semiconductor including a p-type impurity. For the contact layer 15, used may be, for example, p-type InP (indium phosphide).

The second electrode 16 is provided, for example, as a common electrode to all the pixels P. The second electrode 16 is provided over an entirety of the second surface S2 (the light entrance surface) of the light absorption layer 14, with the contact layer 15 in between. The second electrode 16 discharges electrical charges that are not used as the signal charges, out of electrical charges generated in the light absorption layer 14. For example, in a case where electrons are read out as the signal charges from the first electrode 11, for example, holes may be discharged through the second electrode 16. The second electrode 16 includes a transparent conductive film that is able to allow entering light such as infrared light to pass through. The second electrode 16 has Transmittance of 50% or more with respect to light of a wavelength of, for example, 1.6 μm (1600 nm). For the second electrode 16, used may be, for example, ITO (indium tin oxide) or ITiO ($In_2O_3$—$TiO_2$).

The insulating film 17 is provided for each of the pixels P on the front surface of the first semiconductor layer 12. The insulating film 17 defines the diffusion region D. As described later, the insulating film 17 functions as a mask in a diffusion process in forming the diffusion region D (refer to FIGS. 4C and 5A described later). In other words, the diffusion region D is formed between the adjacent insulating films 17. A thickness of the insulating film 17 is smaller than, for example, the thickness of the first electrode 11, causing the first electrode 11 to protrude from the insulating film 17. It is preferable that the thickness of the insulating film 17 be 10 nm to 5000 nm both inclusive. Using the insulating film 17 of the thickness of 10 nm or more makes it possible to restrain a diffused element (the impurity) from passing through in the diffusion process. Making the thickness of the insulating film 17 greater than 5000 nm causes possibility of difficulty in etching the insulating film 17 at the time of formation of the first electrode 11.

For the insulating film 17, used may be, for example, an insulating material including at least one of silicon (Si), nitrogen (N), aluminum (Al), hafnium (Hf), tantalum (Ta), titanium (Ti), magnesium (Mg), oxygen (O), lanthanum (La), gadolinium (Gd), or yttrium (Y). Specifically, for the insulating film 17, used may be, for example, a silicon nitride (SiN) film. Alternatively, for the insulating film 17, used may be, for example, a silicon oxide ($SiO_2$) film, a silicon oxynitride (SiON) film, an aluminum oxynitride (AlON) film, a silicon aluminum nitride (SiAlN) film, magnesium oxide (MgO), an aluminum oxide ($Al_2O_3$) film, a silicon aluminum oxide (AlSiO) film, a hafnium oxide ($HfO_2$) film, or a hafnium aluminum oxide (HfAlO) film. In another alternative, the insulating film 17 may include an organic material. For the organic material, used is a material that is able to restrain the diffused element from passing through.

The coating film 18 is disposed between the adjacent insulating films 17, and covers the front surface of the first semiconductor layer 12. The coating film 18 protects the front surface of the first semiconductor layer 12 exposed from the insulating films 17. A portion of the coating film 18 may be so provided as to overlap the insulating film 17. The coating film 18 includes, for example, an insulating material or a semiconductor material. Examples of the insulating material that constitutes the coating film 18 may include an insulating material including at least one of silicon (Si), nitrogen (N), aluminum (Al), hafnium (Hi), tantalum (Ta), titanium (Ti), magnesium (Mg), scandium (Sc), zirconium (Zr), oxygen (O), lanthanum (La), gadolinium (Gd), or yttrium (Y). Specifically, the coating film 18 includes, for example, an aluminum oxide ($Al_2O_3$) film. Alternatively, the coating film 18 may include, for example, a silicon nitride (SiN) film, a silicon oxide ($SiO_2$) film, a silicon oxynitride (SiON) film, an aluminum oxynitride (AlON) film, a silicon aluminum nitride (SiAlN) magnesium oxide (MgO), a silicon aluminum oxide (AlSiO) film, a hafnium oxide ($HfO_2$) film, a hafnium aluminum oxide (HfAlO) film, a tantalum oxide ($Ta_2O_3$) film, a titanium oxide ($TiO_2$) film, a scandium oxide ($Sc_2O_3$) film, a zirconium oxide ($ZrO_2$) film, a gadolinium oxide ($Gd_2O_3$) film, a lanthanum oxide ($La_2O_3$) film, or an yttrium oxide ($Y_2O_3$) film. Examples of the semiconductor material that constitutes the coating film 18 may include a group IV semiconductor material such as silicon (Si) and germanium (Ge). A thickness of the coating film 18 is, for example, 1 nm to 500 nm both inclusive. There is no specific lower limit on the thickness of the coating film 18, but from viewpoint of a deposition process, it is preferable to be 1 nm or more, in order to provide perfect coverage of the exposed compound semiconductor. There is no specific upper limit on the thickness of the coating film 18, but from viewpoint of the ensuing formation of the first electrode 11 and a planarization process, it is preferable to be 500 nm or smaller. It is to be noted that the coating film 18 does not have to be provided, and may be omitted as appropriate.

Figure 3:
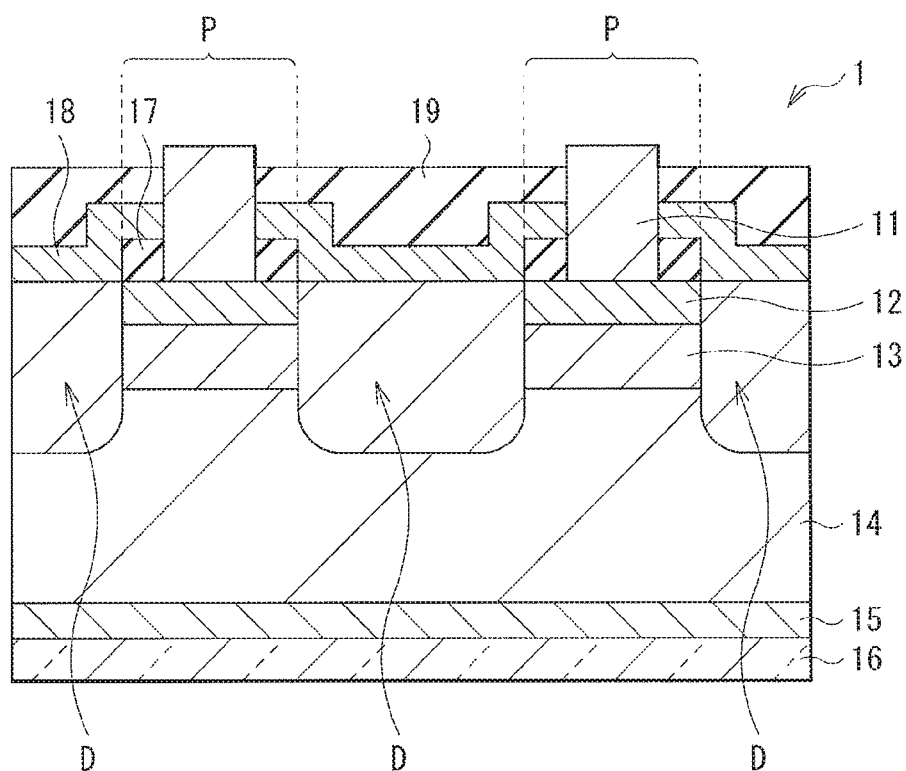
FIG. 3 is a schematic cross-sectional view illustrating another example of the imaging device illustrated in FIG. 1.

As illustrated in FIG. 3, a protection film 19 may be stacked on the coating film 18. For the protection film 19, used may be, for example, an insulating material including at least one of silicon (Si), nitrogen (N), aluminum (Al), hafnium (Hf), tantalum (Ta), titanium (Ti), magnesium (Mg), oxygen (O), lanthanum (La), gadolinium (Gd), or yttrium (Y). Specifically, the protection film 19 includes, for example, a silicon oxide ($SiO_2$) film. Alternatively, the protection film 19 may include, for example, a silicon nitride (SiN) film, an aluminum oxide ($Al_2O_3$) film, a silicon oxynitride (SiON) film, an aluminum oxynitride (AlON) film, a silicon aluminum nitride (SiAlN) film, magnesium oxide (MgO), a silicon aluminum oxide (AlSiO) film, a hafnium oxide ($HfO_2$) film, or a hafnium aluminum oxide (HfAlO) film.

[Method of Manufacturing Imaging Device 1]

The imaging device 1 may be manufactured in the following example manner. FIGS. 4A to 5C illustrate manufacturing processes of the imaging device 1 in order of processes.

Figure 4A:
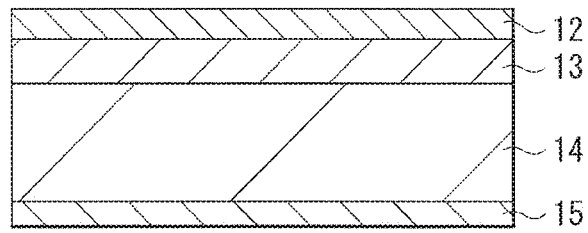
FIG. 4A is a schematic cross-sectional view illustrating a process of a method of manufacturing the imaging device illustrated in FIG. 1.

First, as illustrated in FIG. 4A, a stacked body is formed by, for example, epitaxial growth. The stacked body includes the contact layer 15, the light absorption layer 14, the second semiconductor layer 13, and the first semiconductor layer 12 in this order. At this occasion, the p-n junction is formed between the second semiconductor layer 13 and the first semiconductor layer 12.

Figure 4B:
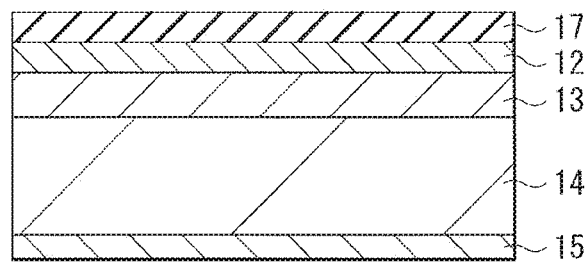
FIG. 4B is a schematic cross-sectional view illustrating a process subsequent to FIG. 4A.
Figure 4C:
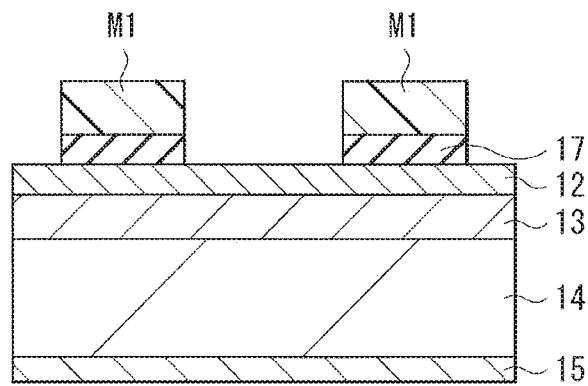
FIG. 4C is a schematic cross-sectional view illustrating a process subsequent to FIG. 4B.

Thereafter, as illustrated in FIG. 4B, the insulating film 17 of the thickness of, for example, 10 nm or more is deposited over an entirety of the front surface of the first semiconductor layer 12. Thereafter, as illustrated in FIG. 4C, photoresist and etching are carried out with the use of, for example, a mask M1. The etching is carried out by dry etching or wet etching. Thus, a portion of the insulating film 17 is removed, to cause the front surface of the first semiconductor layer 12 to be exposed in a lattice shape.

Figure 5A:
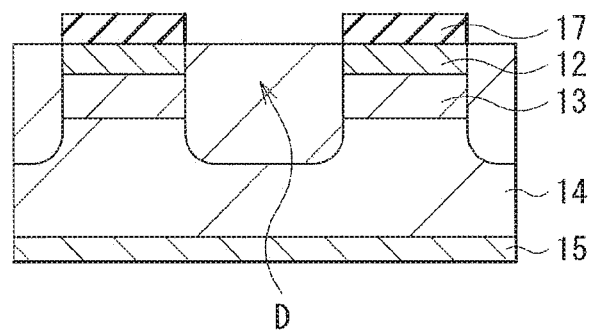
FIG. 5A is a schematic cross-sectional view illustrating a process subsequent to FIG. 4C.

After causing the front surface of the first semiconductor layer 12 to be exposed in the lattice shape from the insulating film 17, as illustrated in FIG. 5A, the diffusion region D is formed. The diffusion region D is formed by diffusing the p-type impurity, e.g., zinc (Zn), from the exposed surface of the first semiconductor layer 12. The diffusion of the impurity is carried out by, for example, vapor phase diffusion or solid phase diffusion. Diffusion conditions of the impurity are so set as to allow the diffusion region D to be formed to inside the light absorption layer 14 from the first semiconductor layer 12 through the second semiconductor layer 13. For example, an anneal temperature is adjusted to 300 degrees to 800 degrees both inclusive.

Figure 5B:
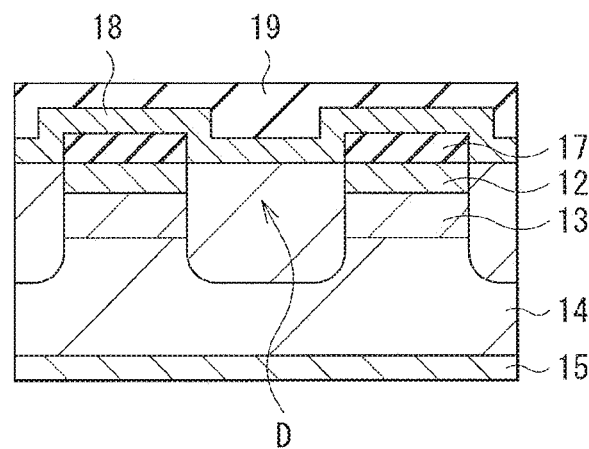
FIG. 5B is a schematic cross-sectional view illustrating a process subsequent to FIG. 5A.

After forming the diffusion region D, as illustrated in FIG. 5B, the coating film 18 is formed over the entirety of the front surface of the first semiconductor layer 12. The coating film 18 is so formed as to cover the insulating film 17, together with the first semiconductor layer 12. After forming the coating film 18, the protection film 19 may be further formed. The coating film 18 is formed by depositing the insulating material with the use of, for example, a thermal oxidation method, a CVD (Chemical Vapor Deposition) method, or an ALD (Atomic Layer Deposition) method. Alternatively, the coating film 18 may be formed by depositing the semiconductor material with the use of, for example, a sputter vapor deposition method, an electron-beam (E-beam gun) vapor deposition method, a resistance heating vapor deposition method, the CVD method, or the ALD method.

Figure 5C:
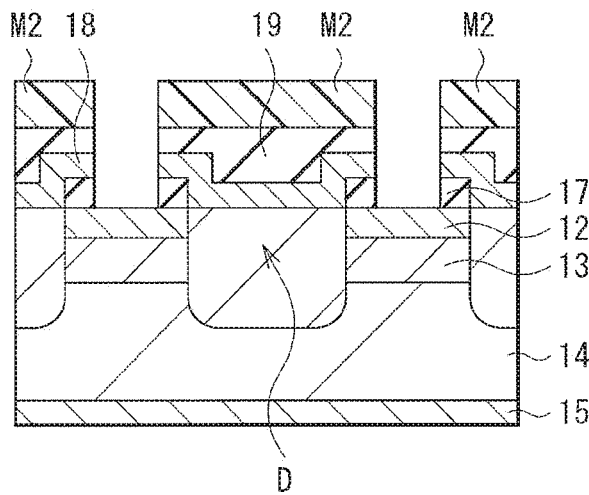
FIG. 5C is a schematic cross-sectional view illustrating a process subsequent to FIG. 5B.

After forming the coating film 18, as illustrated in FIG. 5C, photoresist and etching are carried out with the use of, for example, a mask M2. The etching is carried out by the dry etching or the wet etching. Thus, a hole that extends to the first semiconductor layer 12 is formed in the protection film 19, the coating film 18, and the insulating film 17. The hole is intended to form the first electrode 11. The hole is formed at a position that does not overlap the diffusion region D in plan view.

After forming the hole in the protection film 19, the coating film 18, and the insulating film 17, the first electrode 11 is formed in the hole. Lastly, the second electrode 16 is formed over an entire surface of the contact layer 15. Thus, the imaging device 1 illustrated in FIG. 1 is completed.

[Operation of Imaging Device 1]

Figure 6:
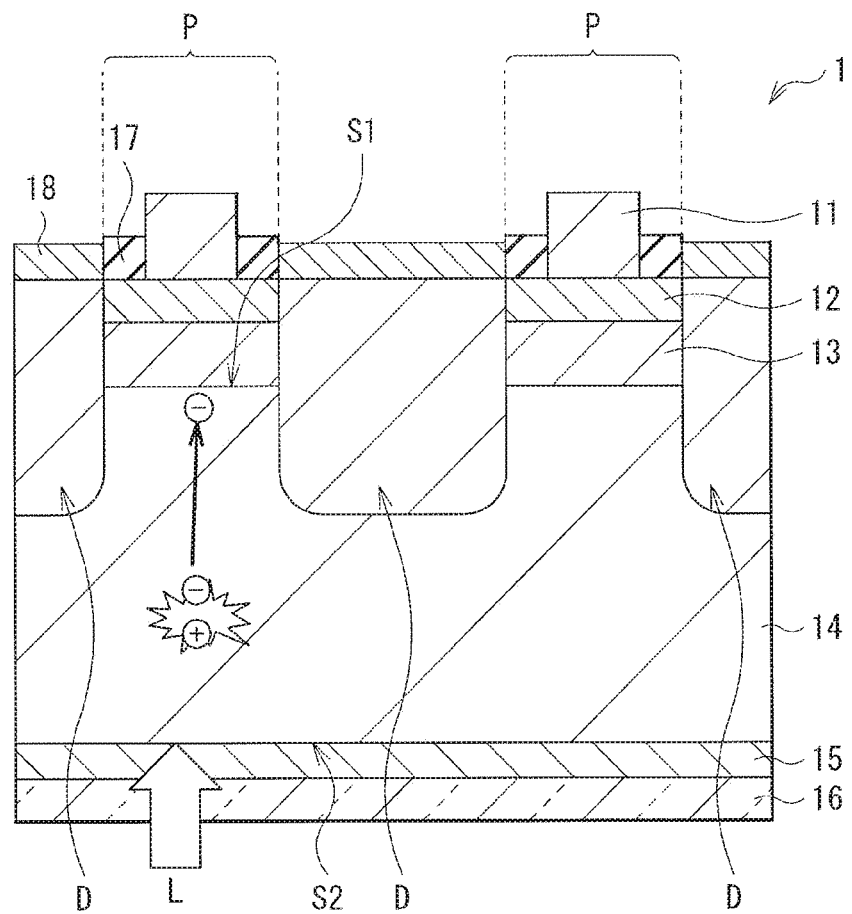
FIG. 6 is a schematic cross-sectional view provided for description of operation of the imaging device illustrated in FIG. 1.

Referring to FIG. 6, in the imaging device 1, upon light L entering the light absorption layer 14 through the second electrode 16 and the contact layer 15, the light L is absorbed in the light absorption layer 14. The light L is, for example, the light of the wavelength of the visible region and the infrared region. Thus, in the light absorption layer 14, pairs of the holes (holes) and the electrons are generated. In other words, the photoelectric conversion is performed. At this occasion, application of a predetermined voltage to, for example, the first electrode 11 causes generation of a potential gradient in the light absorption layer 14. This causes one of two kinds of the electrical charges generated (e.g., the electrons) to migrate as the signal charges to the temporary pool section (the temporary pool section 14P described later with reference to FIG. 7). The temporary pool section or the temporary pool section 14P is located near the interface between the light absorption layer 14 and the second semiconductor layer 13.

Figure 7:
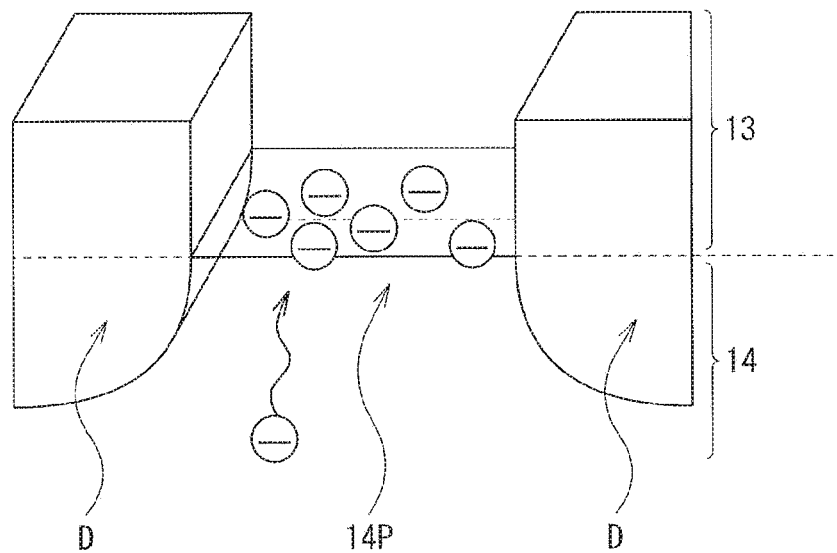
FIG. 7 is a schematic cross-sectional view provided for description of a temporary pool section of signal charges illustrated in FIG. 6.

With reference to FIG. 7, described is the temporary pool section 14P formed in the imaging device 1. Because the bandgap energy of the second semiconductor layer 13 is larger than that of the light absorption layer 14, there is provided a band offset barrier at the interface between the light absorption layer 14 and the second semiconductor layer 13. Therefore, the migration of the signal charges from the light absorption layer 14 to the second semiconductor layer 13 is temporarily hindered. Moreover, because the diffusion region D is provided between the adjacent ones of the pixels P, the migration between the adjacent ones of the pixels P is also hindered. Accordingly, the signal charges are temporarily pooled in a pocket-like section (the temporary pool section 14P) surrounded by the diffusion region D, near the interface between the light absorption layer 14 and the second semiconductor layer 13. The signal charges get over the band offset barrier to get out of the temporary pool section 14P, and are collected to the first electrode 11 through the second semiconductor layer 13 and the first semiconductor layer 12. The signal charges are read out by a readout integrated circuit (ROTC) for each of the pixels P.

[Workings and Effects of Imaging Device 1]

In the imaging device 1 according to the present embodiment, the diffusion region D is provided between the adjacent ones of the pixels P. This causes the adjacent ones of the pixels P to be electrically separated by the diffusion region D. Moreover, the p-n junction is provided by the first semiconductor layer 12 (n-type) and the second semiconductor layer 13 (p-type). This causes a depletion layer to be formed near between the semiconductor layers having the bandgap energy larger than the bandgap energy of the light absorption layer 14 (between the first semiconductor layer 12 and the second semiconductor layer 13). Hence, it is possible to restrain the migration of the signal charges between the adjacent ones of the pixels P, and to reduce the dark currents. The forgoing is described below.

Figure 8:
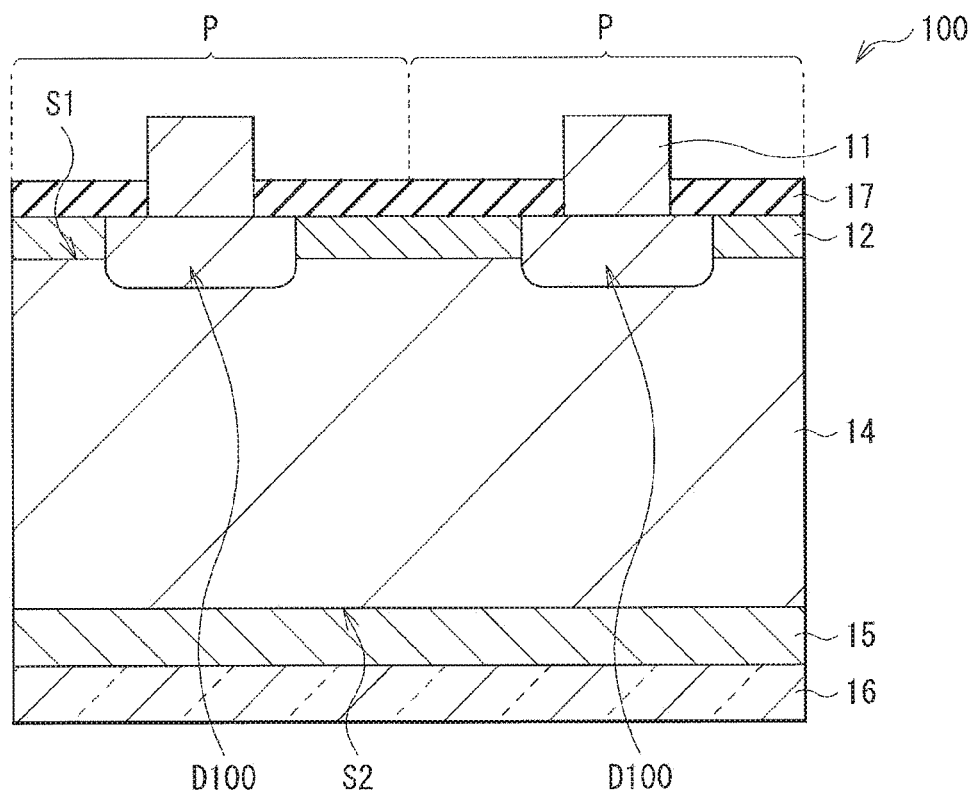
FIG. 8 is a schematic cross-sectional view illustrating a configuration in outline of an imaging device according to a comparative example 1.

FIG. 8 illustrates a schematic cross-sectional configuration of an imaging device (an imaging device 100) according to a comparative example 1. The imaging device 100 includes the first electrode 11, the first semiconductor layer 12 (n-type), the light absorption layer 14 (n-type), the contact layer 15, and the second electrode 16 in this order. In the first semiconductor layer 12 and the light absorption layer 14, a p-type diffusion region D100 is provided for each of the pixels P. The diffusion region D100 is coupled to the first electrode 11. Thus, the signal charges (e.g., the holes) generated in the light absorption layer 14 migrate to the diffusion region D100, and are collected from the diffusion region D100 to the first electrode 11.

Figure 9:
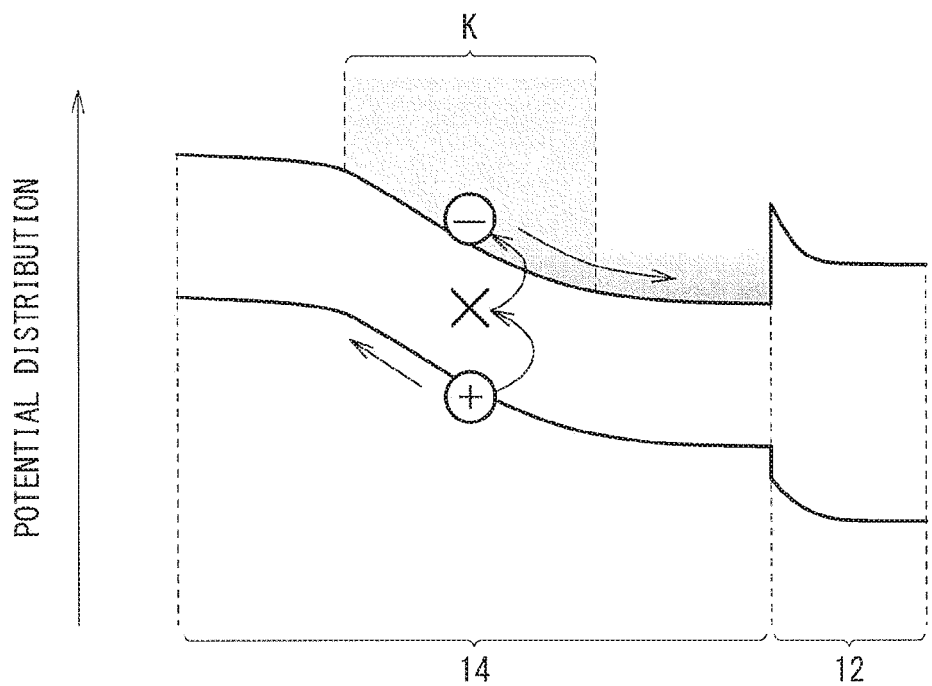
FIG. 9 is a diagram provided for description of a position of a depletion layer to be formed in the imaging device illustrated in FIG. 8.

FIG. 9 schematically illustrates potential distribution of the imaging device 100. In the imaging device 100 as described, a p-n junction is formed inside the light absorption layer 14 by the diffusion region D100. In other words, a depletion layer K caused by the p-n junction is formed inside the light absorption layer 14. Most of the dark currents occur in the depletion layer K. Moreover, probability of generation of the dark currents is significantly influenced by bandgap of a semiconductor layer where the depletion layer K is present. In a case with small bandgap of the semiconductor layer where the depletion layer K is present, the probability of the generation of the dark currents becomes higher. In the imaging device 100, the depletion layer K is formed inside the light absorption layer 14 having the small bandgap. This contributes to high likelihood of the generation of the dark currents.

Moreover, although the diffusion region D100 is provided for each of the pixels P, in a portion of the light absorption layer 14 in which the diffusion region D100 is not provided (on side on which light enters), the signal charges are able to freely migrate between the pixels P. In other words, in the imaging device 100, there is no electrical or physical barrier that restrains the migration of the signal charges between the pixels P, in the portion of the light absorption layer 14 in which the diffusion region D100 is not provided. This causes possibility of the occurrence of the crosstalk of the signal charges between the adjacent ones of the pixels P.

Figure 10:
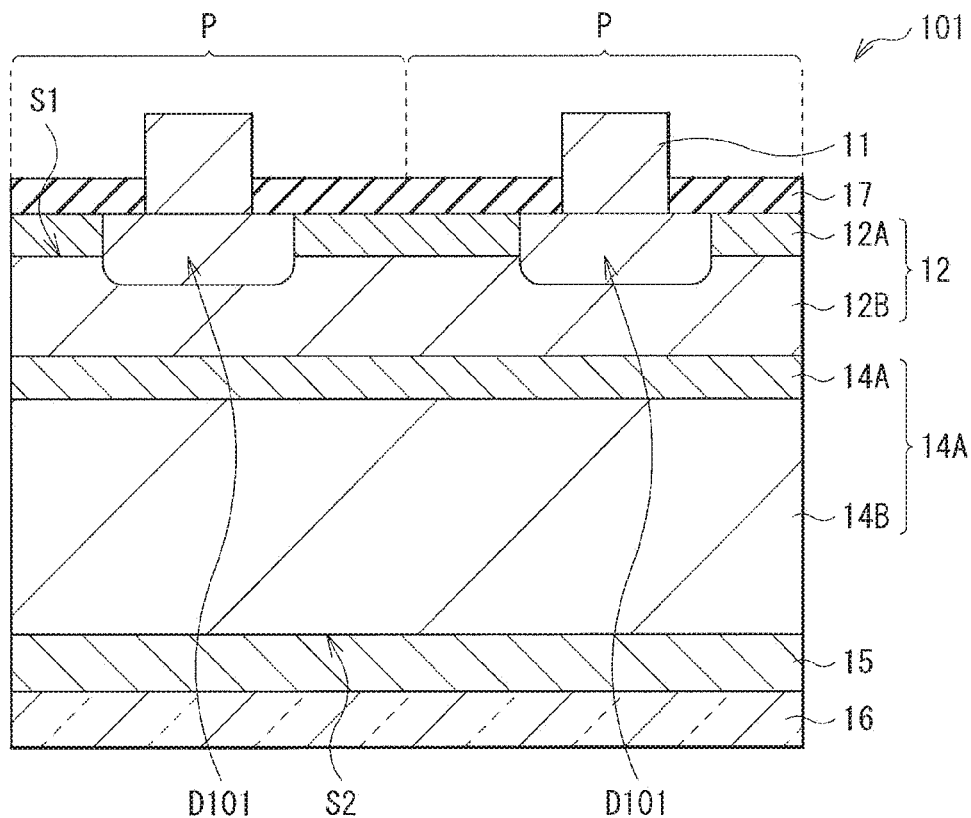
FIG. 10 is a schematic cross-sectional view illustrating a configuration in outline of an imaging device according to a comparative example 2.

FIG. 10 illustrates a schematic cross-sectional configuration of an imaging device (an imaging device 101) according to a comparative example 2. The imaging device 101 includes the first electrode 11, the first semiconductor layer 12 (n-type), the light absorption layer 14 (n-type), the contact layer 15, and the second electrode in this order. The first semiconductor layer 12 includes a first semiconductor layer 12A and a first semiconductor layer 12B in this order, i.e., in the order of closeness of their positions to the first electrode 11. The first semiconductor layer 12B has a lower impurity concentration than the first semiconductor layer 12A. The light absorption layer 14 includes a light absorption layer 14A and a light absorption layer 14B, in the order of closeness of their positions to the first semiconductor layer 12. The light absorption layer 14B has a lower impurity concentration than the light absorption layer 14A. In the first semiconductor layer 12, a p-type diffusion region D101 is provided for each of the pixels P. The diffusion region D101 is not provided in the light absorption layer 14. The diffusion region D101 is coupled to the first electrode 11. Thus, the signal charges (e.g., the holes) generated in the light absorption layer 14 migrate to the diffusion region D101, and are collected from the diffusion region D101 to the first electrode 11.

Figure 11:
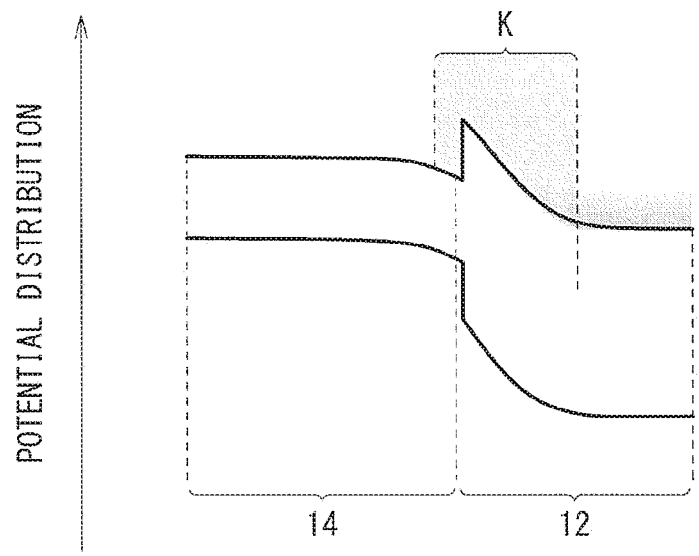
FIG. 11 is a diagram provided for description of a position of a depletion layer to be formed in the imaging device illustrated in FIG. 10.

FIG. 11 schematically illustrates potential distribution of the imaging device 101. In the imaging device 101, the diffusion region D101 does not extend to the light absorption layer 14, but is provided solely in the first semiconductor layer 12. In other words, the depletion layer K is formed in the first semiconductor layer 12 having the bandgap larger than that of the light absorption layer 14. Hence, it is possible to reduce the probability of the generation of the dark currents, as compared to the imaging device 100.

However, the imaging device 101 involves higher likelihood of the migration of the signal charges between the adjacent ones of the pixels P, as compared to the imaging device 100. Because the light absorption layer 14 is devoid of the diffusion region D101, the signal charges freely migrate inside the light absorption layer 14.

Moreover, in the imaging device 101, there is possibility of lowering of readout efficiency of the signal charges, because of the band offset barrier at the interface between the light absorption layer 14 and the first semiconductor layer 12.

Figure 12:
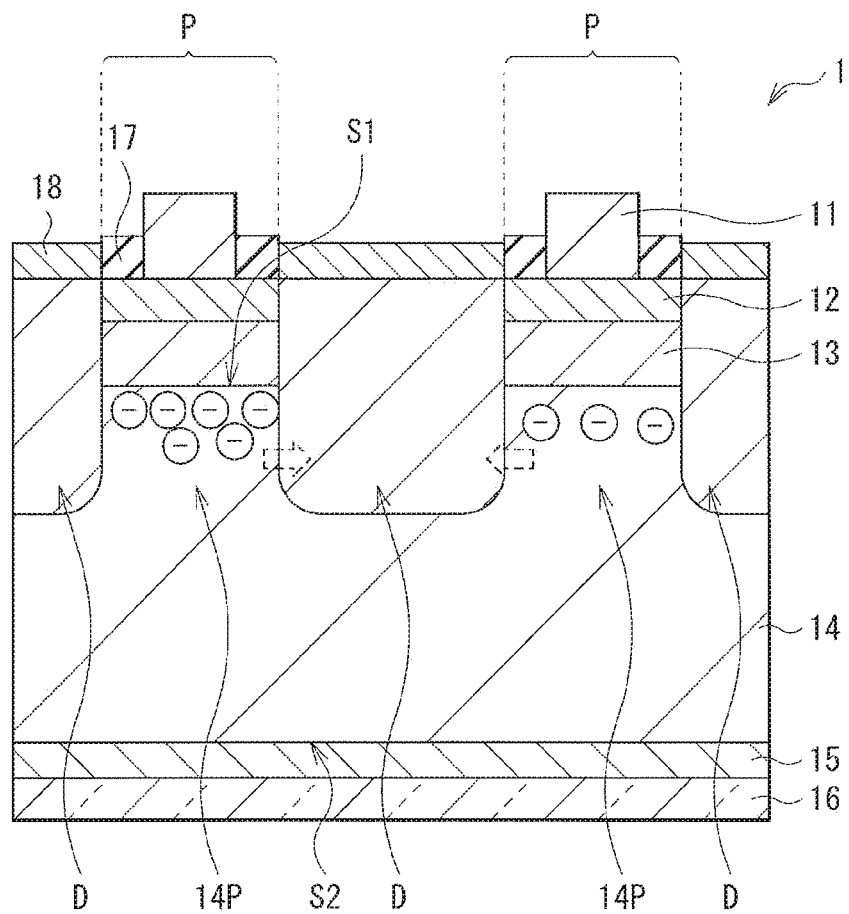
FIG. 12 is a schematic cross-sectional view provided for description of workings and effects of the imaging device illustrated in FIG. 1.

In contrast, in the imaging device 1, as illustrated in FIG. 12, because the diffusion region D is provided between the adjacent ones of the pixels P, the signal charges are accumulated in the temporary pool section 14P for each of the pixels P. Accordingly, the migration of the signal charges between the adjacent ones of the pixels P is restrained. Moreover, in the imaging device 1, the p-n junction is formed at the interface between the first semiconductor layer 12 (n-type) and the second semiconductor layer 13 (p-type), with the depletion layer being disposed in the semiconductor layers having the relatively larger bandgap energy (near between the first semiconductor layer 12 and the second semiconductor layer 13). Accordingly, the probability of the generation of the dark currents is lowered.

Furthermore, in the imaging device 1, owing to the temporary pool section 14P, it is possible to reduce the dark currents more effectively. The forgoing is described below.

Figure 13:
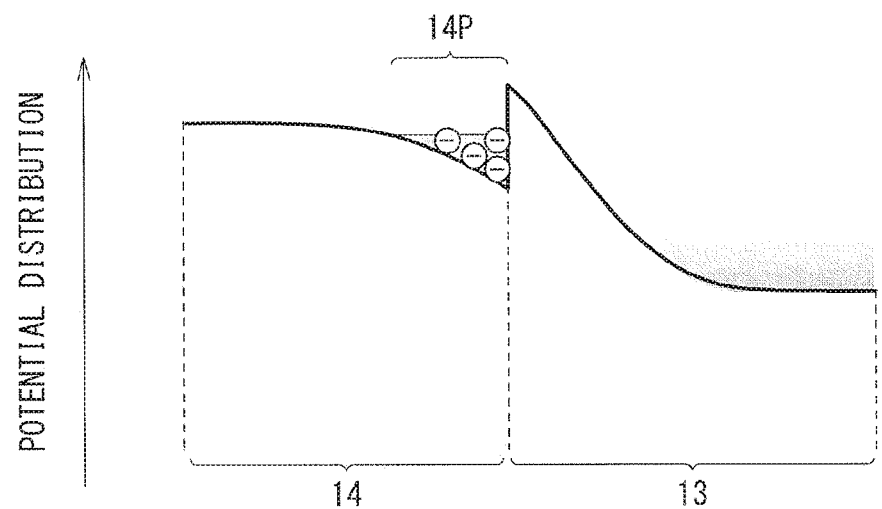
FIG. 13 is a diagram provided for description of an effect (1) of the temporary pool section illustrated in FIG. 7.

FIG. 13 illustrates potential distribution near the temporary pool section 14P. In the temporary pool section 14P, not only the signal charges but also electrical charges caused by the dark currents are accumulated. This leads to presence of the electrical charges all the time near the temporary pool section 14P. In other words, it is less likely that a region including few electrical charges (the depletion layer) is formed near the temporary pool section 14P, This leads to reduction in the dark currents.

Figure 14:
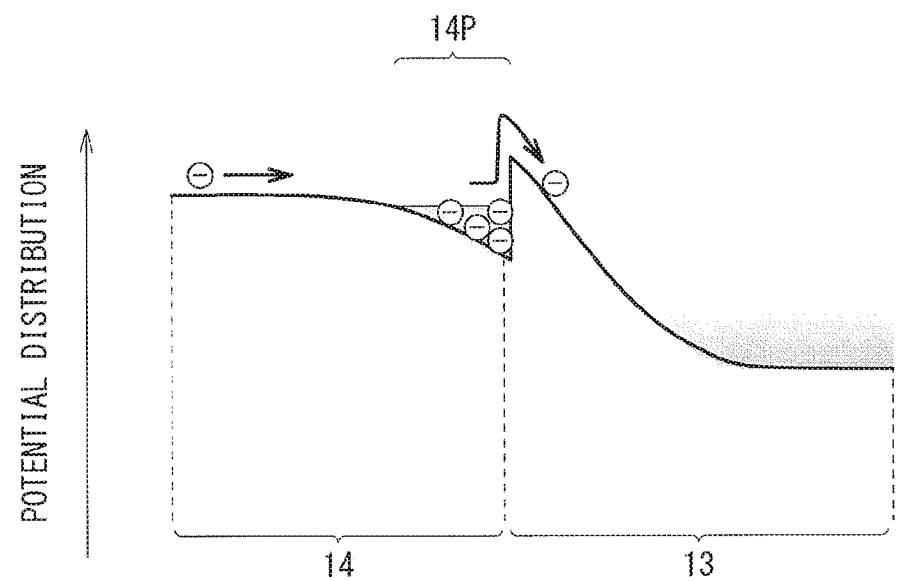
FIG. 14 is a diagram provided for description of an effect (2) of the temporary pool section illustrated in FIG. 7.

In addition, as illustrated in FIG. 14, the signal charges get over the band offset barrier between the light absorption layer 14 and the second semiconductor layer 13 more easily. Specifically, as mentioned above, the electrical charges caused by the dark currents are accumulated in the temporary pool section 14P. Accordingly, with less energy, the signal charges get over the band offset barrier between the light absorption layer 14 and the second semiconductor layer 13, The signal charges are transferred from the light absorption layer 14 to the first electrode 11, through the second semiconductor layer 13 and the first semiconductor layer 12. Therefore, in the imaging device 1, it is possible to restrain the lowering of the readout efficiency of the signal charges, as compared to the imaging device 101. As described, in the imaging device 1, the dark currents are reduced, and the lowering of the readout efficiency of the signal charges is restrained. This leads to a higher signal-to-noise ratio (S/N ratio). In other words, the imaging device 1 has a higher sensitivity characteristic.

Figure 15:
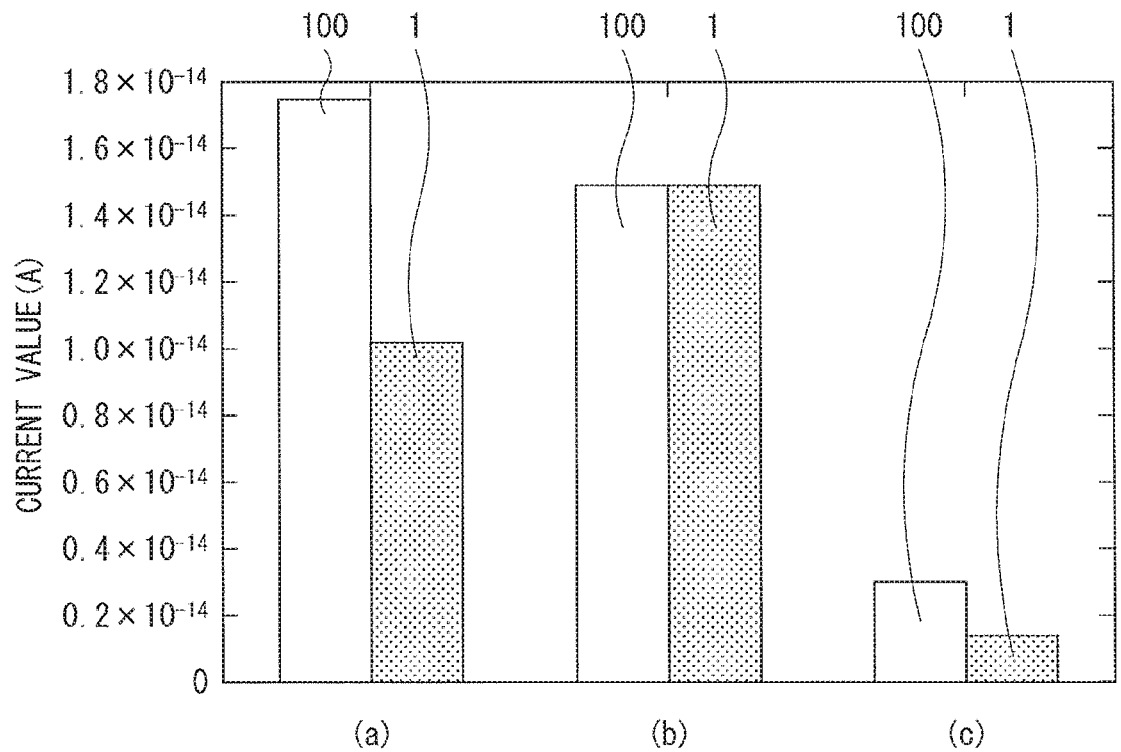
FIG. 15 is a diagram illustrating the effects of the imaging device illustrated in FIG. 1, in comparison with those of the imaging device illustrated in FIG. 8.

FIG. 15 illustrates results of comparison of the imaging device 1 with the imaging device 100, by simulation, with respect to the following three points (a) to (c). The point (a) is the dark currents. The point (b) is the readout efficiency of the signal charges. The point (c) is the migration of the signal charges between the pixels P. Regarding the point (c), solely the single pixel P was illuminated with light, with the remaining pixels P being shielded against light. Thus, an amount of currents of the signal charges that flew between the adjacent ones of the pixels P (the light-shielded pixels) was obtained by simulation.

Regarding the point (a), it was confirmed that in the imaging device 1, the dark currents were reduced by 42%, as compared to the imaging device 100. Regarding the point (h), the imaging device 1 had the readout efficiency of the signal charges in the substantially same order of magnitude as the imaging device 100. No lowering of the readout efficiency of the signal charges was confirmed. Regarding the point (c), it was confirmed that in the imaging device 1, the migration of the signal charges to the adjacent pixel P was restrained by about 53%, as compared to the imaging device 100.

As described above, in the imaging device 1 according to the present embodiment, the adjacent ones of the pixels P are electrically separated by the diffusion region D. This makes it possible to restrain the migration of the signal charges between the adjacent ones of the pixels P. Moreover, the depletion layer K is formed near between the semiconductor layers having the bandgap energy larger than the bandgap energy of the light absorption layer 14 (between the first semiconductor layer 12 and the second semiconductor layer 13). This makes it possible to reduce the dark currents. Hence, it is possible to restrain the migration of the signal charges between the adjacent ones of the pixels P, and to reduce the dark currents.

Furthermore, owing to the presence of the electrical charges all the time near the temporary pool section 14P, it is possible to restrain the occurrence of the dark currents more effectively.

Moreover, owing to the electrical charges that are present near the temporary pool section 14P, the signal charges get over the band offset barrier between the light absorption layer 14 and the second semiconductor layer 13 more easily. Hence, it is possible to restrain the lowering of the readout efficiency of the signal charges.

In the following, description is given of modification examples of the forgoing embodiment and other embodiments. In the following description, the same constituent elements as those of the embodiment described above are denoted with the same reference numerals, with description thereof omitted as appropriate.

Modification Example 1

Figure 16:
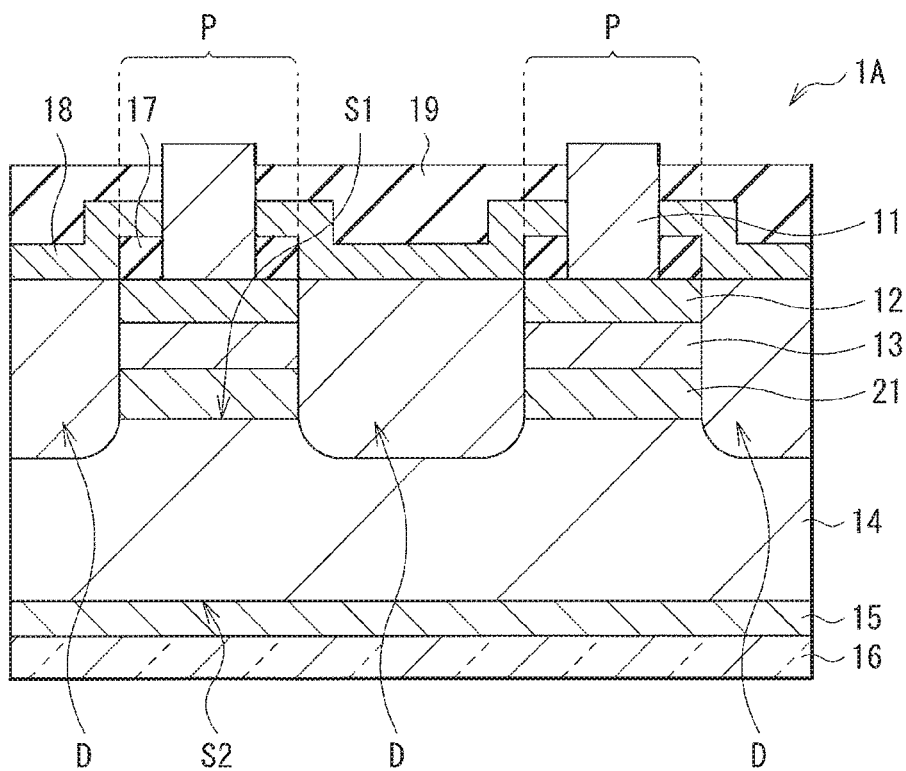
FIG. 16 is a schematic cross-sectional view illustrating a configuration in outline of an imaging device according to a modification example 1.

FIG. 16 illustrates a schematic cross-sectional configuration of an imaging device (an imaging device 1A) according to a modification example 1 of the forgoing first embodiment. The imaging device 1A includes an electrical charge collection layer electrical charge collection layer 21) between the second semiconductor layer 13 and the light absorption layer 14. Otherwise, the imaging device 1A has a configuration and effects that are similar to those of the imaging device 1.

The electrical charge collection layer 21 temporarily accumulates the signal charges generated in the light absorption layer 14. Providing the electrical charge collection layer 21 allows the temporary pool section 14P (refer to FIG. 7) to be formed more stably. The electrical charge collection layer 21 includes, for example, a same material as that of the light absorption layer 14, and has a same polarity as that of the light absorption layer 14. An impurity concentration of the electrical charge collection layer 21 is lower than that of the light absorption layer 14. For example, in a case where p-type InGaAs (indium gallium arsenide) is used for the light absorption layer 14, for the electrical charge collection layer 21, used may be p-type InGaAs having a lower p-type impurity concentration than that of the light absorption layer. In a case where the signal charges are the electrons, for the electrical charge collection layer 21, used may be a material having conduction-band edge energy lower than that of a constituent material of the light absorption layer 14. In a case where the signal charges are the holes, for the electrical charge collection layer 21, used may be a material having valence-band edge energy higher than that of the constituent material of the light absorption layer 14. The electrical charge collection layer 21 may include, for example, a compound semiconductor material including, at least, any one of in (indium), Ga (gallium), Al (aluminum), As (arsenic), P (phosphorus), Sb (antimony), or N (nitrogen).

As in the present modification example, the electrical charge collection layer 21 may be provided between the second semiconductor layer 13 and the light absorption layer 14. In this case as well, it is possible to produce equivalent effects to those of the forgoing first embodiment.

Modification Example

Figure 17:
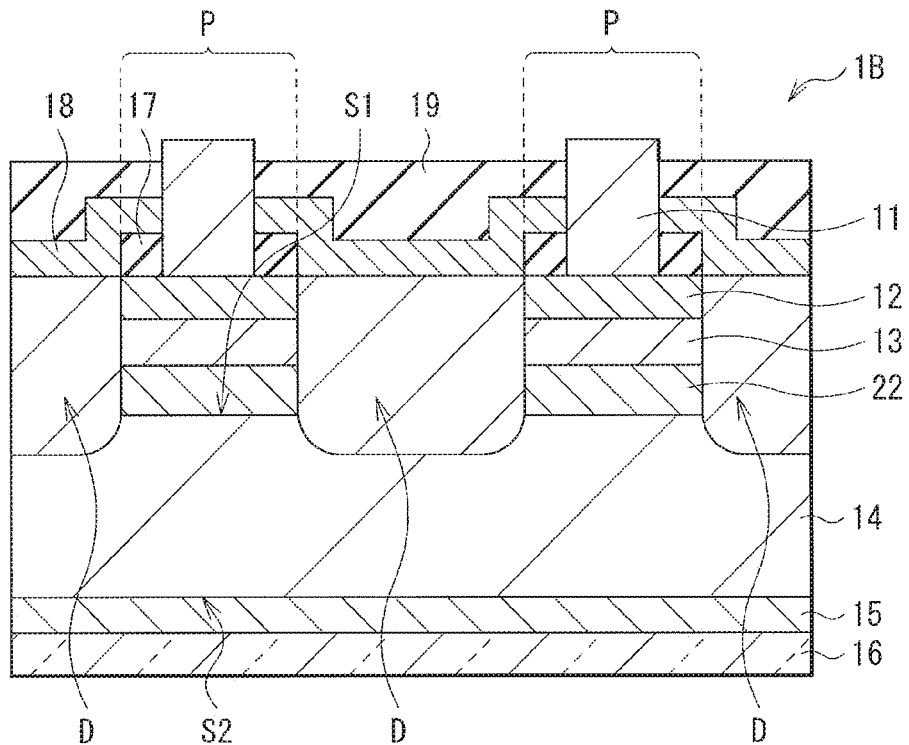
FIG. 17 is a schematic cross-sectional view illustrating a configuration in outline of an imaging device according to a modification example 2.

FIG. 17 illustrates a schematic cross-sectional configuration of an imaging device imaging device 1B) according to a modification example 2. The imaging device 1B includes a barrier alleviation layer (a barrier alleviation layer 22) between the second semiconductor layer 13 and the light absorption layer 14. Otherwise, the imaging device 1B has a configuration and effects similar to those of the imaging device 1.

The barrier alleviation layer 22 alleviates the band offset barrier between the light absorption layer 14 and the second semiconductor layer 13. Providing the barrier alleviation layer allows the signal charges generated in the light absorption layer 14 to migrate more easily to the second semiconductor layer 13 through the barrier alleviation layer 22.

Hence, it is possible to restrain the lowering of the readout efficiency of the signal charges more effectively.

In the case where the signal charges are the electrons, for the barrier alleviation layer 22, used may be a compound semiconductor material conduction-band edge energy of which is between that of the constituent material of the light absorption layer 14 and that of a constituent material of the second semiconductor layer 13. For example, in the case where the light absorption layer 14 includes p-type InGaAs (indium gallium arsenide), and the second semiconductor layer 13 includes p-type InP, for the barrier alleviation layer 22, used may be p-type InGaAsP (indium gallium arsenide phosphide). In the case where the signal charges are the holes, for the barrier alleviation layer 22, used may be a compound semiconductor material valence-band edge energy of which is between that of the constituent material of the light absorption layer 14 and that of the constituent material of the second semiconductor layer 13. The barrier alleviation layer 22 includes, for example, a compound semiconductor material including, at least, any one of In (indium), Ga (gallium), Al (aluminum), As (arsenic), P (phosphorus), Sb (antimony), or N (nitrogen).

As in the present modification example, the barrier alleviation layer 22 may be provided between the second semiconductor layer 13 and the light absorption layer in this case as well, it is possible to produce equivalent effects to those of the forgoing first embodiment. Furthermore, owing to the barrier alleviation layer 22, it is possible to restrain the lowering of the readout efficiency of the signal charges more effectively.

Modification Example 3

Figure 18:
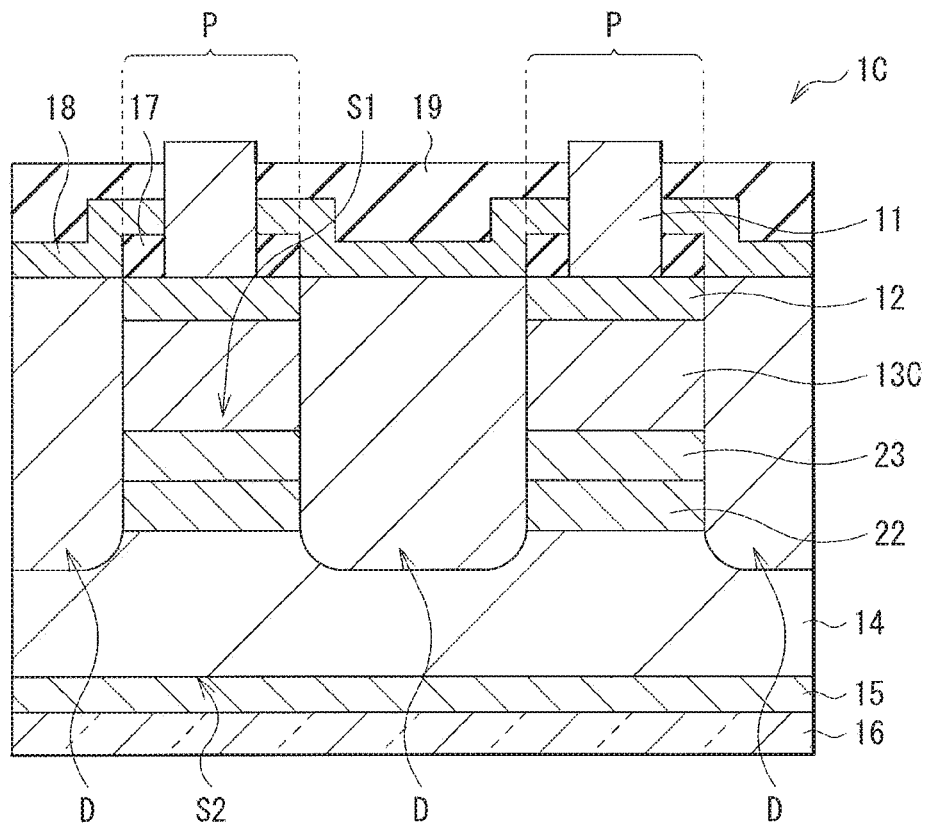
FIG. 18 is a schematic cross-sectional view illustrating a configuration in outline of an imaging device according to a modification example 3.

FIG. 18 illustrates a schematic cross-sectional configuration of an imaging device (an imaging device 1C) according to a modification example 3. In the imaging device 1C, a second semiconductor layer (a second semiconductor layer 13C) causes avalanche amplification of the signal generated in the light absorption layer 14. Otherwise, the imaging device 1B has a configuration and effects similar to those of the imaging device 1.

The second semiconductor layer 13C is provided between the first semiconductor layer 12 and the light absorption layer 14. As with the second semiconductor layer 13 of the forgoing imaging device 1, the second semiconductor layer 13C includes the semiconductor material having the bandgap larger than the bandgap of the constituent material of the light absorption layer 14. In a case where the light absorption layer 14 includes p-type InGaAs (indium gallium arsenide), for the second semiconductor layer 13C, used may be p-type InP. Upon the signal charges generated in the light absorption layer 14 flowing into the second semiconductor layer 13C to which a high electric field is applied, the signal charges are amplified by an avalanche amplification phenomenon. This allows for further enhancement in the S/N ratio, making it possible to enhance the sensitivity characteristic.

Between the second semiconductor layer 13C and the light absorption layer 14, provided may be an electric field descending layer (an electric field descending layer 23). The electric field descending layer 23 prevents the electric field applied to the second semiconductor layer 13C from propagating to the light absorption layer 14. The electric field descending layer 23 may include, for example, a same compound semiconductor material as a constituent material of the second semiconductor layer 13C. For example, in a case where the second semiconductor layer 13C includes p-type InP, for the electric field descending layer 23, used may be p-type InP having a lower p-type impurity concentration than that of the second semiconductor layer 13C. Alternatively, for the electric field descending layer 23, used may be a compound semiconductor material having bandgap that is smaller than bandgap of the constituent material of the second semiconductor layer 13C and is larger than the bandgap of the constituent material of the light absorption layer 14. The electric field descending layer 23 includes, for example, a compound semiconductor material including, at least, any one of In (indium), Ga (gallium), Al (aluminum), As (arsenic), P (phosphorus), Sb (antimony), or N (nitrogen).

Between the electric field descending layer 23 and the light absorption layer 14, the barrier alleviation layer 22 may be further provided.

As in the present modification example, the second semiconductor layer 13C may be provided, causing the avalanche amplification of the signal charges generated in the light absorption layer 14. The barrier alleviation layer 22 may be further provided between the 13 and the light absorption layer 14, in this case as well, it is possible to produce equivalent effects to those of the forgoing first embodiment. Furthermore, owing to the second semiconductor layer 13C, it is possible to enhance the sensitivity characteristic.

Modification Example 4

Figure 19:
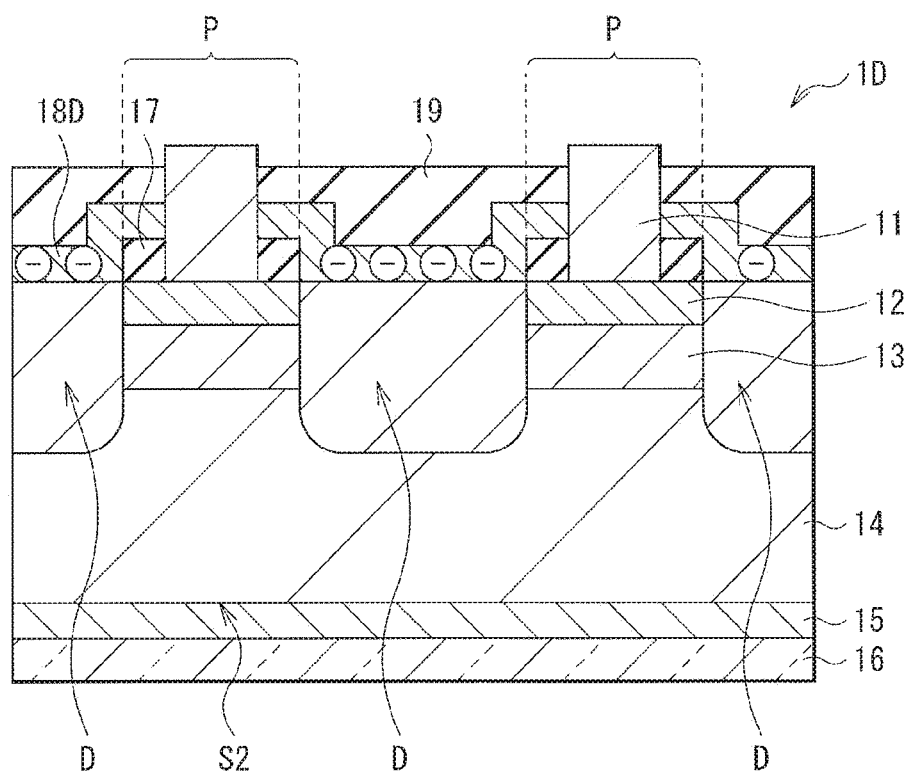
FIG. 19 is a schematic cross-sectional view illustrating a configuration in outline of an imaging device according to a modification example 4.

FIG. 19 illustrates a schematic cross-sectional configuration of an imaging device (an imaging device 1D) according to a modification example 4. A coating film (a coating film 18D) of the imaging device 1D includes electric charges (electrons) of an opposite conductive type to the conductive type of the diffusion region D (e.g., p type). Otherwise, the imaging device 1D has a configuration and effects to those of the imaging device 1.

The coating film 18D is provided in contact with the first semiconductor layer 12, and covers the diffusion region D. The coating film 18D that covers the p-type diffusion region D (the first semiconductor layer 12) includes, for example, an aluminum oxide ($Al_2O_3$) film including the electrons. Thus, in the first semiconductor layer 12, the holes are induced near an interface between the first semiconductor layer 12 and the coating film 18D, causing less likelihood that a region having few electric charges (a depletion region) is formed. Hence, it is possible to reduce the dark currents. For the coating film 18D, used may be a similar material to that of the coating film 18 of the forgoing imaging device 1. In a case where the diffusion region D includes, for example, an n-type impurity, the coating film 18D may include the holes.

As in the present modification example, the coating film 18D may include the electric charges of the opposite conductive type to that of the diffusion region D. In this case as well, it is possible to produce equivalent effects to those of the forgoing first embodiment. Furthermore, owing to the coating film 18D, it is possible to reduce the dark currents more effectively.

The coating film 18D may be provided together with the electrical charge collection layer 21 (FIG. 16), the barrier alleviation layer 22 (FIG. 17), or the second semiconductor layer 13C (FIG. 18).

Modification Example 5

Figure 20:
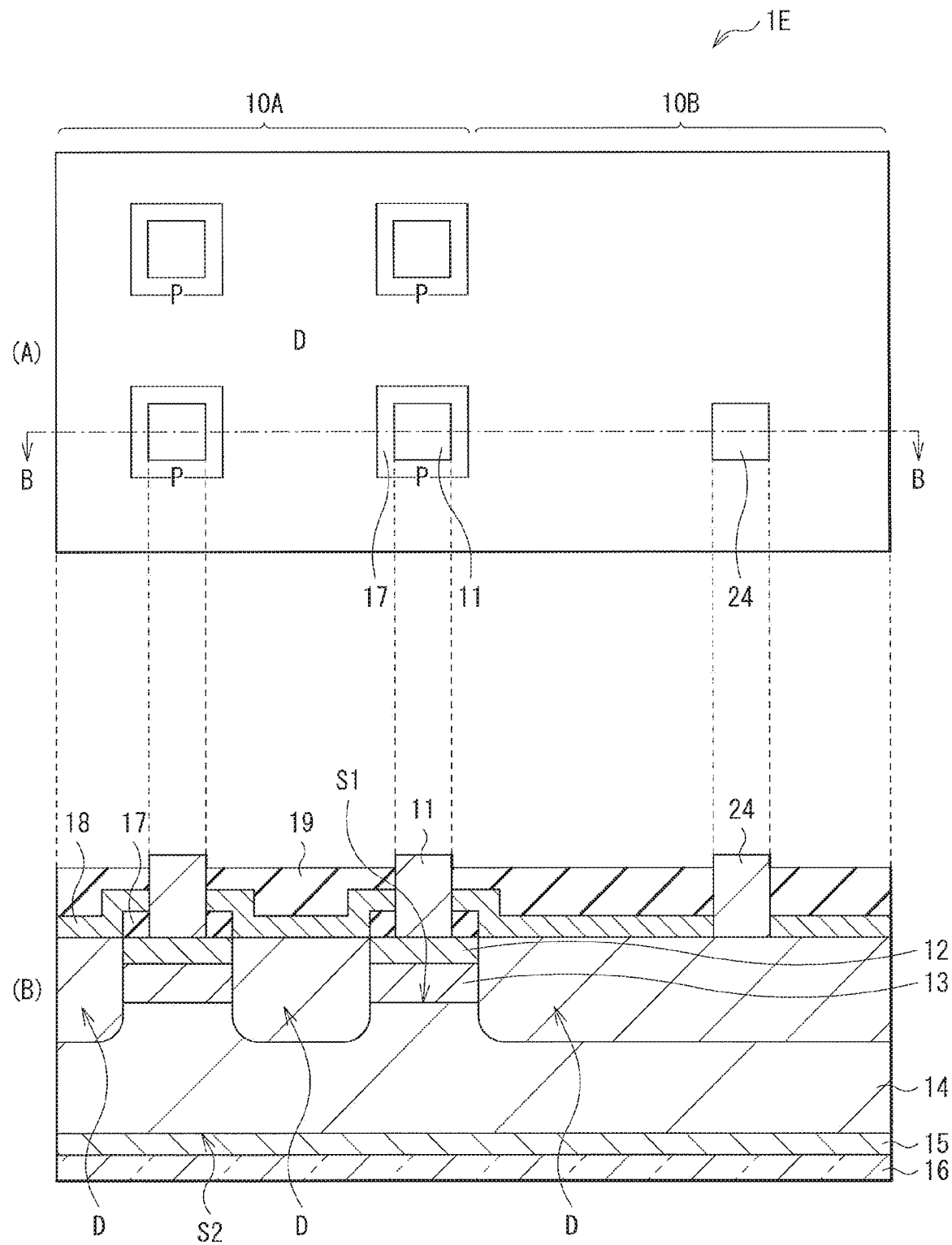
FIG. 20, part (A) is a schematic plan view illustrating a portion of a configuration in outline of an imaging device according to a modification example 5, and part (B) is a schematic cross-sectional view thereof.

FIG. 20 illustrates a schematic configuration of a portion of an imaging device (an imaging device 1E) according to a modification example 5. Part (A) of FIG. 20 illustrates a schematic plan configuration of the portion of the imaging device 1E. Part (B) of FIG. 20 illustrates a cross-sectional configuration taken along a line B-B illustrated in part (A) of FIG. 20. The imaging device TE includes a third electrode (a third electrode 24) electrically coupled to the diffusion region D. Otherwise, the imaging device 1F has a configuration and effects similar to those of the imaging device 1.

The imaging device 1E includes a pixel region 10A and a peripheral region 10B outside the pixel region 10A. In the pixel region 10A, the plurality of the pixels P are provided. The diffusion region D extends continuously from the pixel region 10A to the peripheral region 10B. The third electrode 24 is provided, for example, in the peripheral region 10B, and is electrically coupled to the diffusion region D. The third electrode 24 is in contact with the first semiconductor layer 12. The third electrode 24 is level with, for example, the first electrode 11. Providing the third electrode 24 that is able to apply a voltage to the diffusion region D makes it possible to reduce the dark currents more effectively. The forgoing is described below.

For example, between the n-type first semiconductor layer 12 and the p-type diffusion region D, the p-n junction is formed. It is therefore likely that the depletion layer is formed. Applying the voltage that forms a reverse bias condition, to the diffusion region D through the third electrode 24 makes it possible to control volume of the depletion layer. Hence, it is possible to reduce the occurrence of the dark currents caused by the depletion layer.

As in the present modification example, the third electrode 24 for the voltage application to the diffusion region D may be provided. In this case as well, it is possible to produce equivalent effects to those of the forgoing first embodiment. Furthermore, applying the voltage that forms the reverse bias condition, to the diffusion region D through the third electrode 24 makes it possible to reduce the dark currents more effectively.

The third electrode 24 may be provided together with the electrical charge collection layer 21 (FIG. 16), the barrier alleviation layer 22 (FIG. 17), the second semiconductor layer 13C (FIG. 18), or the coating film 18D (FIG. 19).

Modification Example 6

Figure 21:
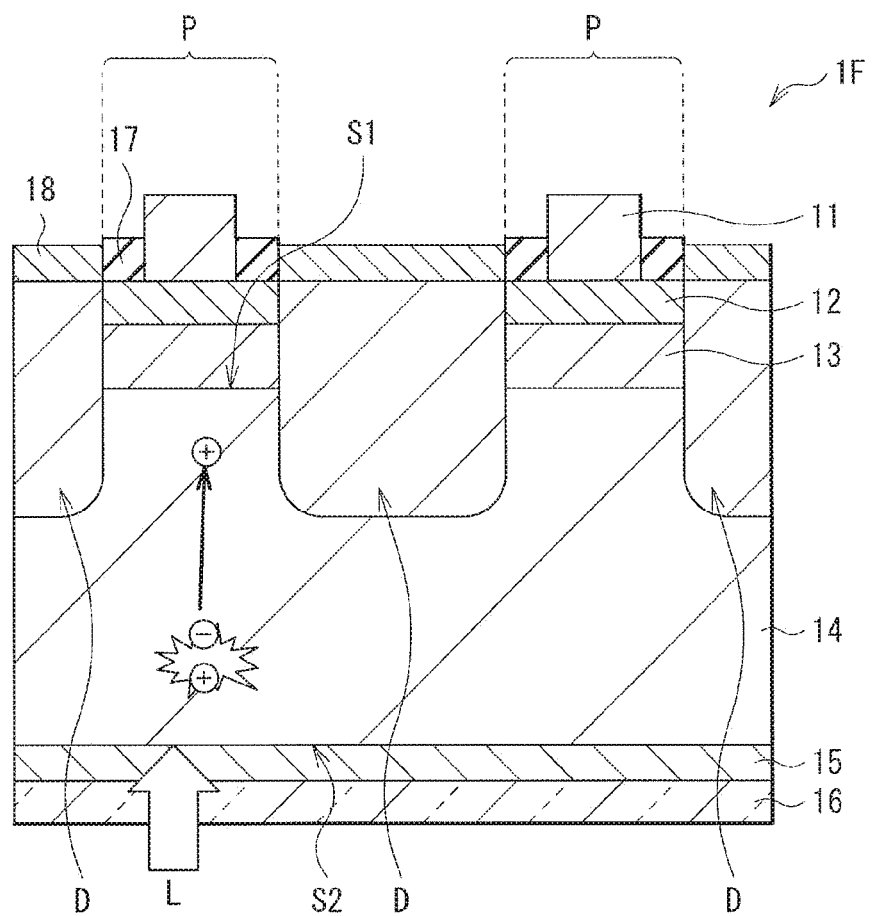
FIG. 21 is a schematic cross-sectional view illustrating a configuration in outline of an imaging device according to a modification example 6.

FIG. 21 illustrates a schematic cross-sectional configuration of an imaging device (an imaging device 1F) according to a modification example 6. In the imaging device 1F, the holes generated in the light absorption layer 14 are read out as the signal charges. Otherwise, the imaging device 1F has a configuration and effects similar to those of the imaging device 1.

In the imaging device 1F, for example, the first semiconductor layer 12 includes p-type InP. The second semiconductor layer 13 includes n-type InP. The light absorption layer 14 includes n-type InGaAs. The contact layer 15 includes n-type InP. In the diffusion region D, the n-type impurity such as germanium (Ge) is diffused. In the imaging device 1F as described, upon the light L entering the light absorption layer 14 through the second electrode 16 and the contact layer 15, the holes generated in the light absorption layer 14 are read out as the signal charges to the first electrode 11.

As in the present modification example, the holes may be read out as the signal charges. In this case as well, it is possible to produce equivalent effects to those of the forgoing first embodiment.

Second Embodiment

Figure 22:
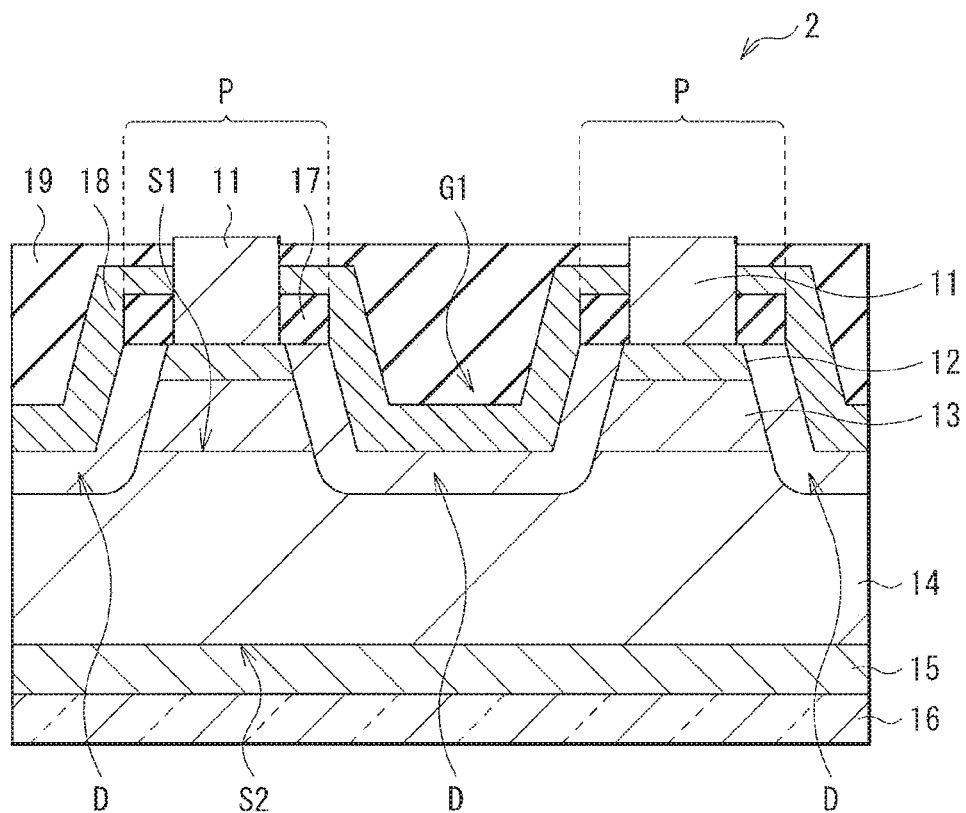
FIG. 22 is a schematic cross-sectional view illustrating a configuration in outline of an imaging device according to a second embodiment of the present disclosure.

FIG. 22 schematically illustrates a cross-sectional configuration of an imaging device (an imaging device 2) according to a second embodiment. In the imaging device 2, the first semiconductor layer 12 and the second semiconductor layer 13 have a groove (a groove G1 or a first groove). Thus, the first semiconductor layer 12 and the second semiconductor layer 13 are separated for each of the pixels P. Otherwise, the imaging device 2 has a configuration similar to that of the imaging device 1, and the same applies to workings and effects thereof.

The groove G1 is disposed between the adjacent ones of the pixels P, and is provided, for example, in a lattice shape in plan view. The groove G1 has, for example, a tapered shape, and extends to the first surface S1 of the light absorption layer 14. The diffusion region D is provided, for example, near a sidewall of the groove G1 (sidewalls of the first semiconductor layer 12 and the second semiconductor layer 13) and near a bottom of the groove G1 (near the first surface S1 of the light absorption layer 14).

Figure 23A:
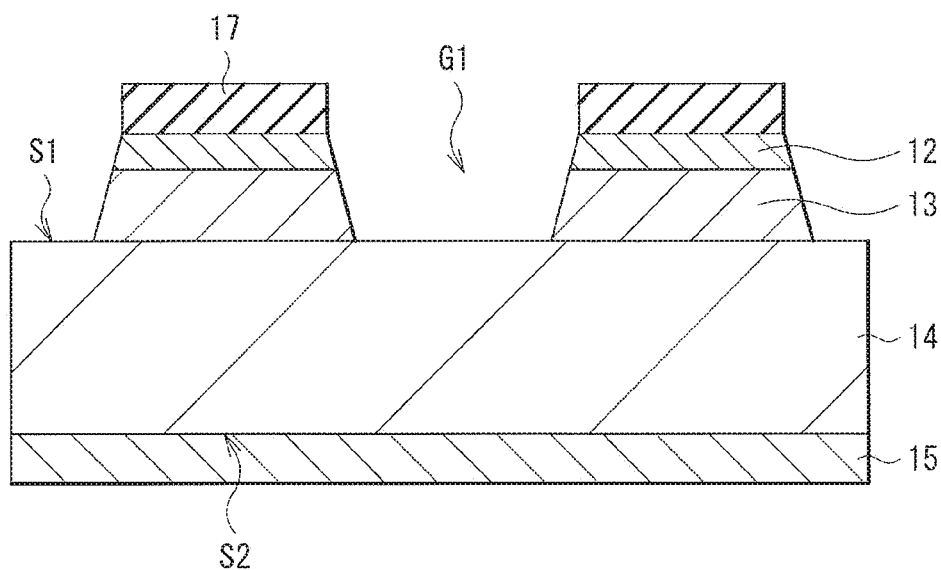
FIG. 23A is a schematic cross-sectional view illustrating a process of a method of manufacturing the imaging device of the imaging device illustrated in FIG. 22.
Figure 23B:
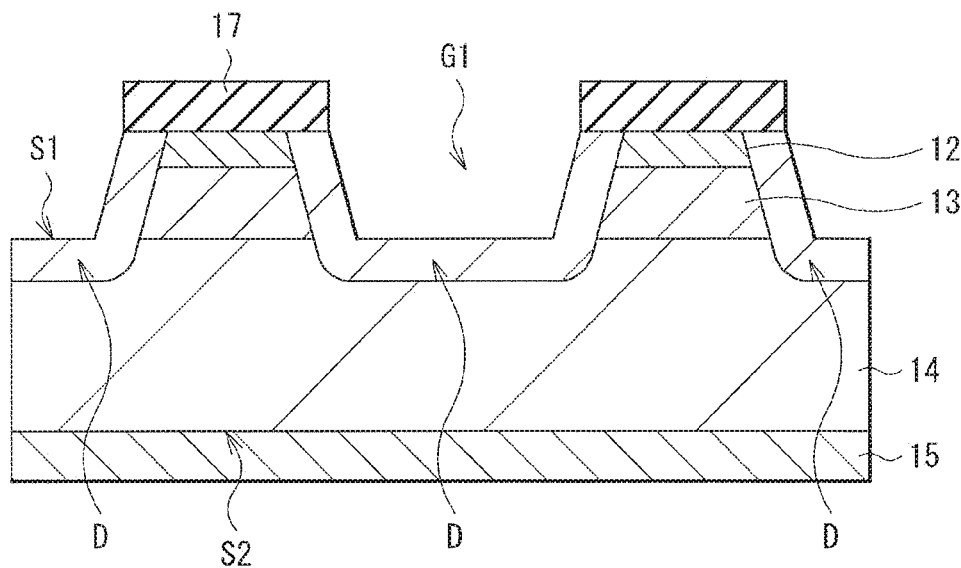
FIG. 23B is a schematic cross-sectional view illustrating a process subsequent to FIG. 23A.

The imaging device 2 as described is manufactured in the following example manner (FIGS. 23A and 23B).

First, in a similar manner to the description of the forgoing first embodiment, the stacked body is formed. The stacked body includes the contact layer 15, the light absorption layer 14, the second semiconductor layer 13, and the first semiconductor layer 12. The deposition of the insulating film 17 (FIG. 4B) and the selective removal of the insulating film 17 (FIG. 4C) are carried out.

Thereafter, as illustrated in FIG. 23A, with the insulating film 17 formed in a selective region serving as a mask, the first semiconductor layer 12 and the second semiconductor layer 13 are etched. Thus, the groove G1 is formed. For the etching, used is, for example, the dry etching or the wet etching. The groove G1 may be formed T1 the use of both the dry etching and the wet etching.

After forming the groove G1, as illustrated in FIG. 23B, the diffusion region D is formed. The diffusion region D is formed, for example, by diffusing the p-type impurity such as zinc (Zn) from the groove G1. The diffusion of the impurity is carried out by, for example, the vapor phase diffusion or the solid phase diffusion. Here, in the present embodiment, because the groove G1 is formed, the impurity diffuses to an even closer position to the second surface S2 of the light absorption layer 14, as compared to the case devoid of the groove G1 (FIG. 5A). In other words, the diffusion region D is formed to the even closer position to the second surface S2 of the light absorption layer 14. This is because the impurity diffuses isotropically in an in-plane direction and a thickness direction of the light absorption layer 14. Because a width of the diffusion region D in the in-plane direction of the light absorption layer 14 is defined by a distance between the adjacent ones of the pixels P, the impurity diffuses more deeply in the thickness direction of the light absorption layer 14, in the groove G1 devoid of the first semiconductor layer 12 and the second semiconductor layer 13. Hence, it is possible to restrain the migration of the signal charges between the adjacent ones of the pixels P more effectively.

After forming the diffusion region D, in a similar manner to the description of the forgoing first embodiment, the coating film 18, the protection film 19, the first electrode 11, and the second electrode 16 are formed. Thus, the imaging device 2 is completed.

In the imaging device 2 according to the present embodiment as well, as with the forgoing imaging device 1, the adjacent ones of the pixels P are electrically separated by the diffusion region D. This makes it possible to restrain the migration of the signal charges between the adjacent ones of the pixels P. Moreover, the depletion layer K is formed near between the semiconductor layers having the bandgap energy larger than the bandgap energy of the light absorption layer 14 (between the first semiconductor layer 12 and the second semiconductor layer 13). This makes it possible to reduce the dark currents. Furthermore, the groove G1 is formed in the first semiconductor layer 12 and the second semiconductor layer 13. This makes it possible to form the diffusion region D to the even closer position to the second surface S2 of the light absorption layer 14. Hence, it is possible to restrain the migration of the signal charges between the adjacent ones of the pixels P more effectively.

The imaging device 2 may further include the electrical charge collection layer 21 (FIG. 16), the barrier alleviation layer 22 (FIG. 17), the second semiconductor layer 13C (FIG. 18), the coating film (FIG. 19), or the third electrode 24 (FIG. 20).

Modification Example 7

Figure 24:
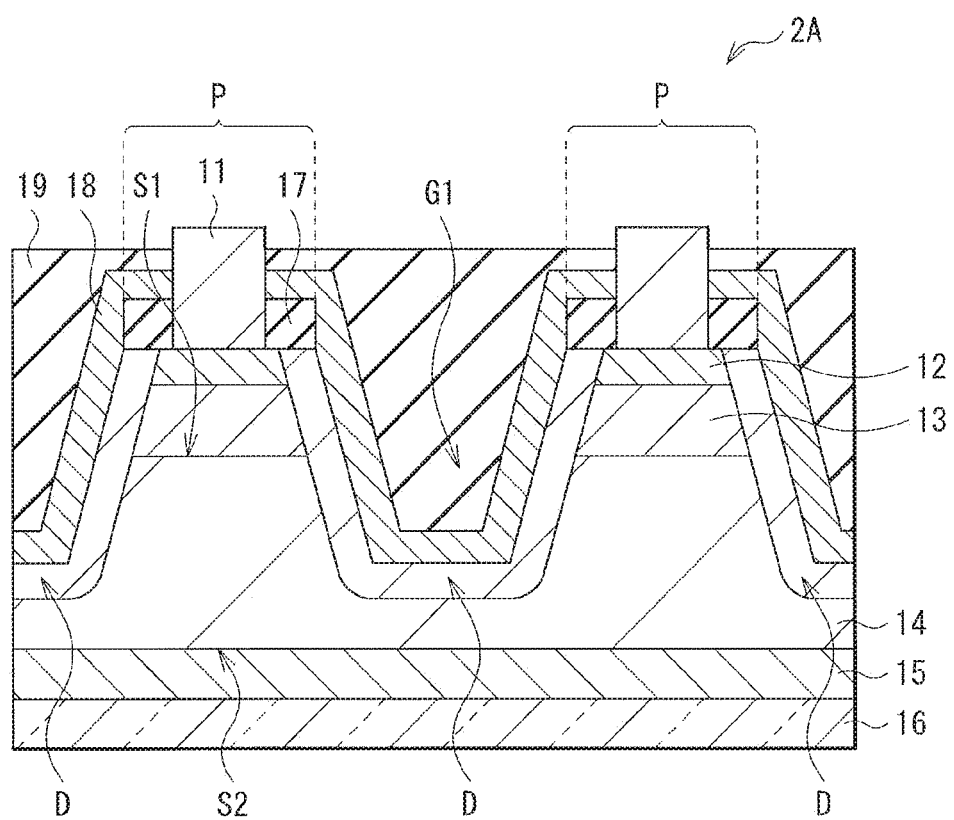
FIG. 24 is a schematic cross-sectional view illustrating a configuration in outline of an imaging device according to a modification example 7.

FIG. 24 illustrates a schematic cross-sectional configuration of an imaging device (an imaging device 2A) according to a modification example 7. In the imaging device 2A, the groove G1 is formed inside the light absorption layer 14 as well. Otherwise, the imaging device 2A has a configuration and effects similar to those of the imaging device 2.

The groove G1 may separate the first semiconductor layer 12 and the second semiconductor layer 13 for each of the pixels P, and extend to inside the light absorption layer 14. In this case as well, it is possible to produce equivalent effects to those of the forgoing second embodiment.

Figure 25:
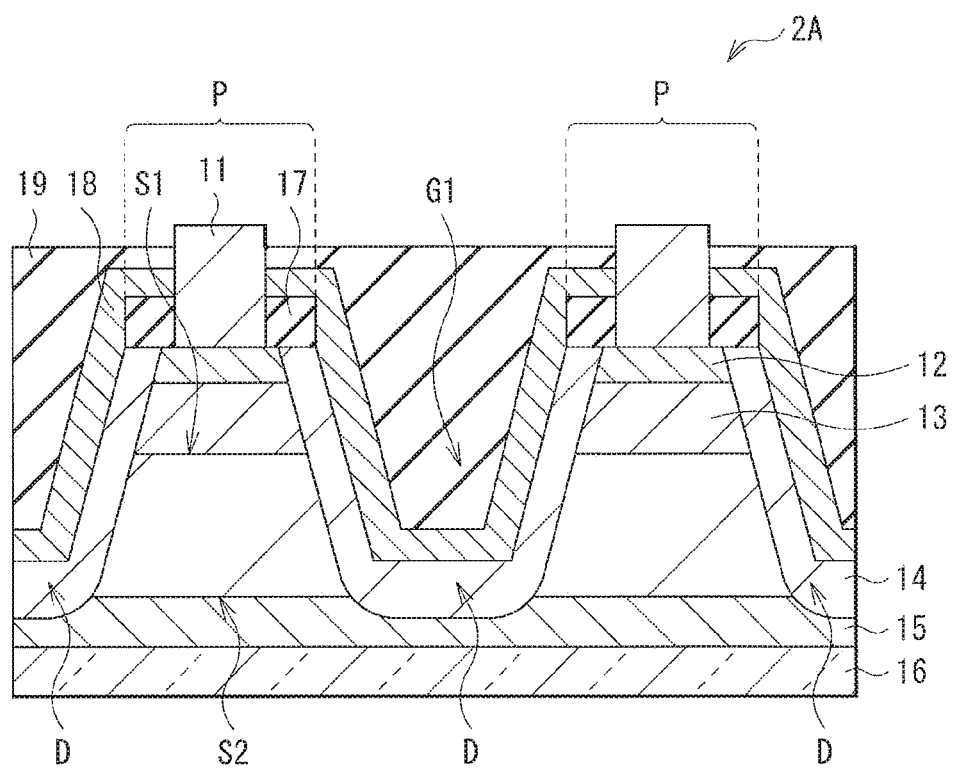
FIG. 25 is a schematic cross-sectional view illustrating another example of the imaging device illustrated in FIG. 24.

The diffusion region D does not have to reach the second surface S2 of the light absorption layer 14 (FIG. 24). Alternatively, as illustrated in FIG. 25, the diffusion region D may extend beyond the second surface S2 of the light absorption layer 14, and be provided in the contact layer 15.

Modification Example 8

Figure 26:
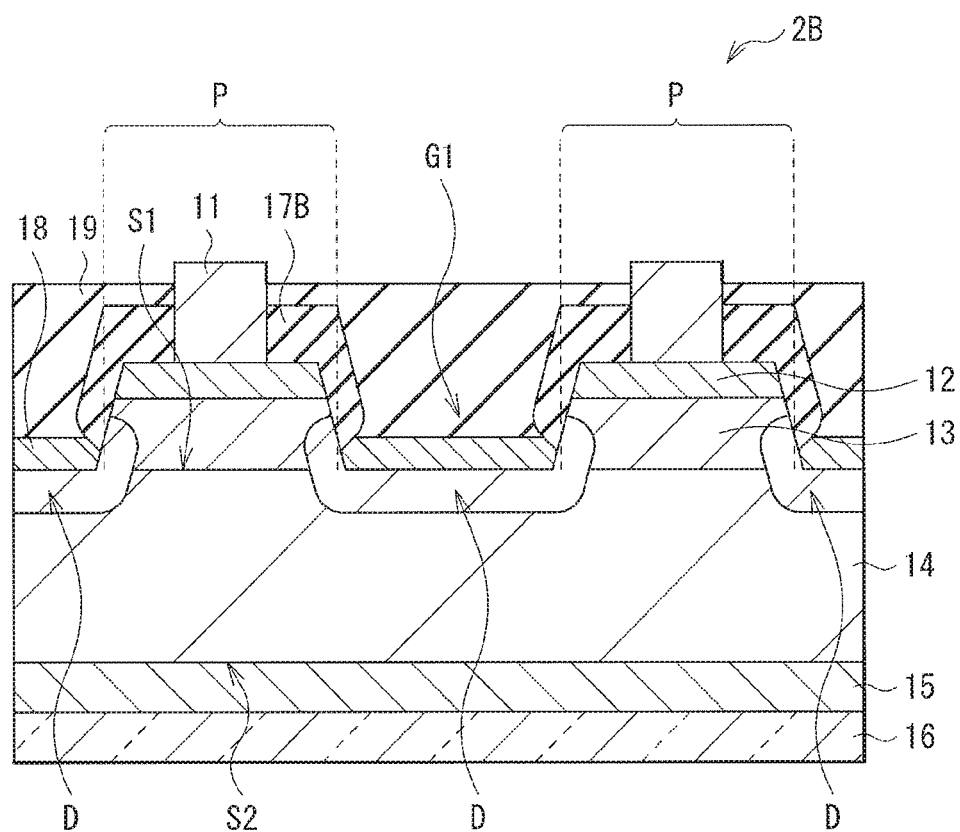
FIG. 26 is a schematic cross-sectional view illustrating a configuration in outline of an imaging device according to a modification example 8.

FIG. 26 illustrates a schematic cross-sectional configuration of an imaging device (an imaging device 2B) according to a modification example 8. An insulating film (an insulating film 17B) of the imaging device 2B covers a portion of the sidewall of the groove G1. Otherwise, the imaging device 2B has a configuration and effects similar to those of the imaging device 2.

The insulating film 17B is provided from the front surface of the first semiconductor layer 12 to the sidewall of the groove G1. It is preferable that the insulating film 17B cover an entirety of the sidewall of the first semiconductor layer 12, and extend to a portion of the sidewall of the second semiconductor layer 13. Forming the diffusion region D after forming the insulating film 17B as described above keeps the diffusion region D from being formed in the first semiconductor layer 12. In other words, the diffusion region D is formed from the sidewall of the second semiconductor layer 13 to the light absorption layer 14. Accordingly, no p-n junction is formed between the first semiconductor layer 12 and the diffusion region D. Therefore, the depletion layer is less likely to be formed, and the occurrence of the dark currents is restrained.

Figure 27:
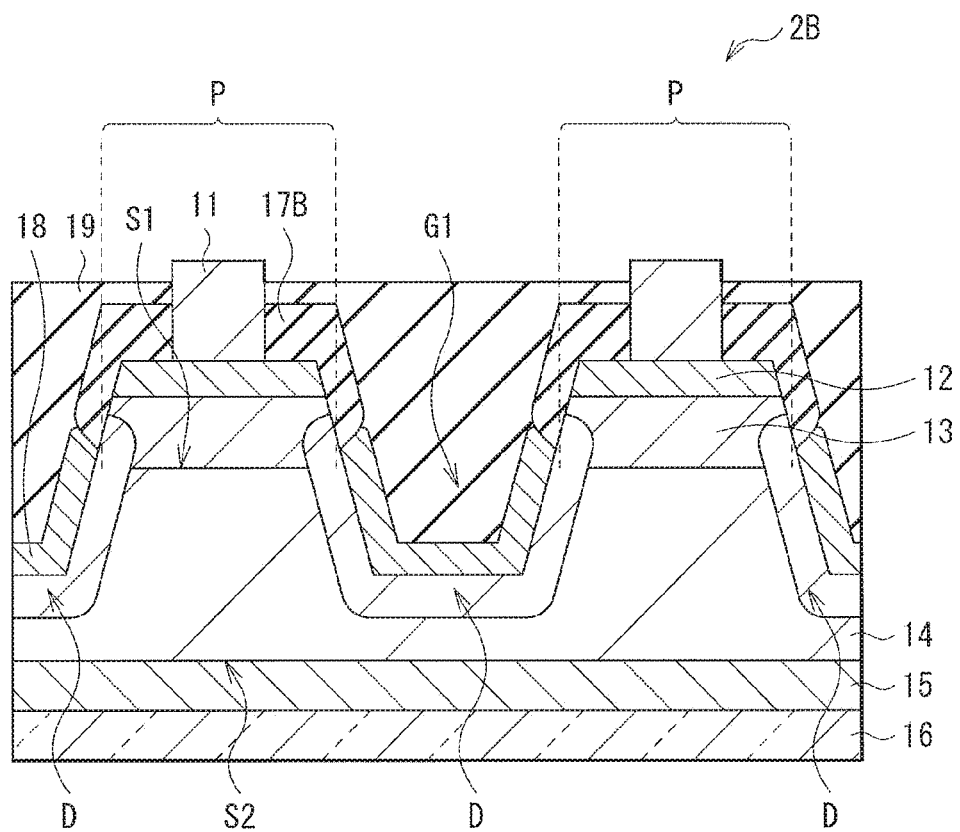
FIG. 27 is a schematic cross-sectional view illustrating, another example (1) of the imaging device illustrated in FIG. 26.
Figure 28:
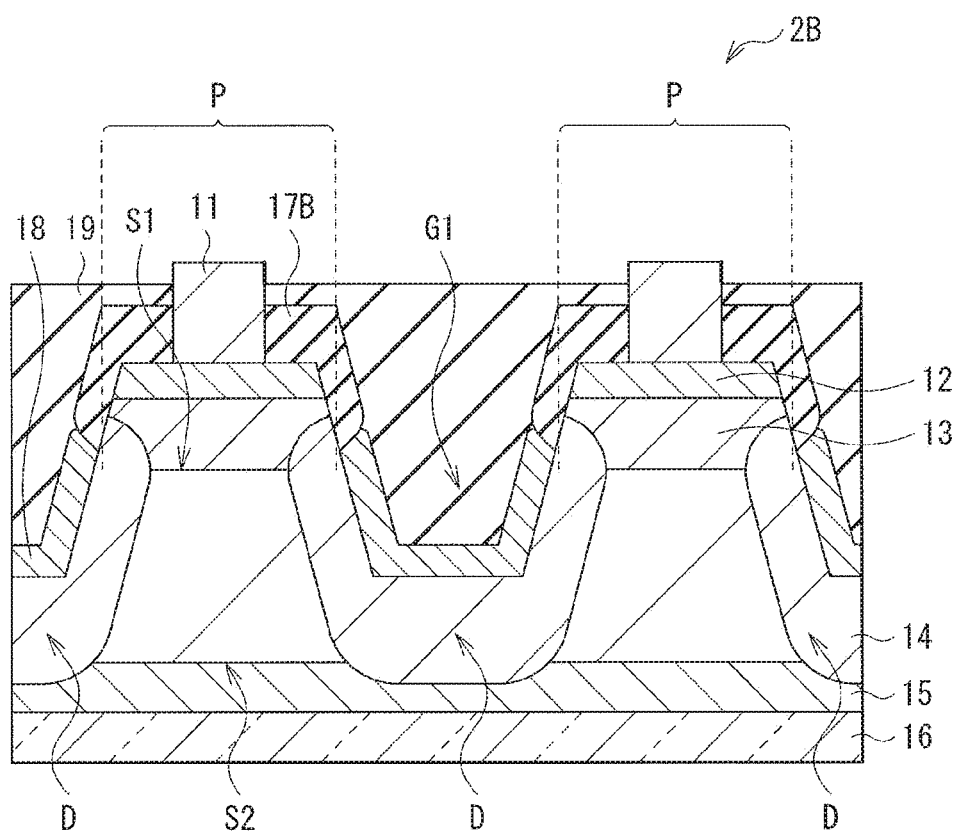
FIG. 28 is a schematic cross-sectional view illustrating another example (2) of the imaging device illustrated in FIG. 26.

As illustrated in FIGS. 27 and 28, the groove G1 of the imaging device 2B may be formed inside the light absorption layer 14 (FIG. 27), or alternatively, the diffusion region D of the imaging device 2B may extend beyond the second surface S2 of the light absorption layer 14, and be provided in the contact layer 15 (FIG. 28).

As in the present modification example, the insulating film 17B may cover a region from the front surface of the first semiconductor layer 12 to the portion of the sidewall of the groove G1 In this case as well, it is possible to produce equivalent effects to those of the forgoing second embodiment. Moreover, it is possible to reduce the dark currents more effectively, without providing the diffusion region D in the first semiconductor layer 12.

Modification Example 9

Figure 29:
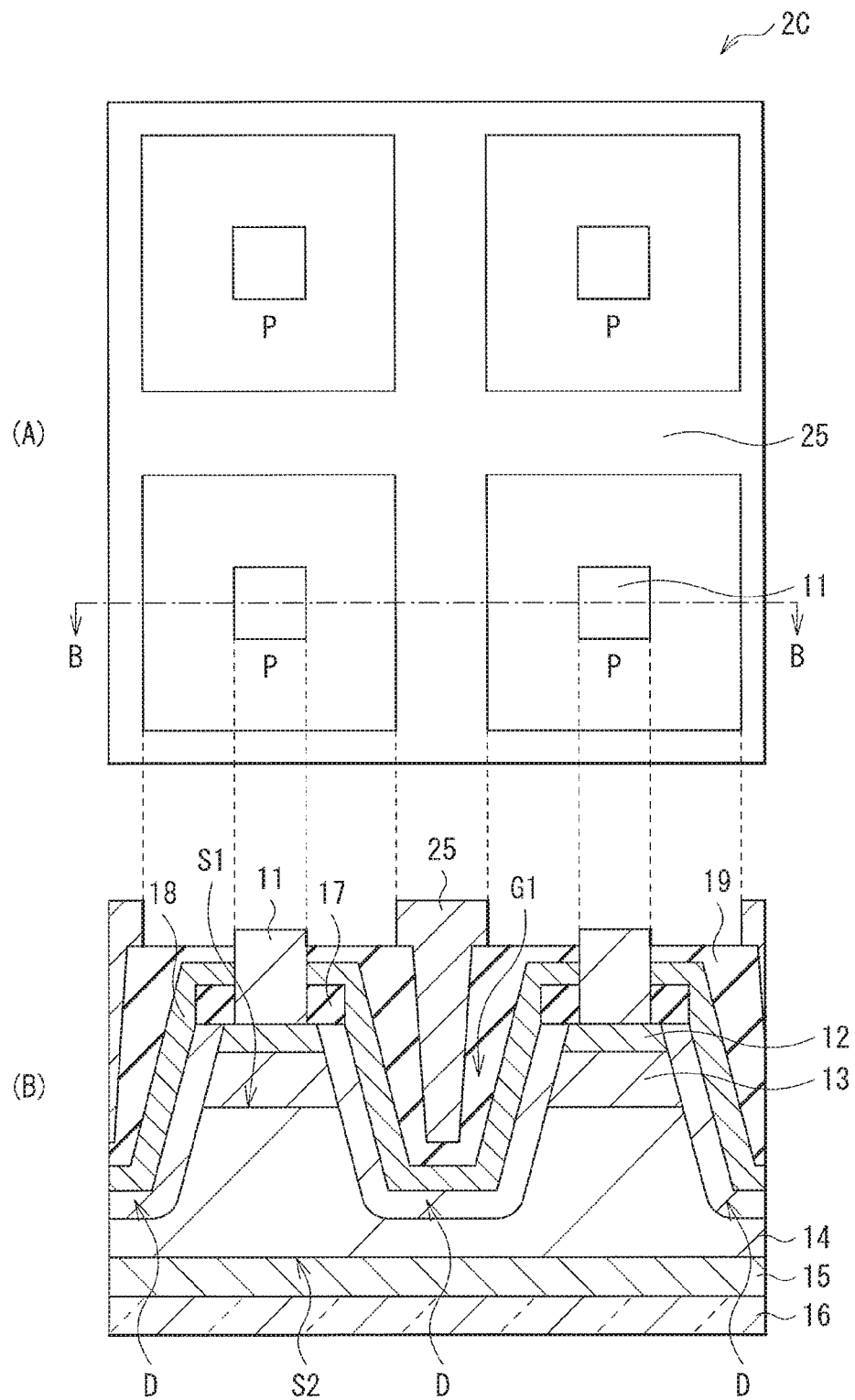
FIG. 29, part (A) is a schematic plan view illustrating a configuration in outline of an imaging device according to a modification example 9, and part (B) is a schematic cross-sectional view thereof.

FIG. 29 illustrates a schematic configuration of an imaging device (an imaging device 2C) according to a modification example 9. Part (A) of FIG. 29 illustrates a schematic plan configuration of the imaging device 2C, while part (B) Of FIG. 29 illustrates a cross-sectional configuration taken along a line B-B illustrated in part (A) of FIG. 29. The imaging device 2C includes a light-shielding member (a light-shielding member 25) fitted into the groove G1. Otherwise, the imaging device 2C has a configuration and effects similar to those of the imaging device 2.

The light-shielding member 25 is provided, for example, in a lattice shape in plan view, and is fitted into the groove G1 from the front surface of the protection film 19. The light-shielding member 25 optically separates the adjacent ones of the pixels P. For example, owing to the light-shielding member 25, it is possible to prevent obliquely-entering light from intruding into the adjacent pixel P.

For the light-shielding member 25, used may be, for example, a material having low transmittance with respect to the light of the wavelength of the infrared region and the visible region. For example, the light-shielding member 25 includes a metal material having transmittance of 10% or less with respect to light of a wavelength of 1 μm, Specifically, for the light-shielding member 25, used may be, for example, any simple substance of titanium (Ti), tungsten (W), titanium nitride (TiN), platinum (Pt), gold (Au), copper (Cu), germanium (Ge), palladium (Pd), zinc (Zn), nickel (Ni), indium (In), or aluminum (Al), or an alloy including at least one kind thereof.

As in the present modification example, the light-shielding member 25 may be provided in the groove G1. In this case as well, it is possible to produce equivalent effects to those of the forgoing second embodiment. Moreover, the diffusion region D allows for the electrical separation of the adjacent ones of the pixels P, and the light-shielding member 25 allows for the optical separation of the adjacent ones of the pixels P. Hence, it is possible to restrain the occurrence of the crosstalk between the pixels P more effectively.

Third Embodiment

Figure 30:
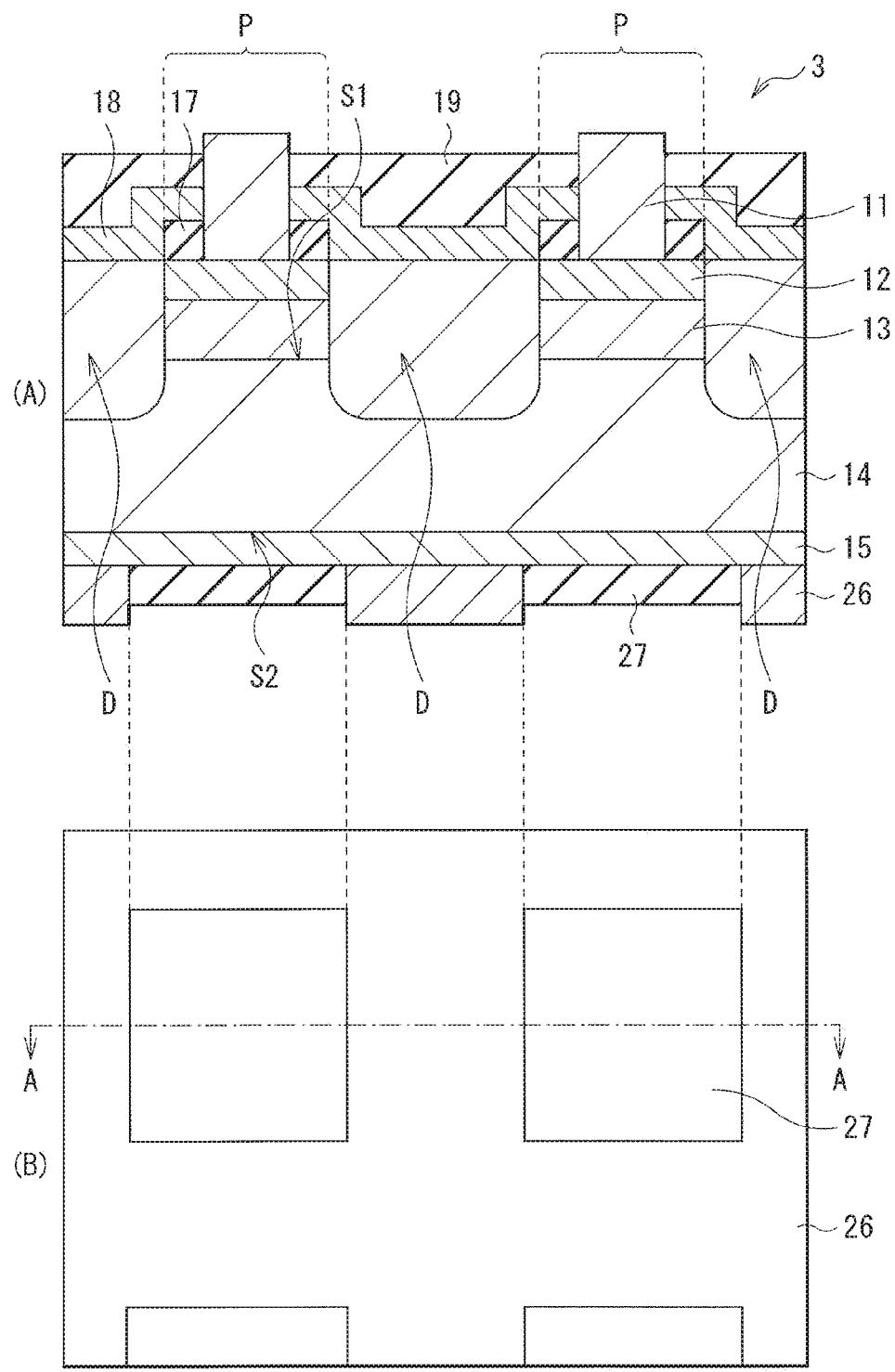
FIG. 30, part (A) is a schematic cross-sectional view illustrating a configuration in outline of an imaging device according to a third embodiment of the present disclosure, and part (B) is a schematic plan view thereof.

FIG. 30 schematically illustrates a configuration of an imaging device (an imaging device 3) according to a third embodiment. Part (A) of FIG. 30 illustrates a schematic cross-sectional configuration of the imaging device 3, while part (B) of FIG. 30 illustrates a schematic plan configuration of the imaging device 3, Part (A) of FIG. 30 illustrates the cross-sectional configuration taken along a line A-A illustrated in part (B) of FIG. 30. A second electrode (a second electrode 26) of the imaging device 3 has a light-shielding property. Otherwise, the imaging device 3 has a configuration similar to that of the imaging device 1, and the same applies to workings and effects thereof.

The light-shielding second electrode 26 is disposed, for example, at a position superposed on the diffusion region D in plan view, and has a planar shape of a lattice. In other words, each of the pixels P is exposed from the second electrode 26. The second electrode 26 is electrically coupled to the light absorption layer 14 through the contact layer 15. Providing the light-shielding second electrode 26 as described above makes it possible to prevent, for example, the obliquely-entering light from intruding into the adjacent pixel P. This allows for the optical separation of the adjacent ones of the pixels P.

For the second electrode 26, used may be, for example, the material having the low transmittance with respect to the light of the wavelength of the infrared region and the visible region. For example, the second electrode 26 includes the metal material having the transmittance of 10% or less with respect to the light of the wavelength of 1 µm. Specifically, for the second electrode 26, used may be, for example, any simple substance of titanium (Ti), tungsten (W), titanium nitride (TiN), platinum (Pt), gold (Au), copper (Cu), germanium (Ge), palladium (Pd), zinc (Zn), nickel (Ni), indium (In), or aluminum (Al), or an alloy including at least one kind thereof.

An insulating film 27 is provided on a front surface of the contact layer 15 exposed from the second electrode 26. In other words, in each of the pixels P, disposed is the insulating film 27 having a same planar shape as a planar shape of the pixel P. The planar shape of the insulating film 27 disposed in each of the pixels P is, for example, a rectangular shape.

Examples of a constituent material of the insulating film 27 includes an insulating material including at least one of silicon (Si), nitrogen (N), aluminum (Al), hafnium (Hf), tantalum (Ta), titanium (Ti), magnesium (Mg), scandium (Sc), zirconium (Zr), oxygen (O), lanthanum (La), gadolinium (Gd), or yttrium (Y). Specifically, the insulating film 27 includes, for example, a silicon nitride (SiN) film. The insulating film 27 may include, for example, an aluminum oxide ($Al_2O_3$) film, a silicon oxide ($SiO_2$) film, a silicon oxynitride (SiON) film, an aluminum oxynitride (AlON) film, a silicon aluminum nitride (SLAIN) film, magnesium oxide (MgO), a silicon aluminum oxide (AlSiO) film, a hafnium oxide ($HfO_2$) film, a hafnium aluminum oxide (HfAlO) film, a tantalum oxide ($Ta_2O_3$) film, a titanium oxide ($TiO_2$) film, a scandium oxide ($Sc_2O_3$) film, a zirconium oxide ($ZrO_2$) film, a gadolinium oxide ($Gd_2O_3$) film, a lanthanum oxide ($La_2O_2$) film, or a yttrium oxide ($Y_2O_3$) film.

In the imaging device 3 according to the present embodiment as well, as with the forgoing imaging devices 1 and 2, the adjacent ones of the pixels P are electrically separated by the diffusion region D. This makes it possible to restrain the migration of the signal charges between the adjacent ones of the pixels P. Moreover, the depletion layer K is formed near between the semiconductor layers having the bandgap energy larger than the bandgap energy of the light absorption layer 14 (between the first semiconductor layer 12 and the second semiconductor layer 13). This snakes it possible to reduce the dark currents. Furthermore, the light-shielding second electrode 26 is provided. This makes it possible to optically separate the adjacent ones of the pixels P. Hence, it is possible to restrain the occurrence of the crosstalk between the pixels P more effectively.

The imaging device 3 may further include the electrical charge collection layer 21 (FIG. 16), the barrier alleviation layer 22 (FIG. 17), the second semiconductor layer 13C (FIG. 18), the coating film 18D (FIG. 19), or the third electrode 24 (FIG. 20).

Figure 31:
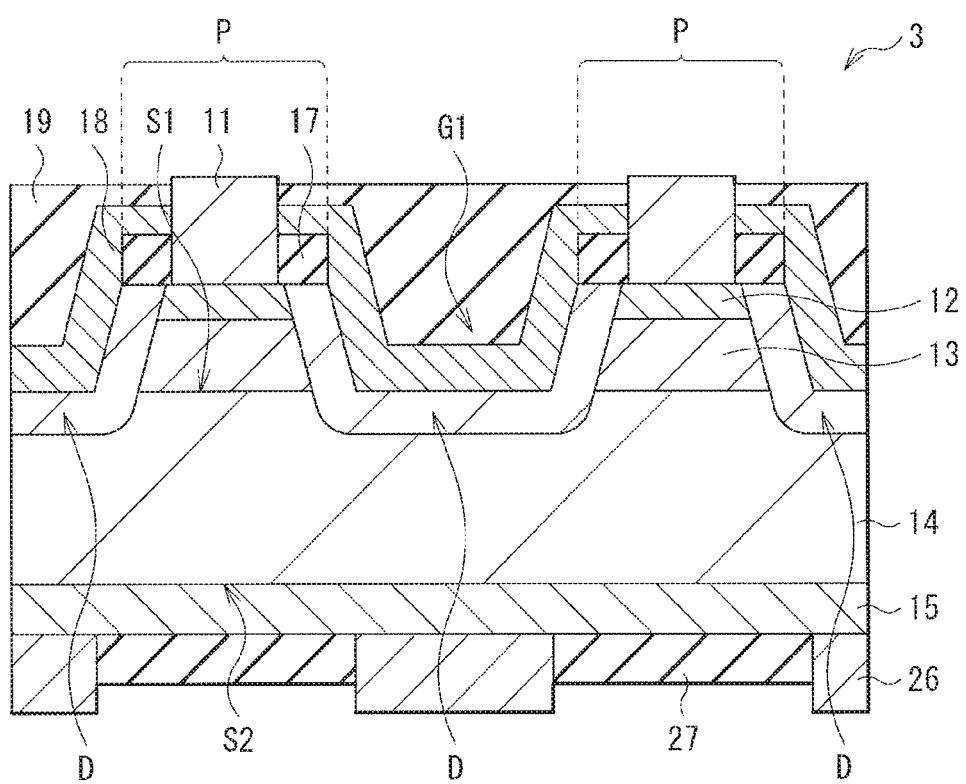
FIG. 31 is a schematic cross-sectional view illustrating another example of the imaging device illustrated in FIG. 30.

As illustrated in FIG. 31, the groove G1 may be formed in the first semiconductor layer 12 and the second semiconductor layer 13 of the imaging device 3.

Modification Example 10

Figure 32:
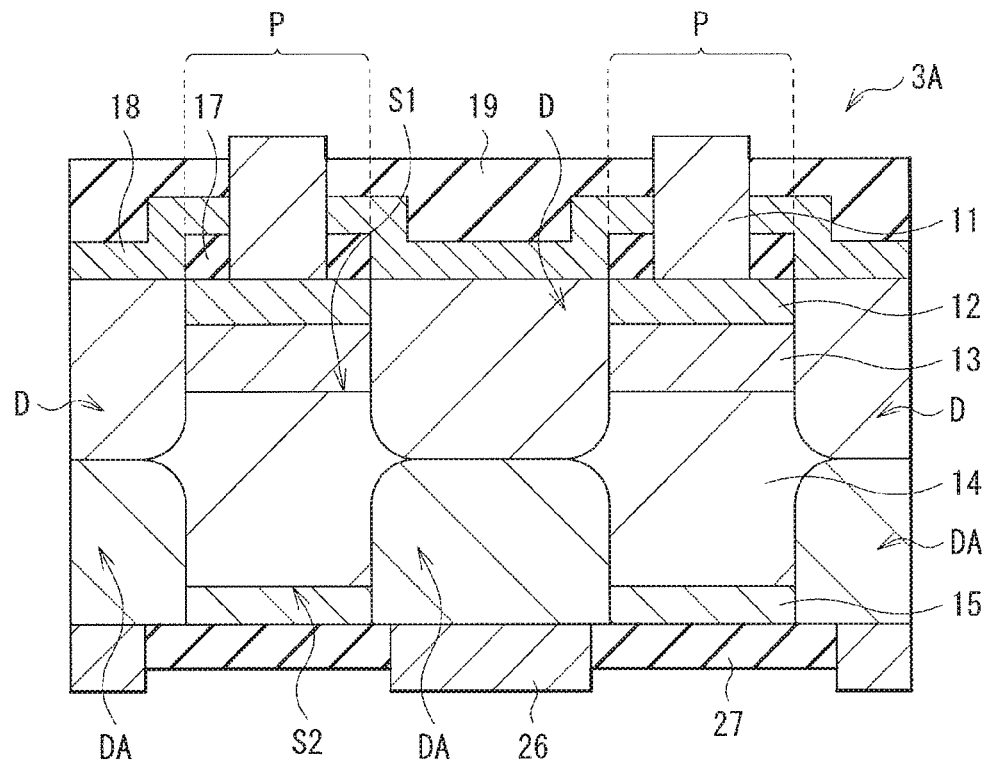
FIG. 32 is a schematic cross-sectional view illustrating a configuration in outline of an imaging device according to a modification example 10.

FIG. 32 illustrates a schematic cross-sectional configuration of an imaging device (an imaging device 3A) according to a modification example 10. In the imaging device 3A, a diffusion region (a diffusion region DA or a second diffusion region) is provided in the contact layer 15 and on side of the light absorption layer 14 on which the second surface S2 is disposed. Otherwise, the imaging device 3A has a configuration and effects similar to those of the imaging device 3.

The diffusion region DA is provided between the adjacent ones of the pixels P, and has a planar shape of a lattice. For example, a p-type impurity such as zinc (Zn) is diffused in the diffusion region DA. The diffusion region DA is disposed at a position superposed on the diffusion region D in plan view. Examples of the p-type impurities may include magnesium (Mg), cadmium (Cd), beryllium (Be), silicon (Si), germanium (Ge), carbon (C), tin (Sn), lead (Pb), sulfur (S), and tellurium Te). A doping density of the diffusion region DA is, for example, $1 \times 10^{16}$ $cm^{-3}$ to $1 \times 10^{19}$ $cm^{-3}$ both inclusive. The imaging device 3A includes not only the diffusion region D on the side of the light absorption layer 14 on which the first surface S1 is disposed, but also the diffusion region DA on the side of the light absorption layer 14 on which the second surface S2 is disposed. This makes it possible to restrain the migration of the signal charges between the adjacent ones of the pixels P more effectively.

Figure 33:
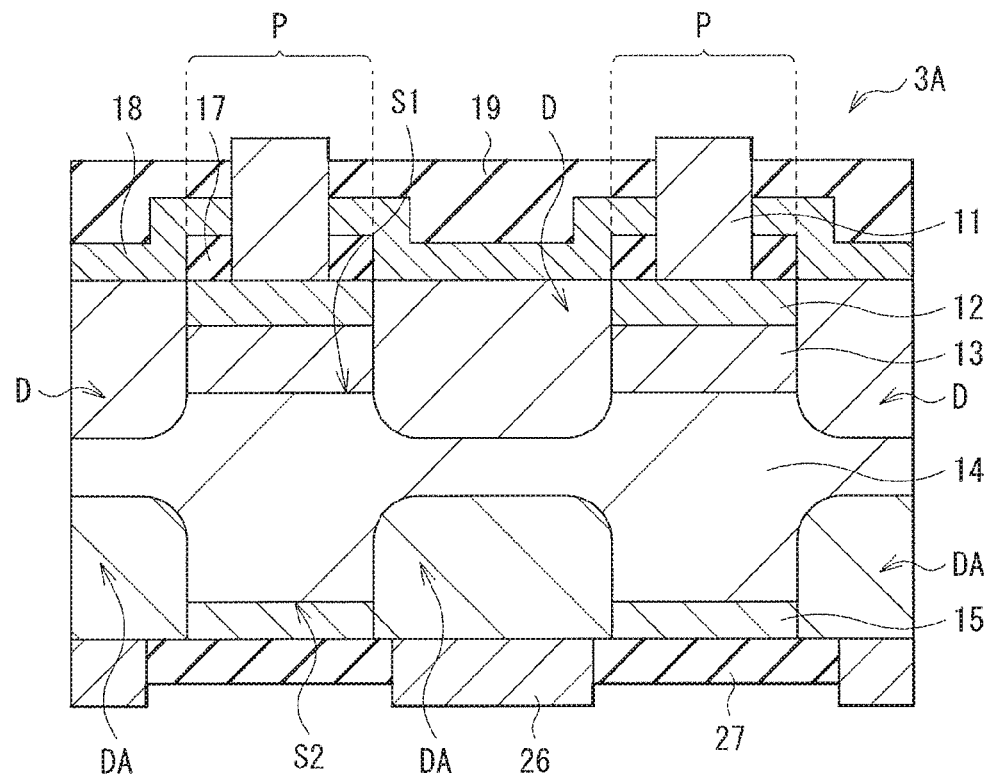
FIG. 33 is a schematic cross-sectional view illustrating another example of the imaging device illustrated in FIG. 32.

The diffusion region DA may be continuous with the diffusion region D (FIG. 32) or may be spaced apart from the diffusion region D, as illustrated in FIG. 33.

The diffusion region DA between the adjacent ones of the pixels P may be formed, with the use of, for example, the insulating film 27 as a mask, by selective vapor phase diffusion or solid phase diffusion of the impurity from the front surface of the contact layer 15.

As in the present modification example, the diffusion region DA may be provided on the side of the light absorption layer 14 on which the second surface S2 is disposed. In this case as well, it is possible to produce equivalent effects to those of the forgoing third embodiment. Moreover, in addition to the diffusion region D on the side of the light absorption layer 14 on which the first surface S1 is disposed, the diffusion region DA is provided on the side of the light absorption layer 14 on which the second surface S2 is disposed. Hence, it is possible to restrain the migration of the signal charges between the adjacent ones of the pixels P more effectively.

Modification Example 11

Figure 34:
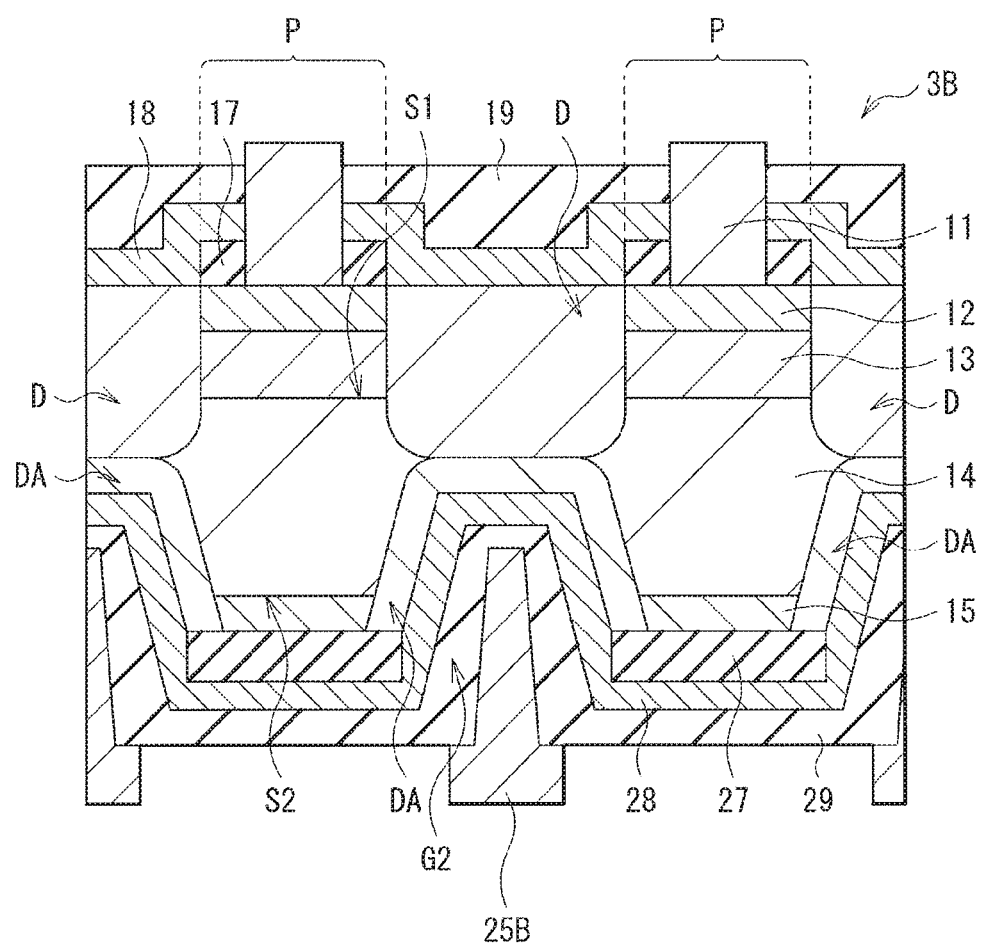
FIG. 34 is a schematic cross-sectional view illustrating a configuration in outline of an imaging device according to a modification example 11.

FIG. 34 illustrates a schematic cross-sectional configuration of an imaging device an imaging device 3B) according to a modification example 11. In the imaging device 3B, a groove (a groove G2 or a second groove) is formed between the adjacent insulating films 27. A light-shielding member (a light-shielding member 25B) is fitted into the groove G2. Otherwise, the imaging device 3B has a configuration and effects similar to those of the imaging device 3.

The groove G2 is disposed between the adjacent ones of the pixels P. and is provided in a lattice shape in plan view.

The groove G2 has, for example, a tapered shape. The groove G2 penetrates the contact layer 15, and extends through the second surface S2 to inside the light absorption layer 14. In other words, the contact layer 15 is separated for each of the pixels P by the groove G2. The diffusion region DA is provided, for example, near a sidewall of the groove G2 (sidewalls of the contact layer 15 and the light absorption layer 14) and near a bottom of the groove G2.

Figure 35:
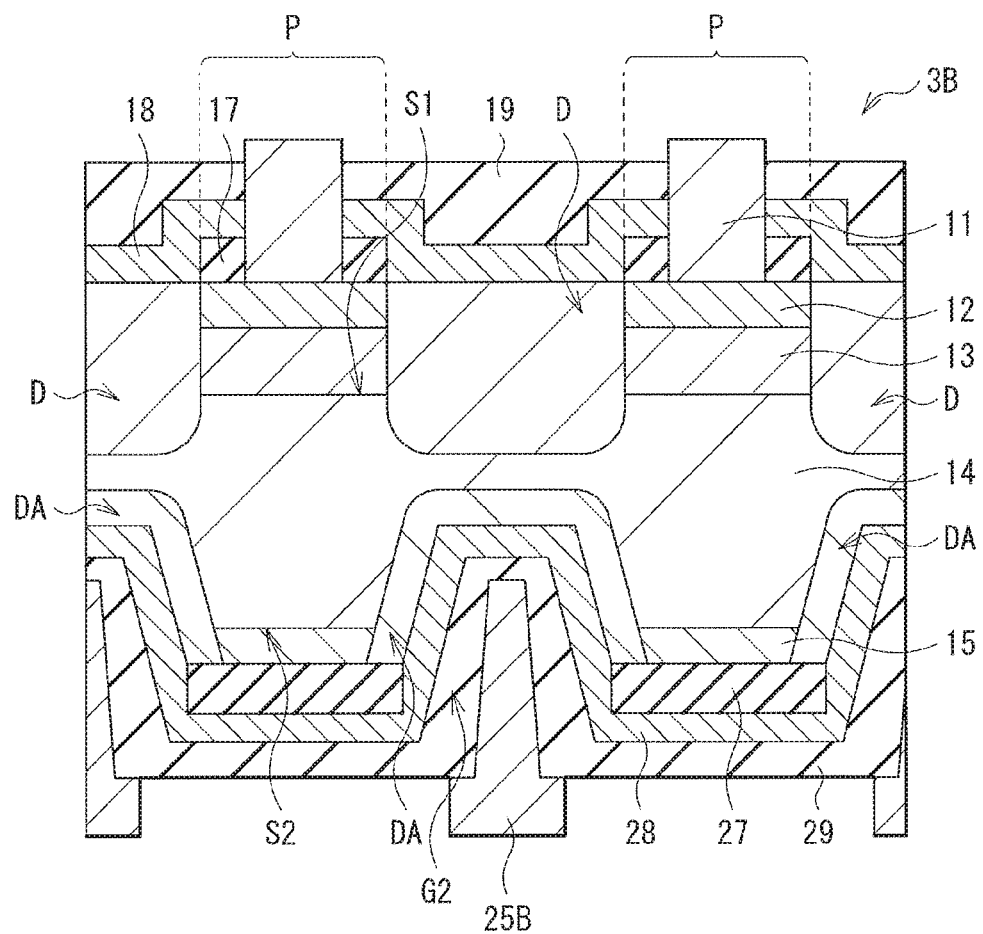
FIG. 35 is a schematic cross-sectional view illustrating another example (I) of the imaging device illustrated in FIG. 34.

The diffusion region DA may be continuous with the diffusion region D (FIG. 34) or may be spaced apart from the diffusion region D, as illustrated in FIG. 35. The diffusion region DA is formed, for example, after forming the groove G2, by diffusing an impurity from the groove G2. The diffusion region DA formed from the groove G2, as with the diffusion region D formed from the groove G1, is so formed as to extend to an even closer position to the first surface S1 of the light absorption layer 14. Hence, it is possible to restrain the migration of the signal charges between the adjacent ones of the pixels P more effectively.

The insulating film 27 and the groove (32 are covered with, for example, a coating film 28 and a protection film 29. For example, the coating film 28 and the protection film 29 are provided in this order, i.e., in the order of closeness of their positions to the insulating film 27. For the coating film 28, used may be, for example, a constituent material similar to that of the coating film 18. For the protection film 29, used may be, for example, a constituent material similar to that of the protection film 19. After forming the diffusion region DA, the coating film 28 and the protection film 29 are formed in this order.

The tight-shielding member 25B is provided, for example, in a lattice shape in plan view, and is fitted into the groove G2 from a front surface of the protection film 29. The light-shielding member 25B optically separates the adjacent ones of the pixels P. For example, owing to the light-shielding member 25B, it is possible to prevent the obliquely-entering light from intruding into the adjacent pixel P.

For the light-shielding member 25B, used may be, for example, the material having the low transmittance with respect to the light of the wavelength of the infrared region and the visible region. For example, the light-shielding member 25B includes the metal material having the transmittance of 10% or less with respect to the light of the wavelength of 1 µm. Specifically, for the light-shielding member 25B, used may be, for example, any simple substance of titanium (Ti), tungsten (W), titanium nitride (TiN), platinum (Pt), gold (Au), copper (Cu), germanium (Ge), palladium (Pd), zinc (Zn), nickel (Ni), indium (In), or aluminum (Al), or an alloy including at least one kind thereof.

The light-shielding member 25B is formed, for example, after forming the protection film 29, by depositing the light-shielding metal material in the groove G2, to fill the groove G2 with the light-shielding metal material.

As in the present modification example, the groove G2 may be provided on the side of the light absorption layer 14 on which the second surface S2 is disposed. The light-shielding member 25B may be fitted into the groove G2. In this case as well, it is possible to produce equivalent effects to those of the forgoing third embodiment. Moreover, owing to the groove G2, it is possible to restrain the migration of the signal charges between the adjacent ones of the pixels P more effectively. Furthermore, owing to the light-shielding member 25B, the adjacent ones of the pixels P are optically separated. Hence, it is possible to restrain the occurrence of the crosstalk between the pixels P more effectively.

Figure 36:
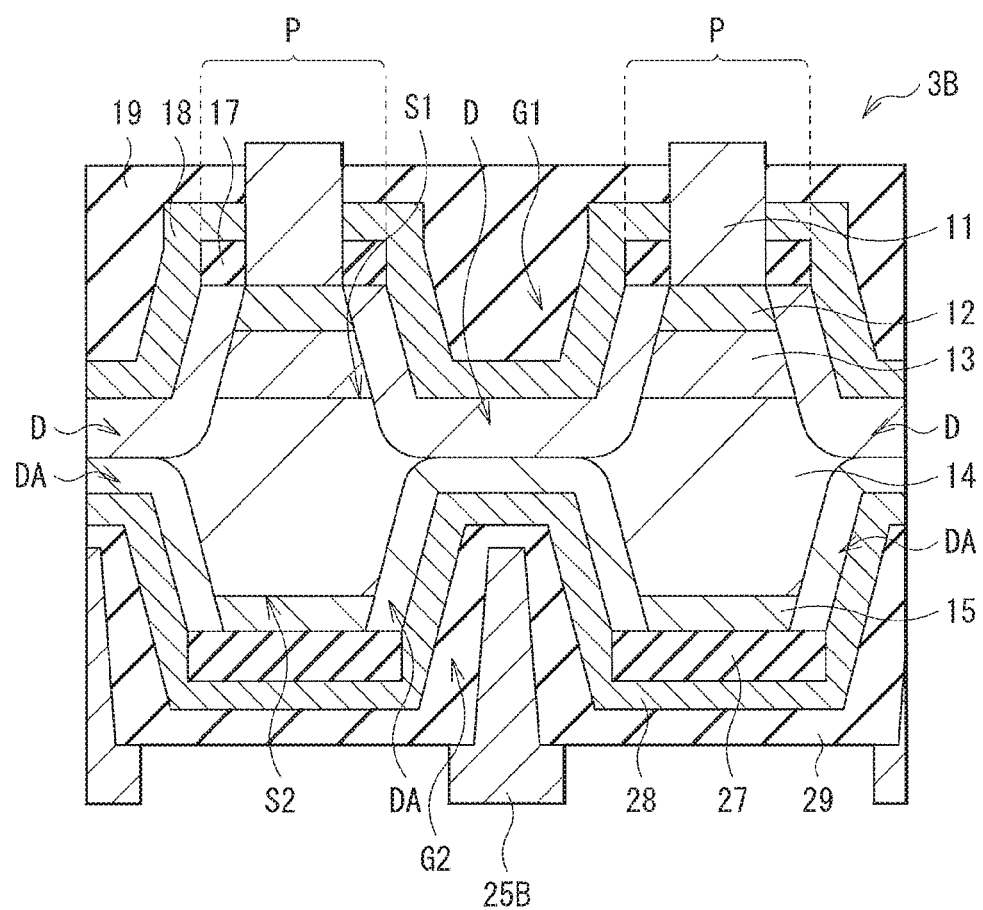
FIG. 36 is a schematic cross-sectional view illustrating another example (2) of the imaging device illustrated in FIG. 34.

As illustrated in FIG. 36, the groove G1 may be provided in the first semiconductor layer 12 and the second semiconductor layer 13 of the imaging device 3B.

Modification Example 12

Figure 37:
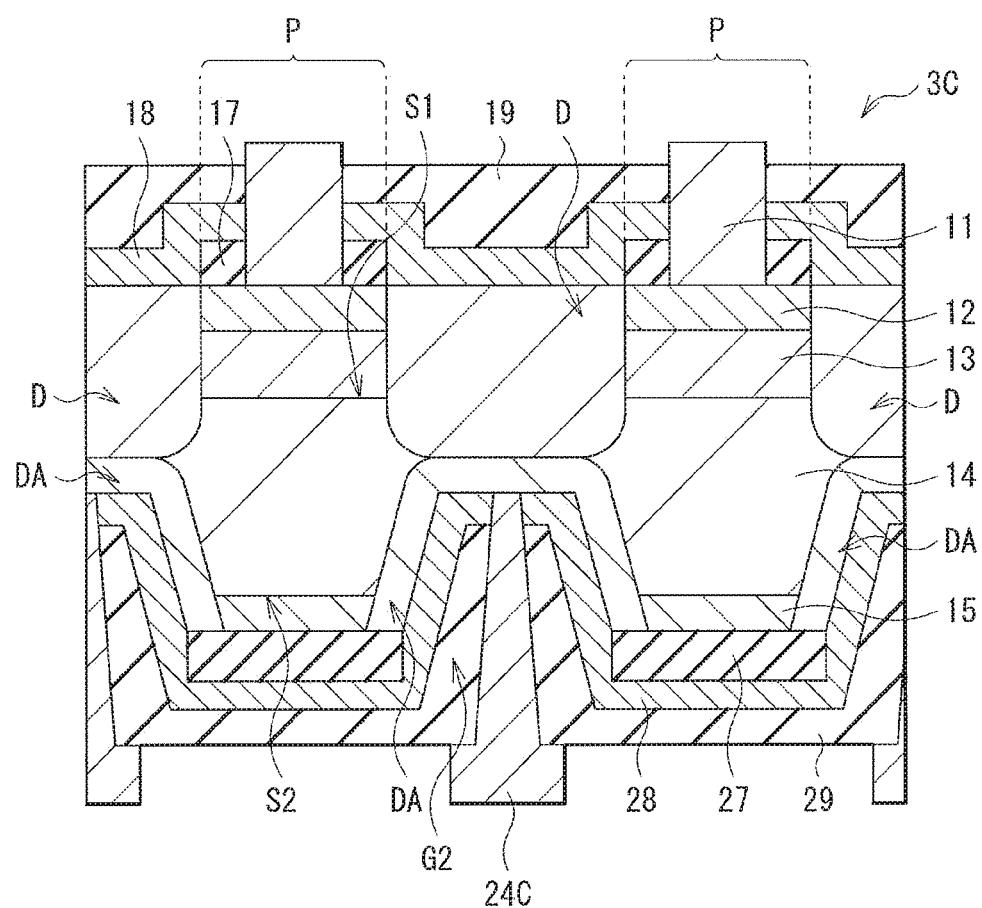
FIG. 37 is a schematic cross-sectional view illustrating a configuration in outline of an imaging device according to a modification example 12.

FIG. 37 illustrates a schematic cross-sectional configuration of an imaging device (an imaging device 3C) according to a modification example 12. The imaging device 3C includes a fourth electrode (a fourth electrode 24C), instead of the light-shielding member 25B of the forgoing imaging device 3B. Otherwise, the imaging device 3C has a configuration and effects similar to those of the imaging device 3.

The fourth electrode 24C penetrates the protection film 29 and the coating film 28, and is electrically coupled to the diffusion region DA. Thus, providing the fourth electrode 24C that is able to apply a voltage to the diffusion region DA makes it possible to enhance controllability of potentials of the diffusion region DA and the contact layer 15. For the fourth electrode 24C, used may be, for example, the material having the low transmittance with respect to the light of the wavelength of the infrared region and the visible region. For example, the fourth electrode 24C includes the metal material having the transmittance of 10% or less with respect to the light of the wavelength of 1 µm. Specifically, for the fourth electrode 24C, used may be, for example, any simple substance of titanium (Ti), tungsten (W), titanium nitride (TiN), platinum (Pt), gold (Au), copper (Cu), germanium (Ge), palladium (Pd), zinc (Zn), nickel (Ni), indium (In), or aluminum (Al), or an alloy including at least one kind thereof.

Figure 38:
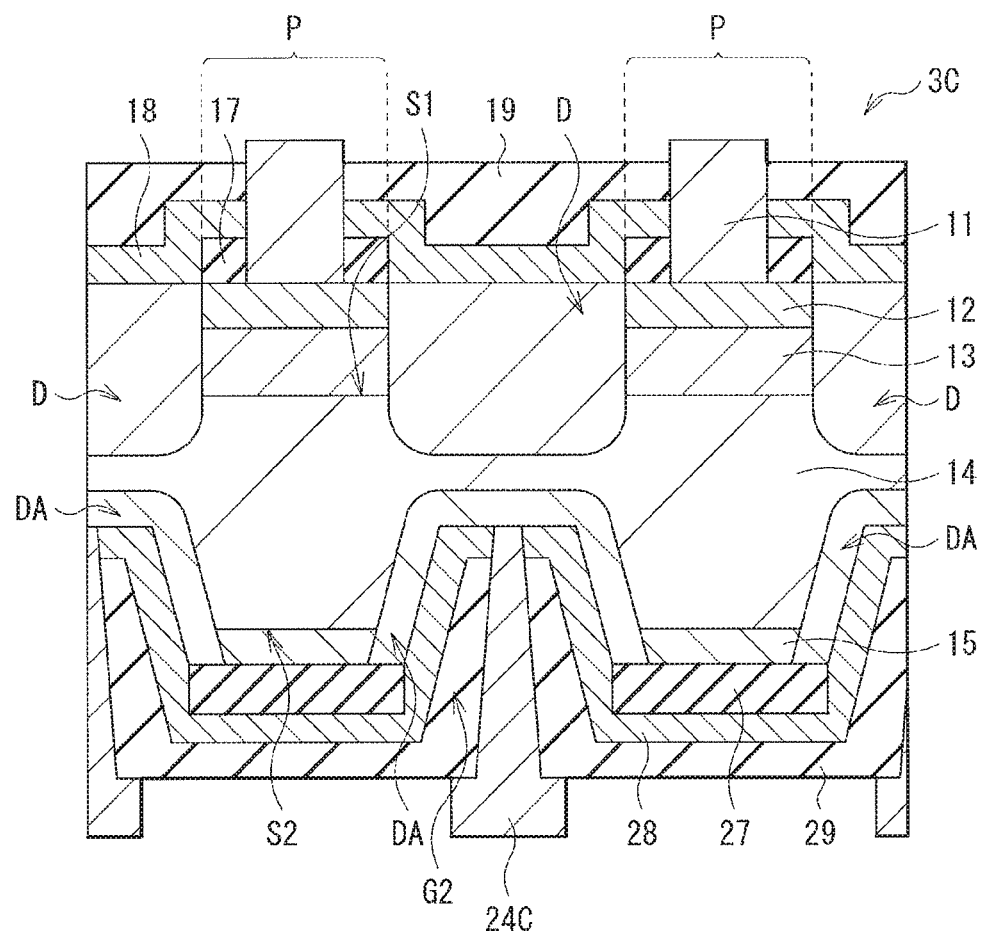
FIG. 38 is a schematic cross-sectional view illustrating another example of the imaging device illustrated in FIG. 37.

The diffusion region DA may be continuous with the diffusion region D (FIG. 37) or may be spaced apart from the diffusion region D, as illustrated in FIG. 38.

As in the present modification example, provided may be the fourth electrode 24C electrically coupled to the diffusion region DA. In this case as well, it is possible to produce equivalent effects to those of the forgoing third embodiment. Moreover, owing to the fourth electrode 24C, it is possible to enhance the controllability of the potentials of the diffusion region DA and the contact layer 15.

Modification Example 13

Figure 39:
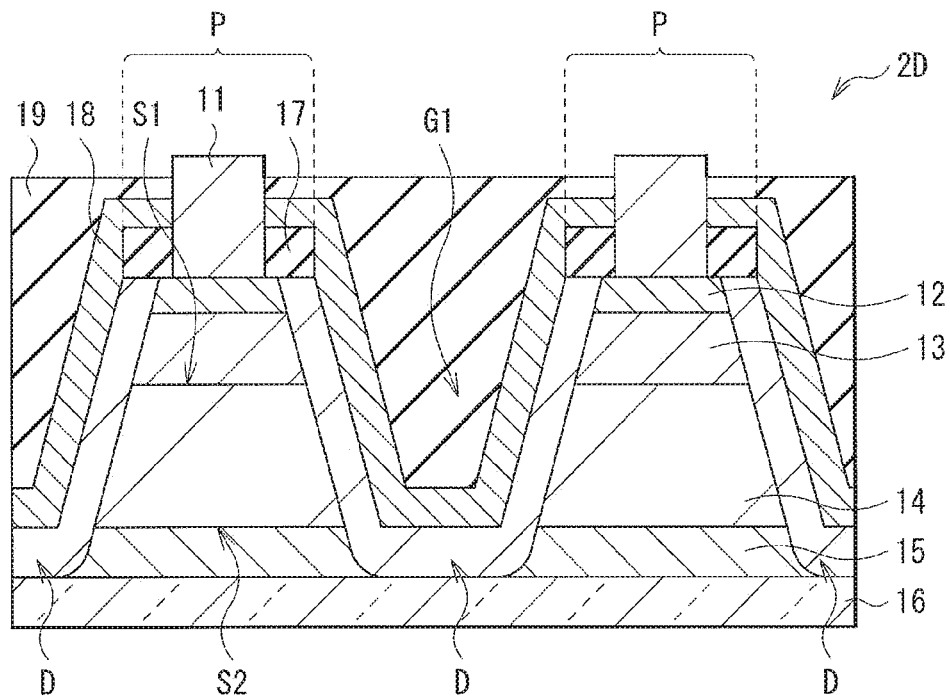
FIG. 39 is a schematic cross-sectional view illustrating a configuration in outline of an imaging device according to a modification example 13.

FIG. 39 illustrates a schematic cross-sectional configuration of an imaging device an imaging device 2D) according to a modification example 13. In the imaging device 2D, the groove 1 penetrates the light absorption layer 14, and its bottom reaches the second surface S2 of the light absorption layer 14. Otherwise, the imaging device 2D has a configuration and effects similar to those of the imaging device 2.

The groove G1 separates the first semiconductor layer 12 and the second semiconductor layer 13 for each of the pixels P. Furthermore, the groove G1 may physically separate the light absorption layer 14. This makes it possible to restrain the migration of the signal charges between the adjacent ones of the pixels P more effectively, as compared to the second embodiment. This allows for further suppression of the crosstalk between the pixels P.

The diffusion region D may be provided from the light absorption layer 14 to the contact layer 15.

Figure 40:
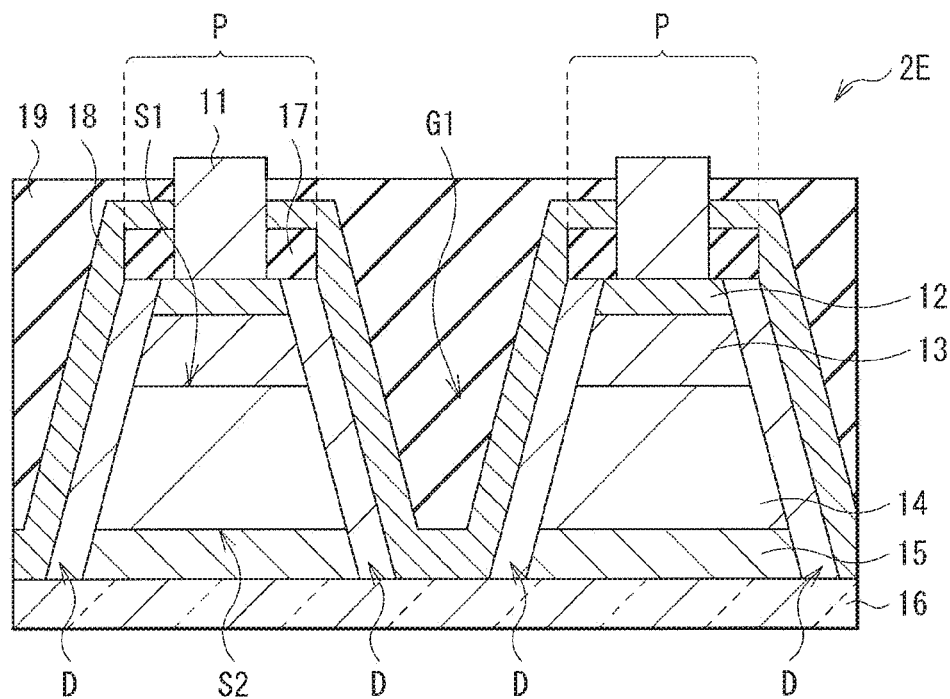
FIG. 40 is a schematic cross-sectional view illustrating another example of the imaging device illustrated in FIG. 39.

Further, as in an imaging device 2E illustrated in FIG. 40, the groove G1 may penetrate the contact layer 15, and its bottom may reach the second electrode 16. In this way, allowing the groove G1 to physically separate an entirety of the semiconductor layers including the first semiconductor layer 12, the second semiconductor layer 13, the light absorption layer 14, and the contact layer 15 makes it possible to restrain the crosstalk between the pixels P more effectively.

Modification Example 14

Figure 41:
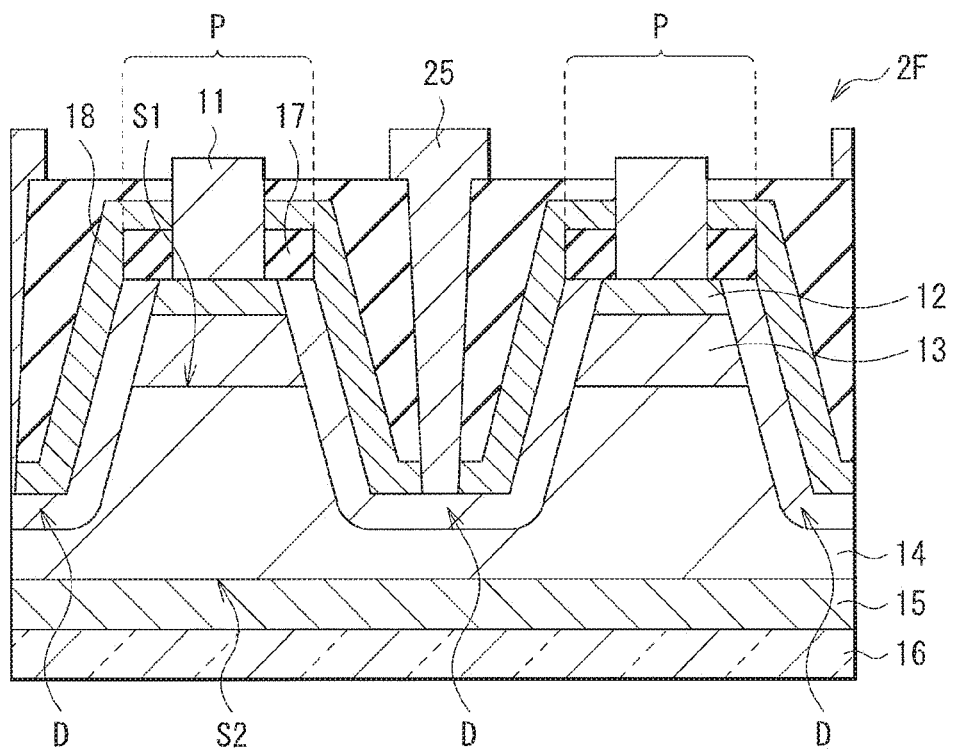
FIG. 41 is a schematic cross-sectional view illustrating a configuration in outline of an imaging device according to a modification example 14.

FIG. 41 illustrates a schematic configuration of an imaging device (an imaging device 2F) according to a modification example 14. The imaging device 2F includes a third electrode (a third electrode 24), instead of the light-shielding member 25 of the forgoing imaging device 2C. Otherwise, the imaging device 2F has a configuration and effects similar to those of the imaging device 2.

The third electrode 24 is fitted into the groove G1, while penetrating the protection film 19 and the coating film 18. The third electrode 24 is electrically coupled to the diffusion region D. Thus, providing the third electrode 24 that is able to apply a voltage to the diffusion region D makes it possible to enhance controllability of a potential of the diffusion region D. Specifically, controlling the potential of the diffusion region D to induce holes at an interface makes it possible to restrain the generation of the dark currents at the interface. For the third electrode 24, used may be, for example, the material having the low transmittance with respect to the light of the wavelength of the infrared region and the visible region. For example, the third electrode 24 includes the metal material having the transmittance of 10% or less with respect to the light of the wavelength of 1 μm. Specifically, as the fourth electrode 24C, used may be, for example, any simple substance of titanium (Ti), tungsten (W), titanium nitride (TiN), platinum (Pt), gold (Au), copper (Cu), germanium (Ge), palladium (Pd), zinc (Zn), nickel (Ni), indium (In), or aluminum (Al), or an alloy including at least one kind thereof.

The third electrode 24 may be formed, for example, after depositing the protection film 19, by carrying out photoresist and dry etching to form an opening that penetrates the protection film 19 and the coating film 18, and by filling the opening with a metal.

Figure 42:
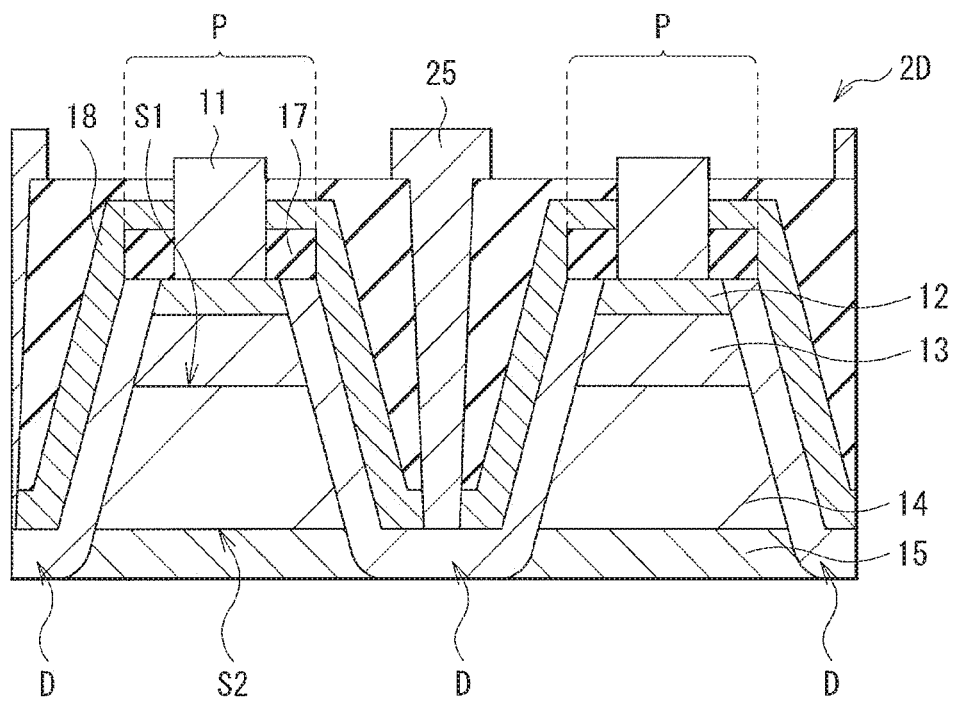
FIG. 42 is a schematic cross-sectional view illustrating another example of the imaging device illustrated in FIG. 41.

Furthermore, the structure of the present modification example may be applicable to, for example, the imaging device 2D illustrated in the modification example 13. FIG. 42 illustrates a schematic configuration of an imaging device 2G as a combination of the imaging device 2D and the imaging device 2F. As in the imaging device 2G, the third electrode 24 is provided inside the groove G1. The groove penetrates the light absorption layer 14, and its bottom reaches the second surface S2 of the light absorption layer 14. The third electrode 24 is electrically coupled to the contact layer 15 in which the diffusion region D is formed. This makes it possible to allow the third electrode 24 to control the potential of the contact layer 15. Accordingly, the second electrode 16 may be omitted.

Modification Example 15

Figure 43:
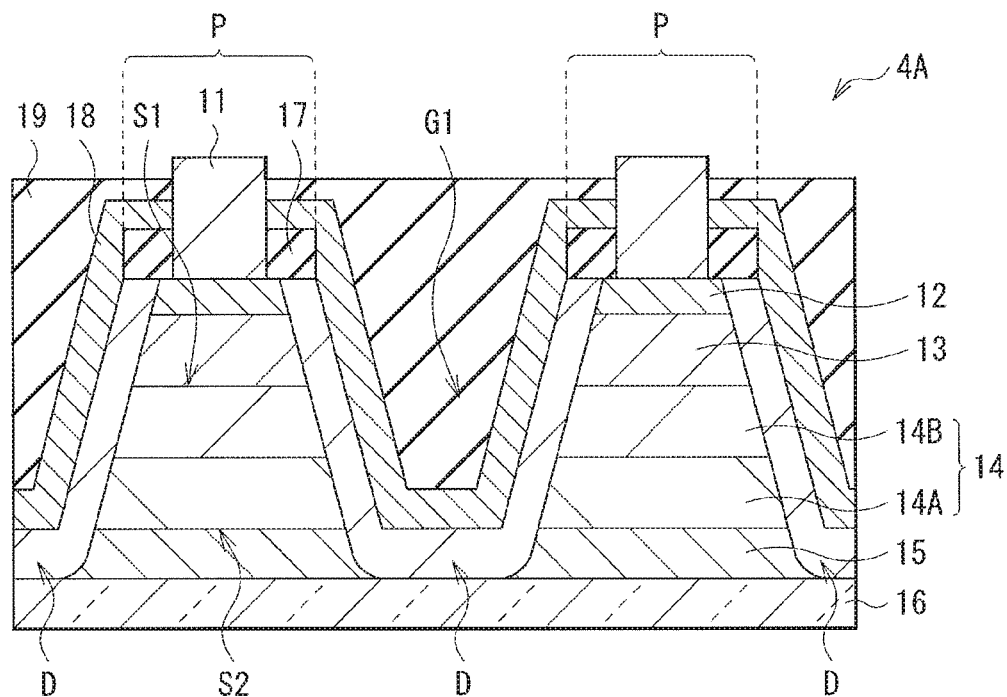
FIG. 43 is a schematic cross-sectional view illustrating a configuration in outline of an imaging device according to a modification example 15.

FIG. 43 illustrates a schematic configuration of an imaging device (an imaging device 4A) according to a modification example 15. In the imaging device 4A, the light absorption layer 14 includes a plurality of layers (for example, two layers (14A and 14B)) having different impurity densities. Otherwise, the imaging device 4A has a configuration and effects similar to those of the imaging device 2.

In the light absorption layer 14 of the present modification example, the light absorption layers 14A and 14B having the different impurity densities from each other are stacked. The light absorption layer 14A is disposed on the side on which the first surface S1 is disposed, and the light absorption layer 14B is disposed on the side on which the second surface S2 is disposed. The impurity density of the light absorption layer 14A is lower than that of the light absorption layer 14B. The light absorption layer 14A has a doping density of, for example, $1\times10^{13}$ cm$^{-3}$ or more. The impurity density of the light absorption layer 14B is higher than that of the light absorption layer 14A. The light absorption layer 14B has a doping density of, for example, $1\times10^{19}$ cm$^{-3}$ or less. Thus, disposing the light absorption layer 14B having the relatively higher impurity density on the side on which the light entrance surface (the second surface S2) is disposed causes generation of an electric field that helps transfer of the signal charges from the light entrance surface toward the contact layer 15, making it possible to enhance response performance of the imaging device 4A. Furthermore, it is possible to shorten transfer time, leading to reduction in an amount of the signal charges that recombine inside the light absorption layer 14 during the transfer. This makes it possible to enhance the quantum efficiency.

It is to be noted that FIG. 43 illustrates an example of the light absorption layer 14 of the two-layer structure, but this is non-limiting. Three or more layers may be stacked. In this case, the impurity densities are made higher as are closer to the light entrance surface (the second surface S2). Moreover, the impurity densities do not have to change stepwise, but may change, for example, continuously. Furthermore, the present modification example gives an example in which the groove G1 penetrates the light absorption layer 14, but this is non-limiting. For example, even in a case where the groove G1 does not reach the light absorption layer 14, it is possible to produce similar effects to those of the present modification example.

Modification Example 16

Figure 44:
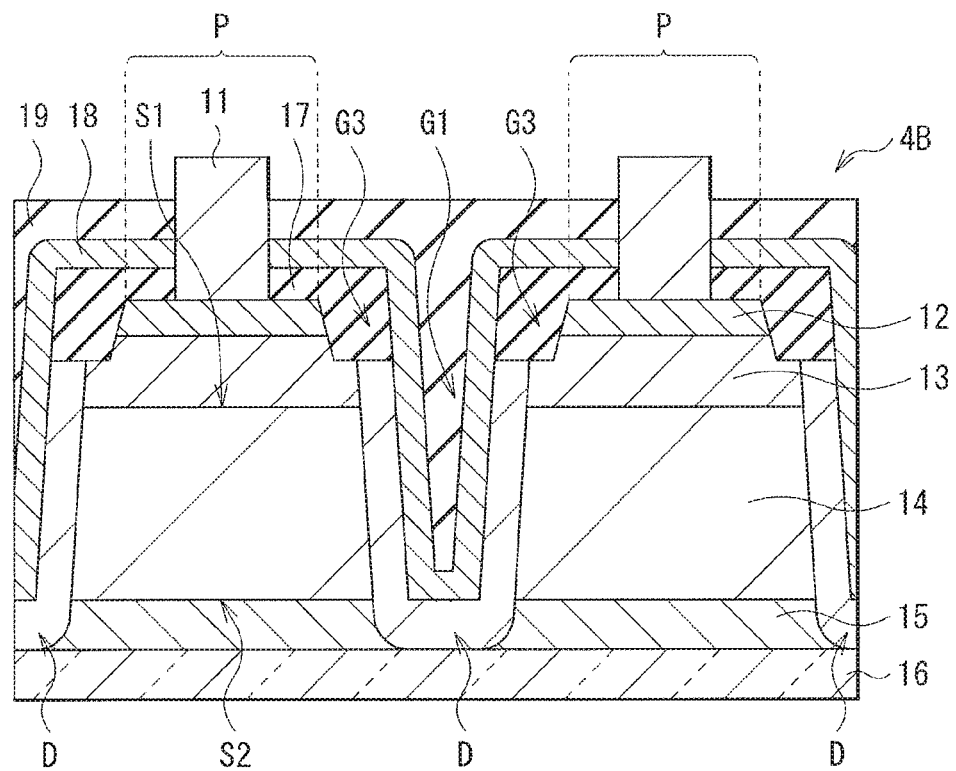
FIG. 44 is a schematic cross-sectional view illustrating a configuration in outline of an imaging device according to a modification example 16.

FIG. 44 illustrates a schematic configuration of an imaging device (an imaging device 4B) according to a modification example 16. In the imaging device 4B, a groove G3 is provided, together with, for example, the groove G1 that penetrates the light absorption layer 14. The groove G3 includes a bottom surface inside the second semiconductor layer 13.

The groove G3 separates the first semiconductor layer 12 for each of the pixels P, and extends to inside the second semiconductor layer 13. The insulating film 17 is fitted inside the groove G3, to form a so-called shallow trench isolation (STI). Contact between the first semiconductor layer 12 having the n conductive type and the diffusion region D having the p conductive type causes generation of strong electric charges and possibility of an increase in the dark currents. In the present modification example, the insulating film 17 is provided between the first semiconductor layer 12 and the diffusion region D, making it possible to suppress the occurrence of the dark currents at a junction between the first semiconductor layer 12 and the diffusion region D.

In the imaging device 49, after forming the groove G3, the insulating film 17 is deposited over the entire surfaces of the first semiconductor layer 12 and the second semiconductor layer 13. Thereafter, the groove G1 is formed that penetrates the second semiconductor layer 13 and the light absorption layer 14.

Figure 45:
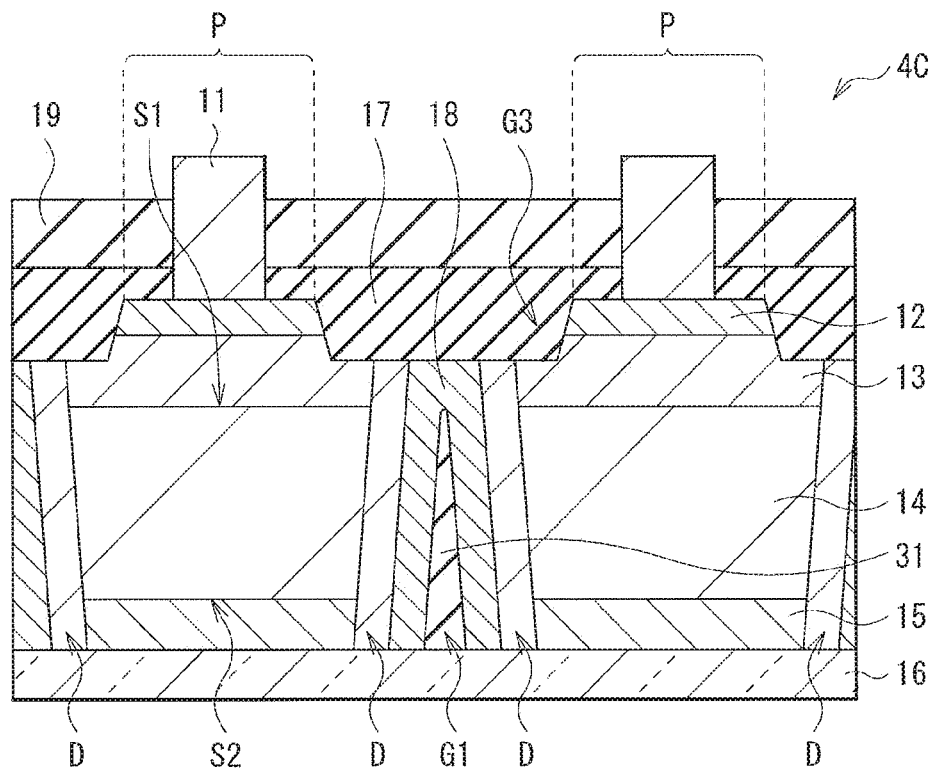
FIG. 45 is a schematic cross-sectional view illustrating another example of the imaging device illustrated in FIG. 44.

In the imaging device 4B, for example, as in the imaging devices such as the imaging device 2F as mentioned above, the third electrode 24 may be provided inside the groove G1. Moreover, FIG. 44 illustrates an example in which the groove G1 is formed from the side on which the first surface S1 is disposed, but this is non-limiting. For example, as in an imaging device 4C illustrated in FIG. 45, the groove G3 may be formed, and the insulating film 17 may be deposited over the first semiconductor layer 12 and the second semiconductor layer 13, and thereafter, the groove G1 may be formed from the side on which the second surface S2 is disposed. At this occasion, a SiN film deposited as the insulating film 17 serves as an etching stopper. An insulating film 31 is fitted into the groove G1 of the imaging device 4C. The insulating film 31 includes a similar material to that of the protection film 19.

Modification Example 17

Figure 46:
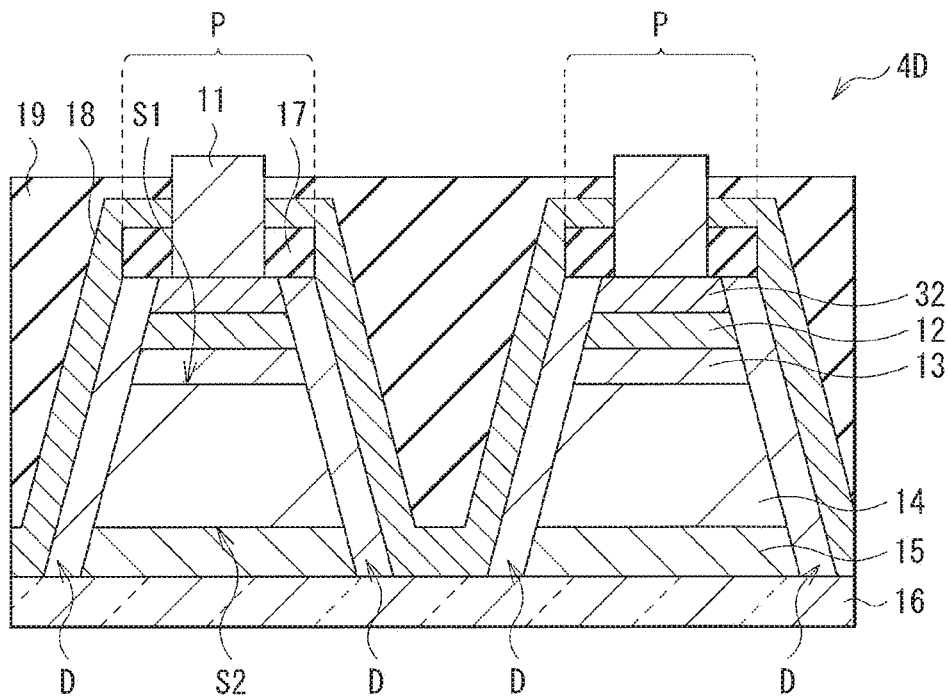
FIG. 46 is a schematic cross-sectional view illustrating a configuration in outline of an imaging device according to a modification example 17.

FIG. 46 illustrates a schematic configuration of an imaging device imaging device 4D) according to a modification example 17. The imaging device 4D includes a contact layer 32 between the first electrode 11 and the first semiconductor layer 12. Otherwise, the imaging device 4D has a configuration and effects similar to those of the imaging device 2.

The contact layer 32 includes a compound semiconductor material that has bandgap energy larger than the bandgap energy of the first semiconductor layer 12 and the second semiconductor layer 13 that form the p-n junction. In a case where the first semiconductor layer 12 includes, for example, InP (indium phosphide), for the contact layer 32, used may be, for example, InAlAs (indium aluminum arsenide). For the contact layer 32, used may be, for example, a group III-V semiconductor including, at least, any one of In (indium), Ga (gallium), Al (aluminum), As (arsenic), P (phosphorus), Sb (antimony), or N (nitrogen). Specifically, in addition to InAlAs, examples may include InP, InGaAsP (indium gallium arsenide phosphide), InAsSb (indium arsenide antimonide), InGaP (indium gallium phosphide), and GaAsSb (gallium arsenide antimonide).

As in the present modification example, the contact layer 32 may be provided between the first electrode 11 and the first semiconductor layer 12. The contact layer 32 has the bandgap energy larger than the bandgap energy of the first semiconductor layer 12 and the second semiconductor layer 13. In this way, the contact layer 32 having the relatively larger bandgap energy includes the p-n junction and a contact part where the first semiconductor layer 12 make contact with an interface of the insulating film 17. In the p-n junction and the contact part, there is possibility of occurrence of large dark currents. Hence, it is possible to reduce the probability of the occurrence of the dark currents.

Modification Example 18

Figure 47:
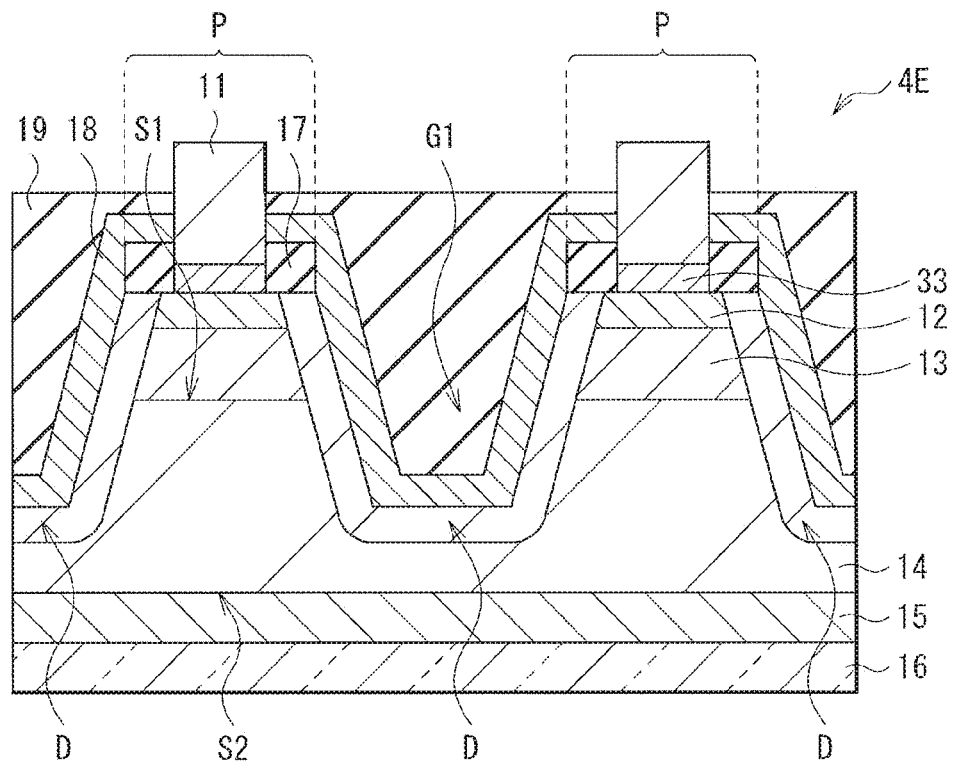
FIG. 47 is a schematic cross-sectional view illustrating a configuration in outline of an imaging device according to a modification example 18.

FIG. 47 illustrates a schematic configuration of an imaging device (an imaging device 4E) according to a modification example 18. The imaging device 4E includes a contact layer 33 at a lower level than the first electrode 11. Otherwise, the imaging device 4E has a configuration and effects similar to those of the imaging device 2.

The contact layer 33 is provided directly below the first electrode 11, and has, for example, a same planar shape as that of the first electrode 11. The contact layer 33 has an impurity concentration of $1 \times 10^{-16}$ cm$^{-3}$ or more, and includes a compound semiconductor material that has bandgap energy smaller than the bandgap energy of the first semiconductor layer 12. In a case where the first semiconductor layer 12 includes, for example, InP (indium phosphide), for example, InGaAs (indium gallium arsenide) may be used for the contact layer 32. For the contact layer 33, used may be, for example, a group semiconductor including, at least, any one of In (indium), Ga (gallium Al (aluminum), As (arsenic), P (phosphorus), Sb (antimony), or N (nitrogen). Specifically, in addition to InGaAs, examples may include InP, InGaAsP (indium gallium arsenide phosphide), InAsSb (indium arsenide antimonide), InGaP (indium gallium phosphide), GaAsSb (gallium arsenide antimonide), and InAlAs (indium aluminum arsenide).

In general, stacking a semiconductor material having large bandgap energy and the first electrode 11 on each other causes a tendency of high contact resistance at their interface. As in the present modification example, providing, at the lower level than the first electrode 11, the contact layer 33 having the bandgap energy smaller than the bandgap energy of the first semiconductor layer 12 causes lowered contact resistance with the first electrode 11, making it easier to read out the signal charges. This leads to enhanced response performance.

It is to be noted that as in the imaging device 2B as mentioned above, in the case where the diffusion region D is not provided as far as the first semiconductor layer 12, the contact layer 33 may be provided over the entire surface of the first semiconductor layer 12.

Modification Example 19

Figure 48:
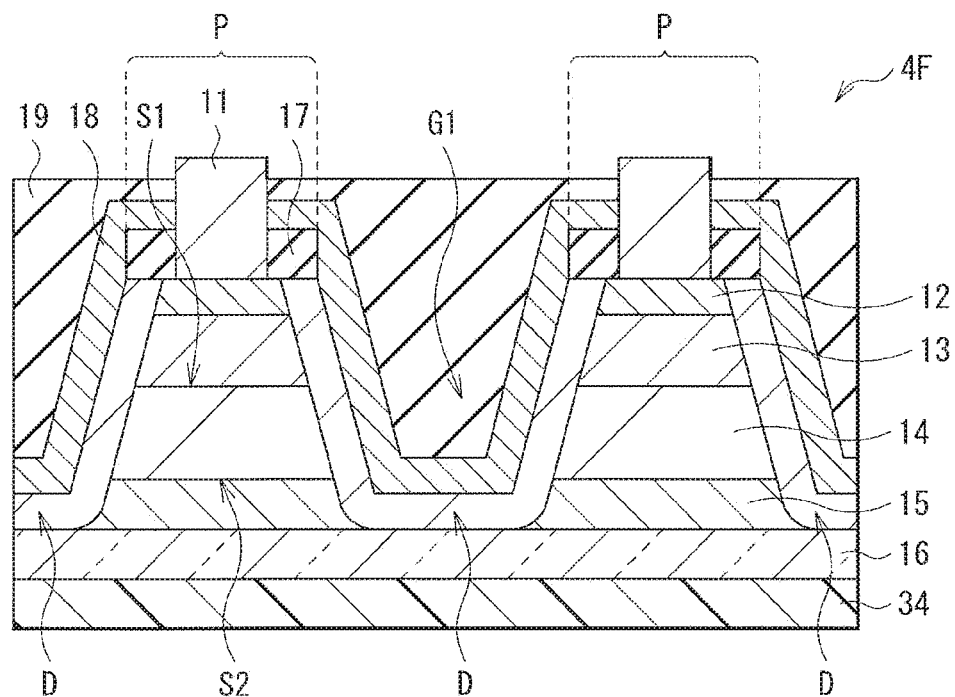
FIG. 48 is a schematic cross-sectional view illustrating a configuration in outline of an imaging device according to a modification example 19.

FIG. 48 illustrates a schematic configuration of an imaging device imaging device 4F) according to a modification example 19. The imaging device 4F includes a protection film 34 on side of the second electrode 16 on which light enters. Otherwise, the imaging device 4F has a configuration and effects similar to those of the imaging device 2.

The protection film 34 is provided for protection of the semiconductor layers such as the contact layer 15, and the second electrode 16. For the protection film 34, used may be, for example, an insulating material including at least one of silicon (Si), nitrogen (N), aluminum (Al), hafnium (Hf), tantalum (Ta), titanium (Ti), magnesium (Mg), oxygen (O), lanthanum (La), gadolinium (Gd), or yttrium (Y). Specifically, the protection film 34 includes, for example, a silicon oxide (SiO$_2$) film. The protection film 34 may include, for example, a silicon nitride (SiN) film, an aluminum oxide (Al$_2$O$_3$) film, a silicon oxynitride (SiON) film, an aluminum oxynitride (AlON) film, a silicon aluminum nitride (STAIN) film, magnesium oxide (MgO), a silicon aluminum oxide (AlSiO) film, a hafnium oxide (HfO$_2$) film, or a hafnium aluminum oxide (HfAlO) film.

As in the present modification example, staking the protection film 34 on the side of the second electrode 16 on which the light enters causes suppression of deterioration of the second electrode 16 because of reaction with outside air. This makes it possible to restrain an increase in resistance of the second electrode 16. Moreover, generation of crystal defects in the semiconductor layers such as the contact layer 15 is suppressed. This makes it possible to restrain the occurrence of the dark currents.

Figure 49:
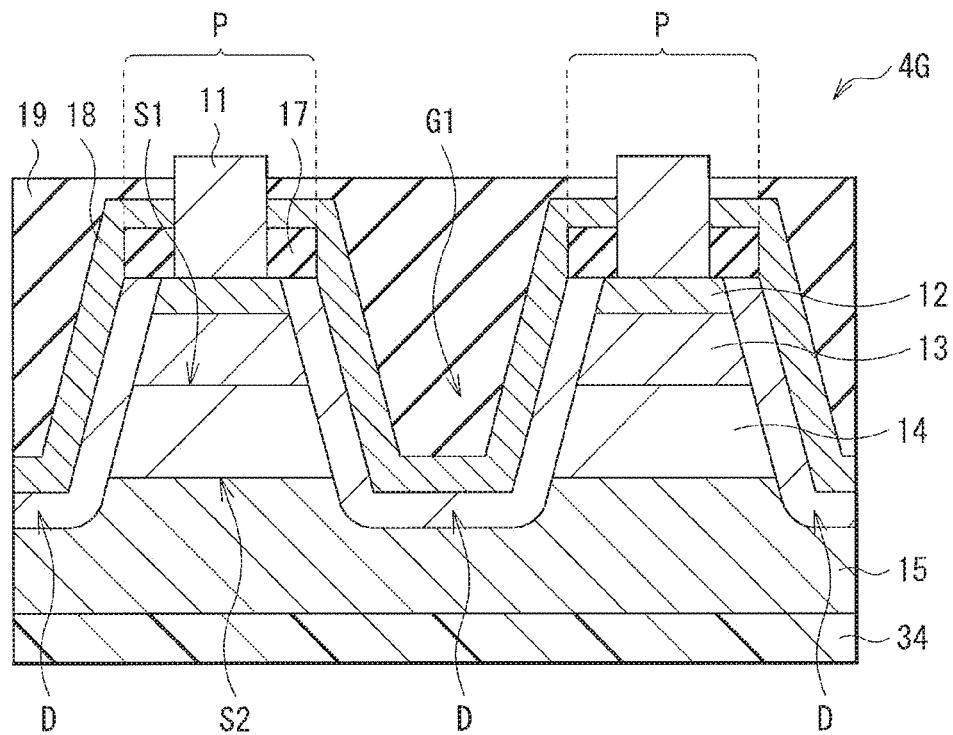
FIG. 49 is a schematic cross-sectional view illustrating another example of the imaging device illustrated in FIG. 48.
Figure 50:
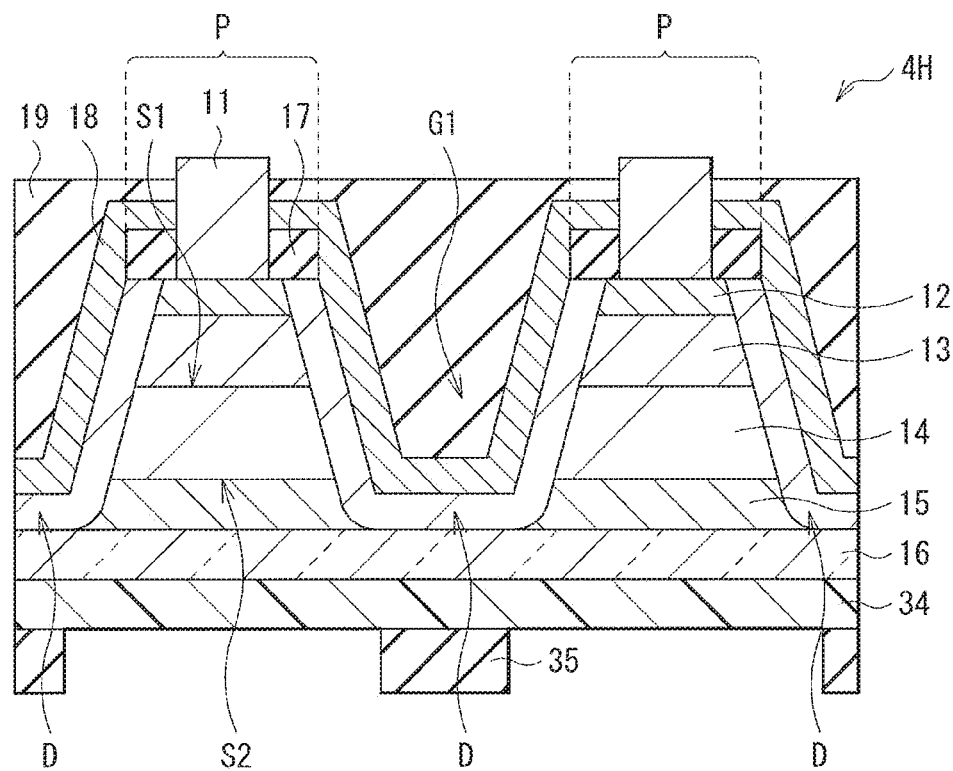
FIG. 50 is a schematic cross-sectional view illustrating a configuration in outline of an imaging device according to a modification example 20.

It is to be noted that in a case where the second electrode 16 is omitted as in the imaging device 2G as mentioned above, it is preferable that the protection film 34 be provided, as in an imaging device 4G illustrated in FIG. 49. This leads to the suppression of the generation of the crystal defects of the contact layer 15, making it possible to suppress the occurrence of the dark currents.

Modification Example 20

FIG. 49 illustrates a schematic configuration of an imaging device (an imaging device 4H) according to a modification example 20. The imaging device 4H includes, on the side of the second electrode 16 on which the light enters, a light-shielding film 35 between the pixels P, with the protection film 34 in between. Otherwise, the imaging device 4H has a configuration and effects similar to those of the imaging device 2.

For the light-shielding film 35, used may be, for example, the material having the low transmittance with respect to the light of the wavelength of the infrared region and the visible region. For example, the light-shielding film 35 includes the metal material having the transmittance of 10% or less with respect to the light of the wavelength of 1 μm. Specifically, as the light-shielding film 35, used may be, for example, any simple substance of titanium (Ti), tungsten (W), titanium nitride (TiN), platinum (Pt), gold (Au), copper (Cu), germanium (Ge), palladium (Pd), zinc (Zn), nickel (Ni), indium (in), or aluminum (Al), or an alloy including at least one kind thereof.

Thus, providing the light-shielding film 35 between the pixels P over the protection film 34 makes it possible to prevent entering light from intruding into adjacent pixels, leading to the suppression of the occurrence of the crosstalk between the pixels P.

Figure 51:
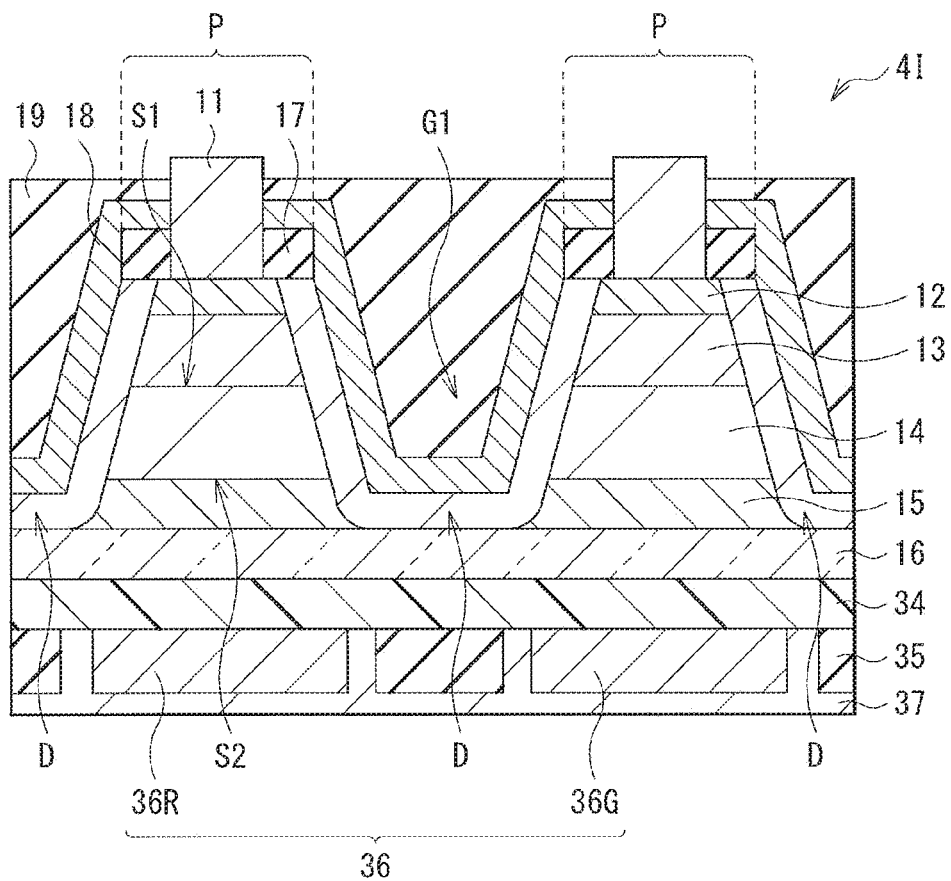
FIG. 51 is a schematic cross-sectional view illustrating another example (1) of the imaging device illustrated in FIG. 50.

The structure of the present modification example may further include a filter 36 (36R and 36G) on each of the pixels P, as in an imaging device 4I illustrated in FIG. 51. The filter 36 (36R and 36G) transmits desired wavelengths corresponding to the respective pixels P. Examples of the filter 36 include a color filter, a visible light cut filter, an infrared cut filter that cuts infrared light except for the desired wavelengths.

The color filter includes a resin to which a colorant including a desired pigment or dye is added. Adjustment is made, by selecting the pigment or the dye, so that light transmittance in target wavelength regions such as red, green, and blue colors becomes high while light transmittance in other wavelength regions becomes low. Providing the color filter allows for spectroscopy that includes receiving solely light of a specific wavelength. It is to be noted that a protection film 37 may further be provided on the light-shielding film 35 and the filter 36. For the protection film 37, used may be a similar material to that of the protection film 34.

Figure 52:
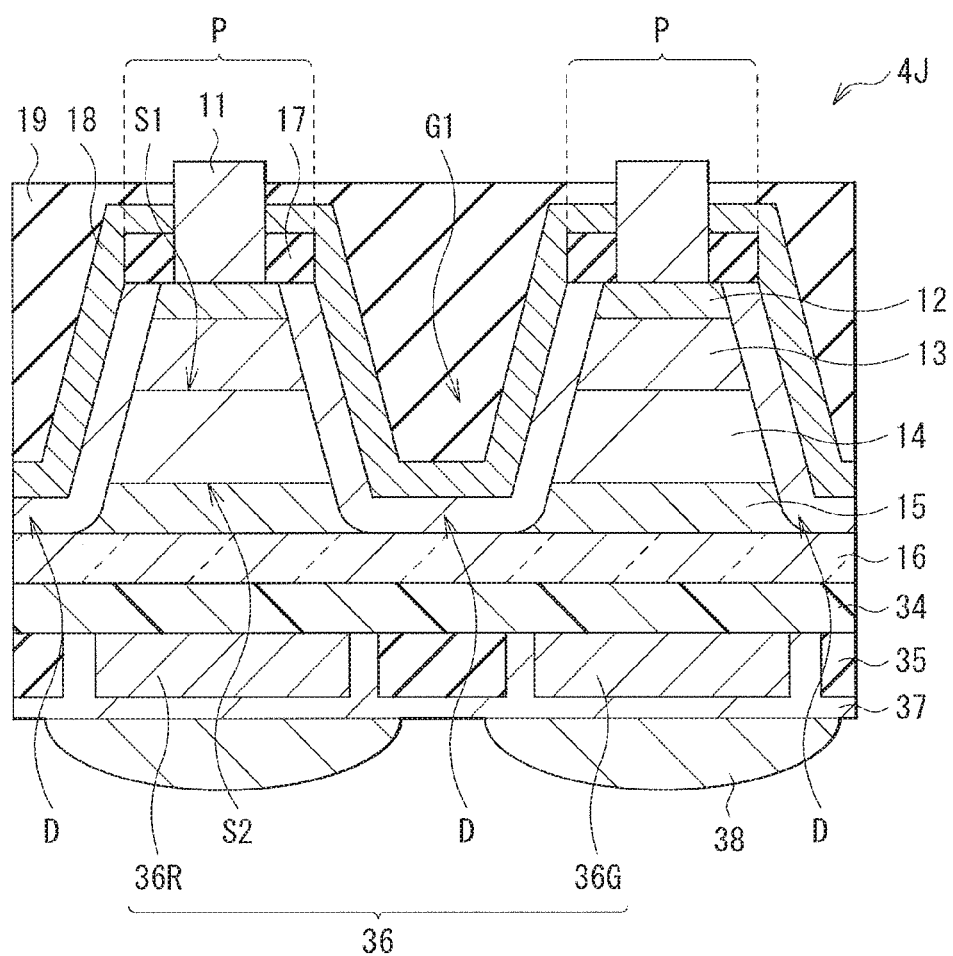
FIG. 52 is a schematic cross-sectional view illustrating another example (2) of the imaging device illustrated in FIG. 50.

In the structure of the present modification example, as in an imaging device 4J illustrated in FIG. 52, condenser lenses 38 may be provided, on the protection film 37, at positions respectively corresponding to angle pixels. Providing the condenser lenses 38 allows entering light to converge on the semiconductor material of the light absorption layer 14, leading to the suppression of the occurrence of the crosstalk between the pixels P. Moreover, it is also possible to enhance the quantum efficiency.

It is to be noted that it is unnecessary to provide all of the light-shielding film 35, the filter 36, and the condenser lenses 38. Solely the filter 36 or solely the condenser lenses 38 may be provided on the protection film 34, or alternatively a combination of any two kinds thereof may be provided on the protection film 34.

First Application Example

Figure 53:
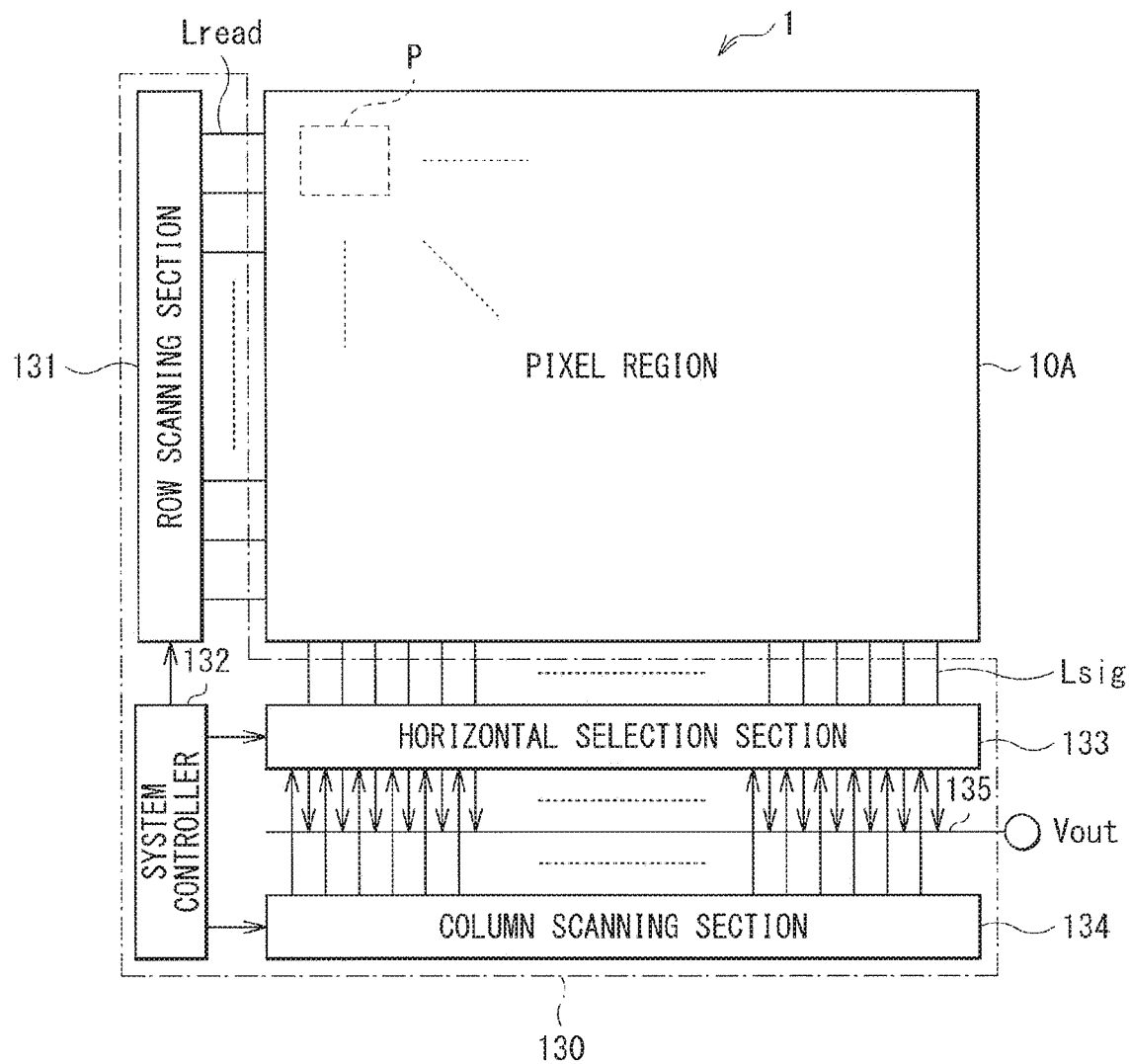
FIG. 53 is a block diagram illustrating a configuration of an imaging device.

FIG. 53 illustrates a functional configuration of the imaging device 1 (or any one of the imaging devices 1A to 3C) described in the forgoing example embodiments. Hereinafter, the imaging devices 1, 1A to 3C are collectively referred to as the imaging device 1. The imaging device 1 is, for example but not limited to, an infrared image sensor, and includes, for example, the pixel region 10A and a circuit section 130 that drives the pixel region 10A. The circuit section 130 includes, for example, a row scanning section 131, a horizontal selection section 133, a column scanning section 134, and a system controller 132.

The pixel region 10A includes the plurality of the pixels P that are two-dimensionally disposed in rows and columns, for example. In the pixels P, for example, a pixel driving line Lread (such as a row selecting line and a reset control line) is wired for each pixel row and a vertical signal line Lsig is wired for each pixel column. The pixel driving line Lread transmits a drive signal directed to reading out, from any pixel P. of a signal. The pixel driving line Lread has one end coupled to a corresponding one of output terminals that correspond to the respective rows of the row scanning section 131.

The row scanning section 131 includes components such as, but not limited to, a shift register and an address decoder. The row scanning section 131 is a pixel driver that drives the pixels P of the device region R1, for example, on a row basis. Signals outputted from the respective pixels P in the pixel row scanned and selected by the row scanning section 131 are supplied to the horizontal selection section 133 through the respective vertical signal lines Lsig. The horizontal selection section 133 includes components such as, but not limited to, an amplifier and a horizontal selection switch provided for each of the vertical signal lines Lsig.

The column scanning section 134 includes components such as, but not limited to, a shift register and an address decoder, and drives the horizontal selection switches of the horizontal selection section 133 in order while sequentially performing scanning of those horizontal selection switches. Such selection and scanning performed by the column scanning section 134 allows the signals of the pixels P transmitted through the respective vertical signal lines Lsig to be sequentially outputted to a horizontal signal line 135. The thus-outputted signals are supplied to an unillustrated signal processor or the like through the horizontal signal line 135.

Figure 54:
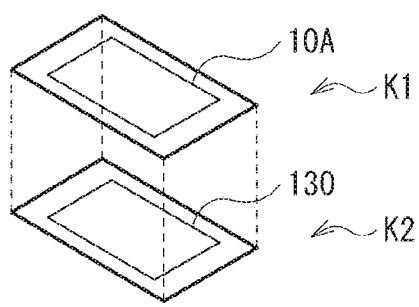
FIG. 54 is a schematic diagram illustrating a configuration example of an imaging device of a stacked type.

In the imaging device 1, referring to FIG. 54, for example, a device substrate K1 having the pixel region 10A and a circuit substrate K2 having the circuit section 130 are stacked. The imaging device 1, however, is not limited to such a configuration. For example, the circuit section 130 may be provided on a same substrate as the pixel region 10A, or may be disposed in an external control IC. Alternatively, the circuit section 130 may be provided in any other substrate coupled by means of a cable or any other coupler.

The system controller 132 receives a clock provided from outside, data that instructs an operation mode, and so forth. The system controller 132 also outputs data such as internal information of the imaging device 1. The system controller 132 further includes a timing generator that generates various timing signals, and performs, on the basis of the various timing signals generated by the timing generator, a drive control of circuitry such as the row scanning section 131, the horizontal selection section 133, and the column scanning section 134.

Second Application Example

Figure 55:
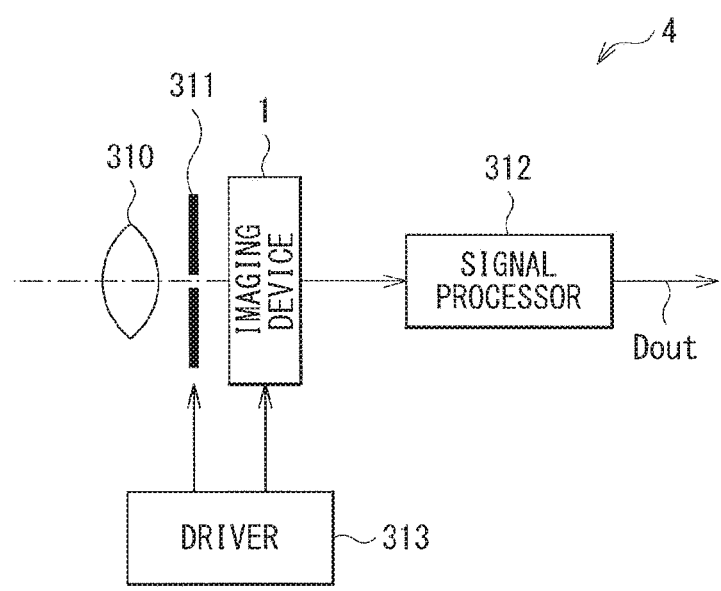
FIG. 55 is a functional block diagram illustrating an example of an electronic apparatus (a camera) that uses the imaging device illustrated in FIG. 54.

The imaging device 1 as described above is applicable to various types of electronic apparatuses such as, but not limited to, a camera that allows for imaging of the infrared region. FIG. 55 illustrates a schematic configuration of an electronic apparatus 4 (a camera) as a non-limiting example of such electronic apparatuses. The electronic apparatus 4 is a camera that allows for shooting of a still image, a moving image, or both, for example. The electronic apparatus 4 includes the imaging device 1, an optical system (an optical lens) 310, a shutter unit 311, a driver 313, and a signal processor 312. The driver 313 drives the imaging device 1 and the shutter unit 311.

The optical system 310 guides image light (entering light) obtained from an object to the imaging device 1, The optical system 310 may include a plurality of optical lenses. The shutter unit 311 controls a period in which the imaging device 1 is illuminated with the light and a period in which the light is blocked. The driver 313 controls transfer operation of the imaging device 1 and shutter operation of the shutter unit 311. The signal processor 312 performs various signal processes on the signal outputted from the imaging device 1. A picture signal Bout having been subjected to the signal processes is stored in a storage medium such as a memory, or outputted to a unit such as a monitor.

The imaging device 1 described by referring to the foregoing example embodiments is also applicable to the following non-limiting electronic apparatuses (a capsule endoscope and a mobile body such as a vehicle).

First Applied Example (Endoscope Surgery System)

The technique according to the present disclosure is applicable to various products. For example, the technique according to the present disclosure may be applied to an endoscopic surgery system.

Figure 56:
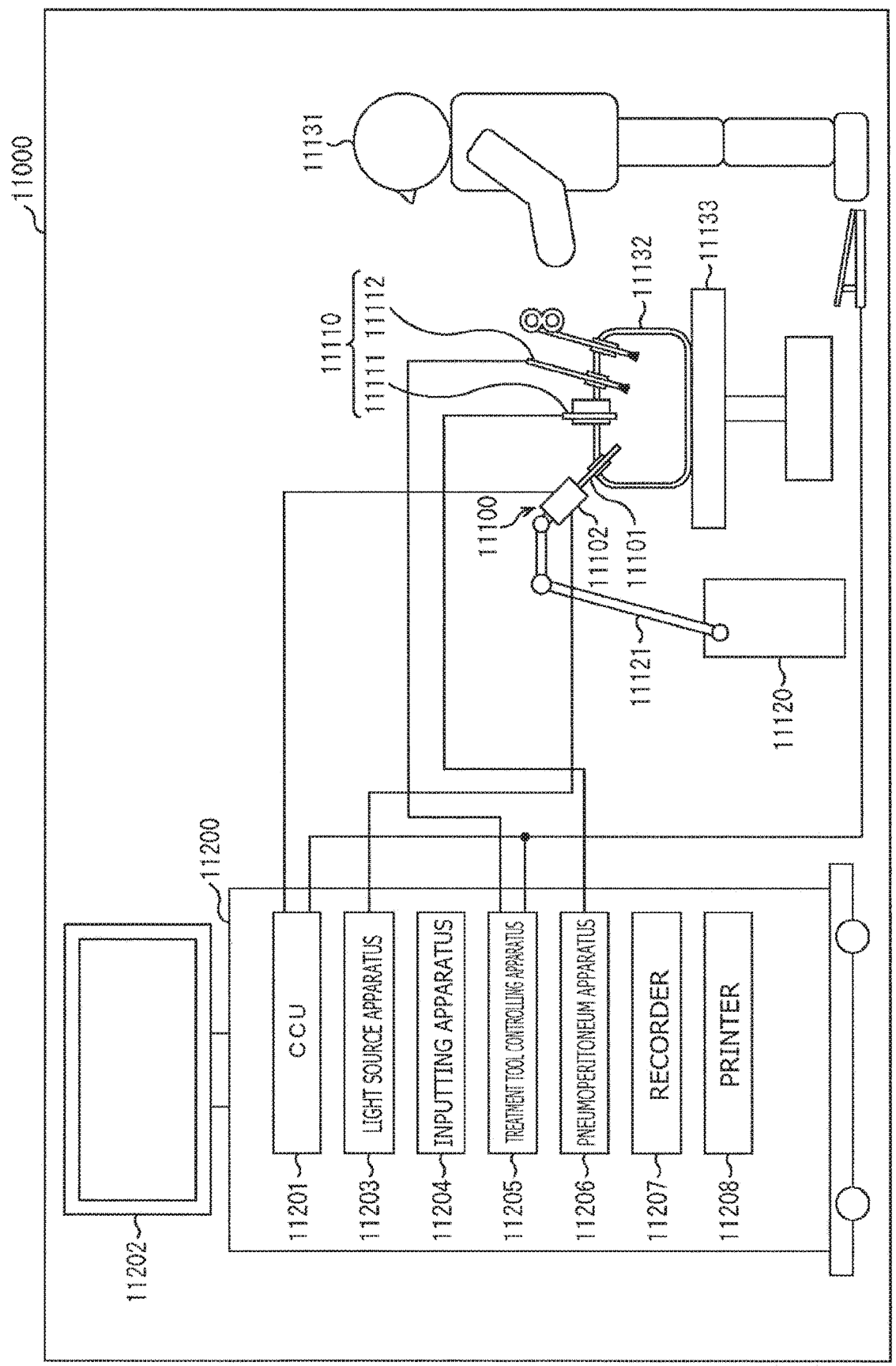
FIG. 56 is a view depicting an example of a schematic configuration of an endoscopic surgery system.

FIG. 56 is a view depicting an example of a schematic configuration of an endoscopic surgery system to which the technology according to an embodiment of the present disclosure (present technology) can be applied.

In FIG. 56, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LID) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 57:
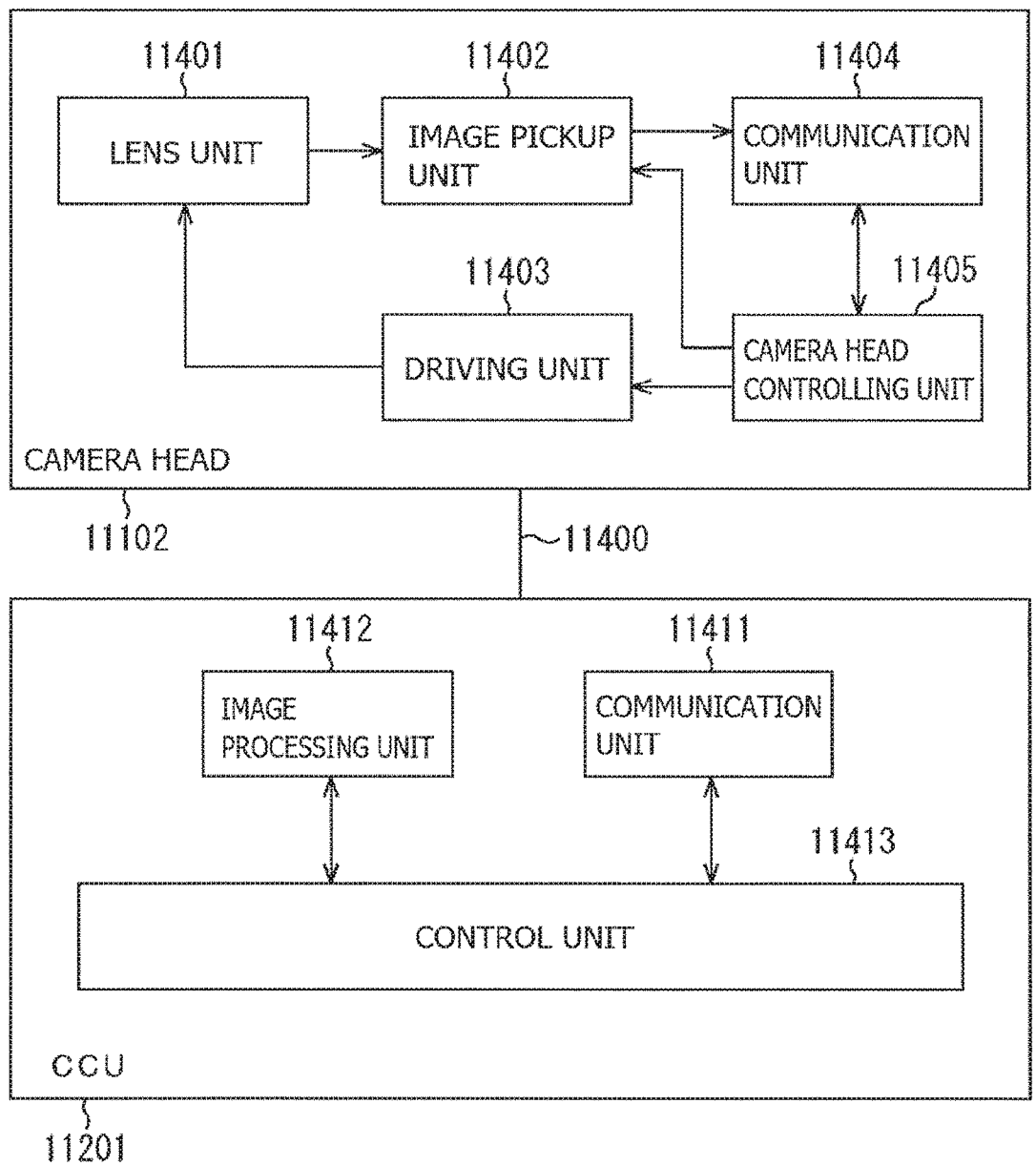
FIG. 57 is a block diagram depicting an example of a functional configuration of a camera head and a camera control unit (CCU).

FIG. 57 is a block diagram depicting an example of a functional configuration of the camera head 11102 and the CCU 11201 depicted in FIG. 56.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the forgoing, the description has been given of one example of the endoscopic surgery system to which the technology according to an embodiment of the present disclosure can be applied. The technology according to an embodiment of the present disclosure may be applied to the image pickup unit 11402 among the components of the configuration described above. Applying the technology according to an embodiment of the present disclosure to the image pickup unit 11402 makes it possible to obtain a clearer image of the surgical region. Hence, it is possible for the surgeon to confirm the surgical region with certainty.

Note that the description has been given above of the endoscopic surgery system as one example. The technology according to an embodiment of the present disclosure may be applied to any medical system besides the endoscopic surgery system, such as, but not limited to, a micrographic surgery system.

Second Applied Example (Mobile Body)

The technology according to an embodiment of the present disclosure is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid vehicle, a motorcycle, a bicycle, a personal mobility, an airplane, an unmanned aerial vehicle (drone), a vessel, and a robot.

Figure 58:
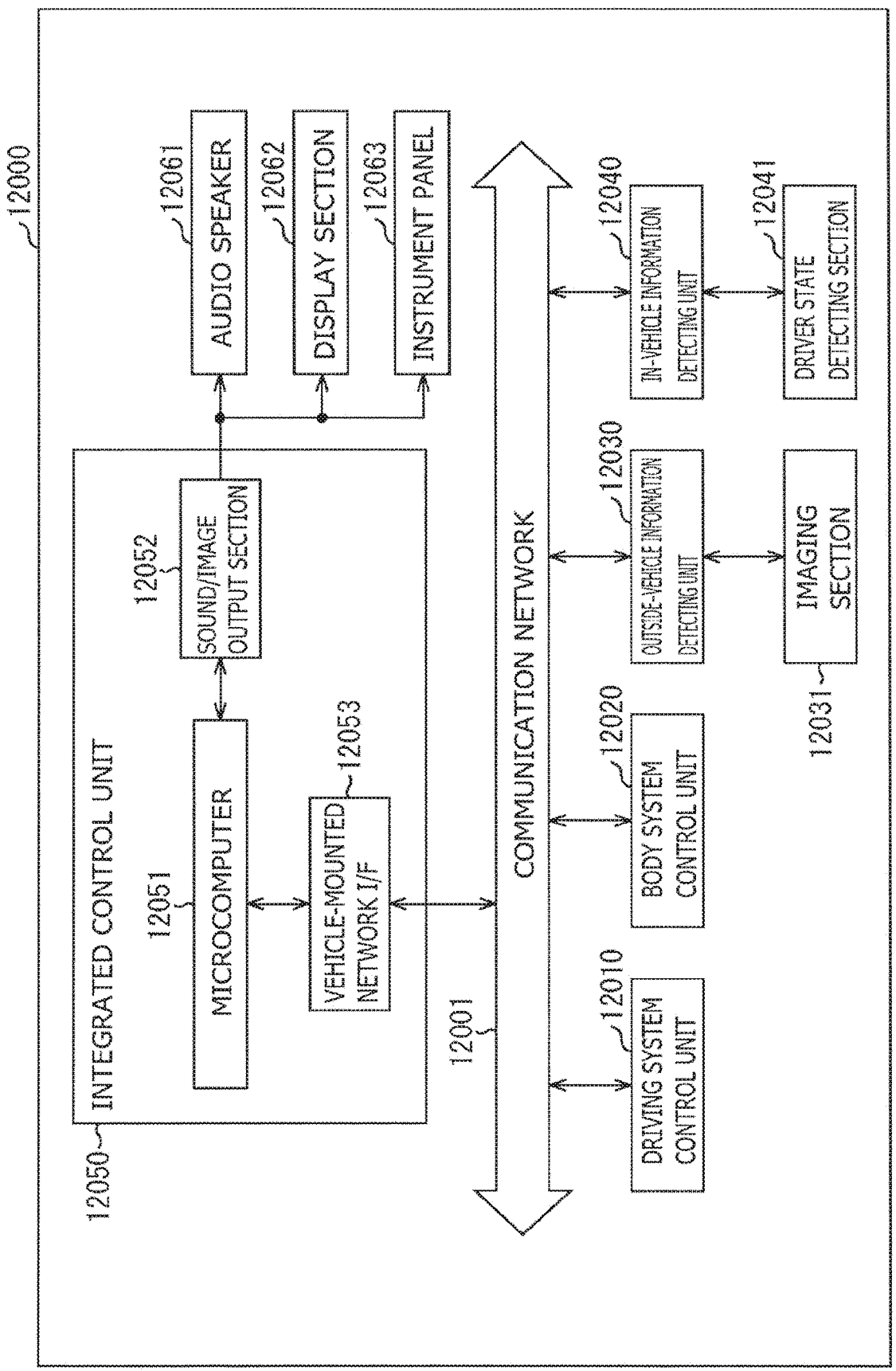
FIG. 58 is a block diagram depicting an example of schematic configuration of a vehicle control system.

FIG. 58 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 58, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle Which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 58, an audio speaker 12061, a display section 12062, and an instrument panel 12063 are illustrated as the output device. The display section 12062 may, for example, include at least one of an on-board display and a head-up display.

Figure 59:
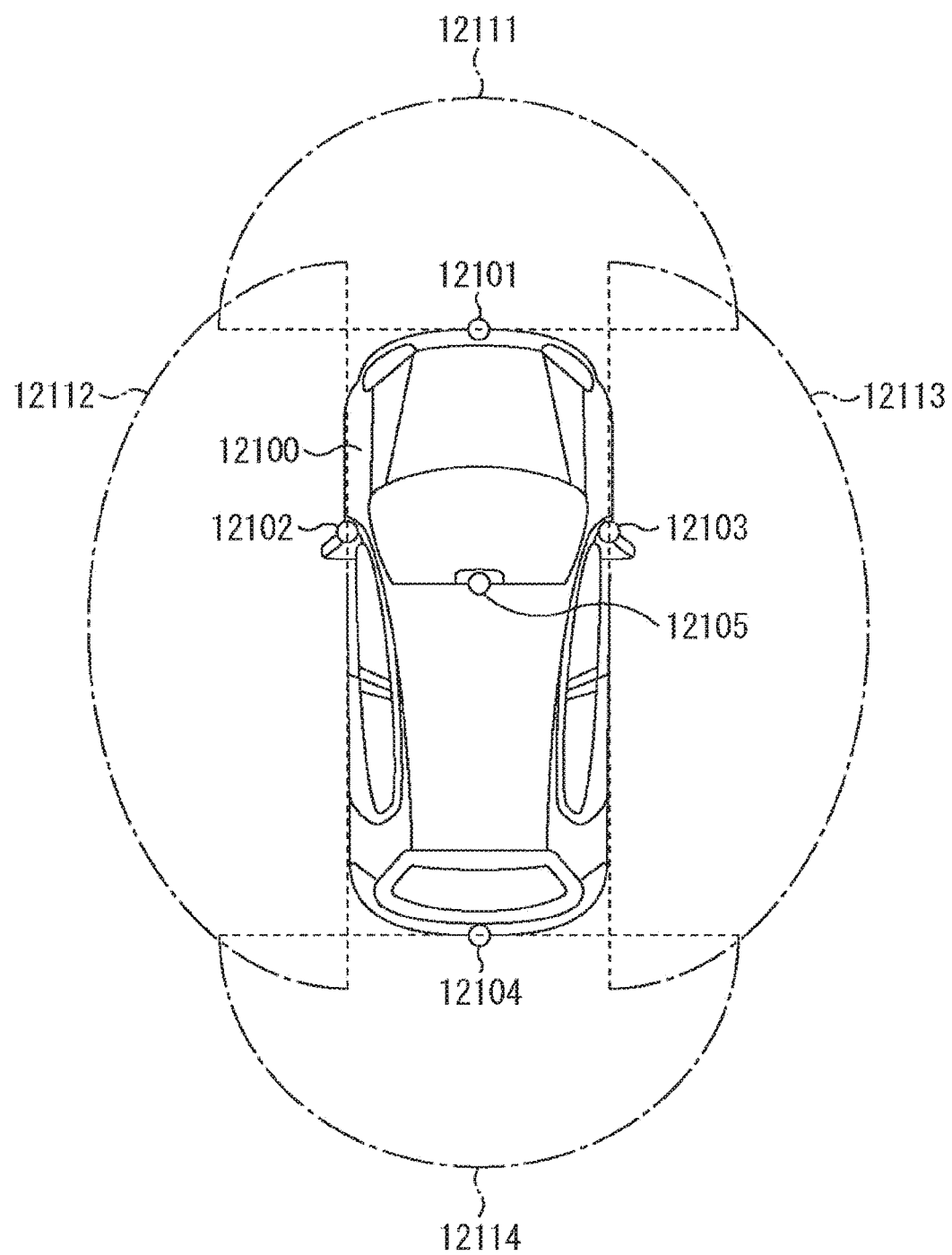
FIG. 59 is a diagram of assistance in explaining an example of installation positions of an outside-vehicle information detecting section and an imaging section.

FIG. 59 is a diagram depicting an example of the installation position of the imaging section 12031.

In FIG. 59, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 59 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can hereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the forgoing, the description has been given of one example of the vehicle control system to which the technology according to an embodiment of the present disclosure can be applied. The technology according to an embodiment of the present disclosure may be applied to the imaging section 12031 among the components of the configuration described above. Applying the technology according to an embodiment of the present disclosure to the imaging section 12031 makes it possible to obtain a captured image which is easier to see. Hence, it is possible to reduce the fatigue of the driver.

Further, the imaging device 1 described in the forgoing embodiments, the modification examples, and the application examples is also applicable to electronic apparatuses such as a monitoring camera, a biometrics authentication system, and thermography. The monitoring camera is, for example but not limited to, of a night vision system (night vision). Applying the imaging device 1 to the monitoring camera makes it possible to recognize, for example, pedestrian and animals at night from far away. Moreover, the imaging device 1 applied to an on-vehicle camera is unlikely to be affected by headlights or weather. For example, it is possible to obtain a captured image without being affected by, for example, smoke or fog. Furthermore, it is also possible to recognize a shape of an object. Moreover, in the thermography, it is possible to make a non-contact temperature measurement. In the thermography, it is also possible to detect temperature distribution and heat generation. In addition, the imaging device 1 is applicable to an electronic apparatus that senses, for example, flame, moisture, or gas.

Although description has been made by giving the embodiments, the modification examples, and the application examples as mentioned above, the contents of the present disclosure are not limited to the above-mentioned example embodiments and may be modified in a variety of ways. For example, the layer configuration of the light receiving device described in the forgoing embodiments is illustrative, and may further include any other layer. The materials and thicknesses of the respective layers are also illustrative and are not limited to those described above.

The effects described in the forgoing example embodiments are mere examples. There may be other effects, or other effects may be further included.

It is to be noted that an embodiment of the present disclosure may have the following configurations.

(1)
A photoelectric conversion device, including:
a light absorption layer that has a light entrance surface and includes a compound semi conductor material;
a first electrode provided for each of pixels, in opposed relation to an opposite surface to the light entrance surface of the light absorption layer;
a first semiconductor layer of a first conductive type, the first semiconductor layer having bandgap energy larger than bandgap energy of the light absorption layer and being provided between the light absorption layer and the first electrode;
a second semiconductor layer of a second conductive type, the second semiconductor layer having bandgap energy larger than the bandgap energy of the light absorption layer and being provided between the first semiconductor layer and the light absorption layer; and
a first diffusion region of the second conductive type, the first diffusion region being provided between adjacent ones of the pixels, and being provided across the second semiconductor layer and the light absorption layer.

(2)
The photoelectric conversion device according to (1), in which
the first diffusion region is provided in a lattice shape in plan view.

(3)
The photoelectric conversion device according to 1) or (2), further including
an electrical charge collection layer that is provided between the second semiconductor layer and the light absorption layer, and temporarily accumulates electrical charges generated in the light absorption layer.

(4)
The photoelectric conversion device according to (1) or (2), further including
a barrier alleviation layer that is provided between the second semiconductor layer and the light absorption layer, and alleviates a band offset barrier between the second semiconductor layer and the light absorption layer.

(5)
The photoelectric conversion device according to (1), (2), or (4), in which
the second semiconductor layer is configured to cause avalanche amplification of electrical charges generated in the light absorption layer.

(6)
The photoelectric conversion device according to (5), further including
an electric field descending layer that is provided between the second semiconductor layer and the light absorption layer, and restrains propagation of an electric field from the second semiconductor layer to the light absorption layer.

(7)
The photoelectric conversion device according to any one of (1) to (6), in which
the first semiconductor layer and the second semiconductor layer have a first groove that separates the adjacent ones of the pixels.

(8)
The photoelectric conversion device according to (7), in which
the first groove extends in the light absorption layer.

(9)
The photoelectric conversion device according to (7) or (8), further including
an insulating film that is provided from a front surface of the first semiconductor layer to a sidewall of the first groove, covers a sidewall of the first semiconductor layer, and extends over a portion of a sidewall of the second semiconductor layer.

(10)
The photoelectric conversion device according to any one of (7) to (9), further including
a light-shielding member fitted into the first groove.

(11)
The photoelectric conversion device according to any one of (1) to (10), further including
a second electrode provided in opposed relation to the light entrance surface of the light absorption layer.

(12)
The photoelectric conversion device according to (11), in which
the second electrode is provided over an entirety of the light entrance surface of the light absorption layer.

(13)

The photoelectric conversion device according to (11), in which
the second electrode includes a light-shielding material.

(14)

The photoelectric conversion device according to (13), further including
a second diffusion region of the second conductive type, the second diffusion region being provided between the adjacent ones of the pixels, on side of the light absorption layer on which the light entrance surface is disposed.

(15)

The photoelectric conversion device according to (14), in which
the light entrance surface of the light absorption layer has a second groove, and
the second diffusion region is provided near the second groove.

(16)

The photoelectric conversion device according to any one of (1) to (15), further including
a third electrode electrically coupled to the first diffusion region.

(17)

The photoelectric conversion device according to (15), further including
a fourth electrode electrically coupled to the second diffusion region,
wherein the fourth electrode is fitted into in the second groove.

(18)

The photoelectric conversion device according to any one of (1) to (17), further including
a coating film that covers the first diffusion region.

(19)

The photoelectric conversion device according to (18), in which
the coating film includes electrical charges of the first conductive type.

(20)

An imaging device, including:
a light absorption layer that has a light entrance surface and includes a compound semiconductor material;
a first electrode provided for each of pixels, in opposed relation to an opposite surface to the light entrance surface of the light absorption layer;
a first semiconductor layer of a first conductive type, the first semiconductor layer having bandgap energy larger than bandgap energy of the light absorption layer and being provided between the light absorption layer and the first electrode;
a second semiconductor layer of a second conductive type, the second semiconductor layer having bandgap energy larger than the bandgap energy of the light absorption layer and being provided between the first semiconductor layer and the light absorption layer; and
a first diffusion region of the second conductive type, the first diffusion region being provided between adjacent ones of the pixels, and being provided across the second semiconductor layer and the light absorption layer.

This application claims the benefit of Japanese priority patent application JP 2017-096237 filed with the Japan Patent Office on May 15, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion device, comprising:
a light absorption layer that has a light entrance surface and includes a compound semiconductor material;
a first electrode provided for each of pixels, in opposed relation to an opposite surface to the light entrance surface of the light absorption layer;
a first semiconductor layer of a first conductive type, the first semiconductor layer having bandgap energy larger than bandgap energy of the light absorption layer and being provided between the light absorption layer and the first electrode;
a second semiconductor layer of a second conductive type, the second semiconductor layer having bandgap energy larger than the bandgap energy of the light absorption layer and being provided between the first semiconductor layer and the light absorption layer; and
a first diffusion region of the second conductive type, the first diffusion region being provided between adjacent ones of the pixels, and being provided across the second semiconductor layer and the light absorption layer.

2. The photoelectric conversion device according to claim 1, wherein
the first diffusion region is provided in a lattice shape in plan view.

3. The photoelectric conversion device according to claim 1, further comprising
an electrical charge collection layer that is provided between the second semiconductor layer and the light absorption layer, and temporarily accumulates electrical charges generated in the light absorption layer.

4. The photoelectric conversion device according to claim 1, further comprising
a barrier alleviation layer that is provided between the second semiconductor layer and the light absorption layer, and alleviates a band offset barrier between the second semiconductor layer and the light absorption layer.

5. The photoelectric conversion device according to claim 1, wherein
the second semiconductor layer is configured to cause avalanche amplification of electrical charges generated in the light absorption layer.

6. The photoelectric conversion device according to claim 5, further comprising
an electric field descending layer that is provided between the second semiconductor layer and the light absorption layer, and restrains propagation of an electric field from the second semiconductor layer to the light absorption layer.

7. The photoelectric conversion device according to claim 1, wherein
the first semiconductor layer and the second semiconductor layer have a first groove that separates the adjacent ones of the pixels.

8. The photoelectric conversion device according to claim 7, wherein
the first groove extends in the light absorption layer.

9. The photoelectric conversion device according to claim 7, further comprising an insulating film that is provided from a front surface of the first semiconductor layer to a sidewall of the first groove, covers a sidewall of the first semiconductor layer, and extends over a portion of a sidewall of the second semiconductor layer.

10. The photoelectric conversion device according to claim 7, further comprising
a light-shielding member fitted into the first groove.

11. The photoelectric conversion device according to claim 1, further comprising
a second electrode provided in opposed relation to the light entrance surface of the light absorption layer.

12. The photoelectric conversion device according to claim 11, wherein
the second electrode is provided over an entirety of the light entrance surface of the light absorption layer.

13. The photoelectric conversion device according to claim 11, wherein
the second electrode includes a light-shielding material.

14. The photoelectric conversion device according to claim 13, further comprising
a second diffusion region of the second conductive type, the second diffusion region being provided between the adjacent ones of the pixels, on side of the light absorption layer on which the light entrance surface is disposed.

15. The photoelectric conversion device according to claim 14, wherein
the light entrance surface of the light absorption layer has a second groove, and
the second diffusion region is provided near the second groove.

16. The photoelectric conversion device according to claim 1, further comprising
a third electrode electrically coupled to the first diffusion region.

17. The photoelectric conversion device according to claim 15, further comprising
a fourth electrode electrically coupled to the second diffusion region,
wherein the fourth electrode is fitted into in the second groove.

18. The photoelectric conversion device according to claim 1, further comprising
a coating film that covers the first diffusion region.

19. The photoelectric conversion device according to claim 18, wherein
the coating film includes electrical charges of the first conductive type.

20. An imaging device, comprising:
a light absorption layer that has a light entrance surface and includes a compound semiconductor material;
a first electrode provided for each of pixels, in opposed relation to an opposite surface to the light entrance surface of the light absorption layer;
a first semiconductor layer of a first conductive type, the first semiconductor layer having bandgap energy larger than bandgap energy of the light absorption layer and being provided between the light absorption layer and the first electrode;
a second semiconductor layer of a second conductive type, the second semiconductor layer having bandgap energy larger than the bandgap energy of the light absorption layer and being provided between the first semiconductor layer and the light absorption layer; and
a first diffusion region of the second conductive type, the first diffusion region being provided between adjacent ones of the pixels, and being provided across the second semiconductor layer and the light absorption layer.

* * * * *